United States Patent
Choi et al.

(10) Patent No.: US 7,315,077 B2
(45) Date of Patent: Jan. 1, 2008

(54) MOLDED LEADLESS PACKAGE HAVING A PARTIALLY EXPOSED LEAD FRAME PAD

(75) Inventors: Yoon-hwa Choi, Incheon Metropolitan (KR); Shi-baek Nam, Buceon-si (KR); O-seob Jeon, Seoul (KR); Rajeev Dinkar Joshi, Cupertino, CA (US); Maria Cristina B. Estacio, CebuCity (PH)

(73) Assignee: Fairchild Korea Semiconductor, Ltd., Bucheon (KR)

( * ) Notice: Subject to any disclaimer, the term of this patent is extended or adjusted under 35 U.S.C. 154(b) by 0 days.

(21) Appl. No.: 10/987,550

(22) Filed: Nov. 12, 2004

(65) Prior Publication Data

US 2005/0104168 A1    May 19, 2005

(30) Foreign Application Priority Data

| Nov. 13, 2003 | (KR) | .................. 10-2003-0080143 |
| Jul. 31, 2004 | (KR) | .................. 10-2004-0060691 |
| Sep. 8, 2004 | (KR) | .................. 10-2004-0071789 |

(51) Int. Cl.
    *H01L 23/495*    (2006.01)

(52) U.S. Cl. ............... 257/666; 257/787; 257/E23.051; 257/E23.092

(58) Field of Classification Search ............... 257/666, 257/787, E23.051, E23.092
See application file for complete search history.

(56) References Cited

U.S. PATENT DOCUMENTS

| 5,105,259 A | * | 4/1992 | McShane et al. | ........... 257/667 |
| 5,172,213 A | * | 12/1992 | Zimmerman | ................. 257/796 |
| 5,172,214 A | * | 12/1992 | Casto | ........................ 257/676 |
| 5,216,283 A | * | 6/1993 | Lin | ............................. 257/787 |
| 5,483,098 A | * | 1/1996 | Joiner, Jr. | ................... 257/676 |
| 6,111,312 A | * | 8/2000 | Hirumuta et al. | ........... 257/696 |
| 6,198,171 B1 | * | 3/2001 | Huang et al. | ................ 257/787 |
| 6,211,568 B1 | * | 4/2001 | Hong | ......................... 257/754 |
| 6,437,429 B1 | * | 8/2002 | Su et al. | ..................... 257/666 |
| 6,713,322 B2 | * | 3/2004 | Lee | .............................. 438/123 |
| 6,809,408 B2 | * | 10/2004 | Yu et al. | ..................... 257/676 |

* cited by examiner

*Primary Examiner*—Andy Huynh
(74) *Attorney, Agent, or Firm*—Thomas R. FitzGerald, Esq.; Hiscock & Barclay, LLP

(57) ABSTRACT

Provided are a molded leadless package, and a sawing type molded leadless package and method of manufacturing same. The molded leadless package includes a lead frame pad having first and second surfaces opposite to each other. A semiconductor chip is adhered to the first surface of the lead frame pad. A lead is electrically coupled to the semiconductor chip. A molding material covers the lead frame pad, the semiconductor chip, and the lead and exposes a portion of the lead and a portion of the second surface of the lead frame pad. A step difference is formed between a surface of the molding material covering the second surface of the lead frame pad and the second surface of the lead frame pad itself. The sawing type molded leadless package includes a short-circuit preventing member that is post-shaped or convex, and protruding from the lower surface of the die pad.

27 Claims, 49 Drawing Sheets

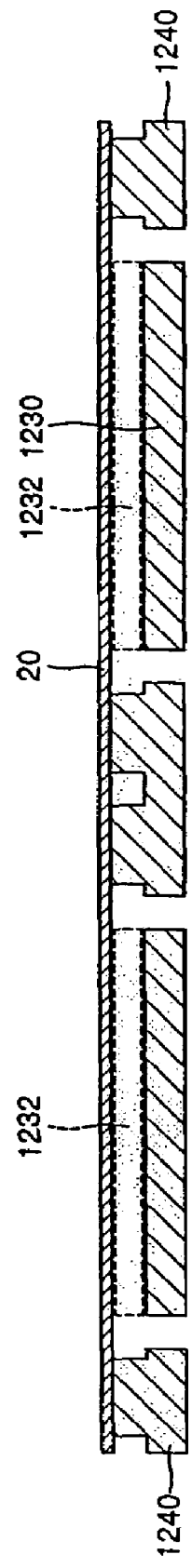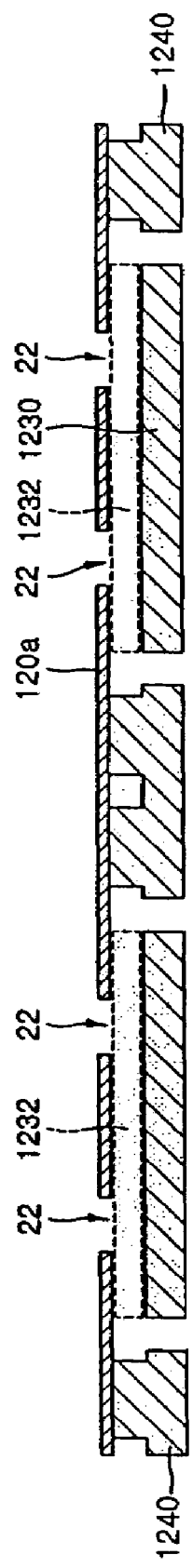

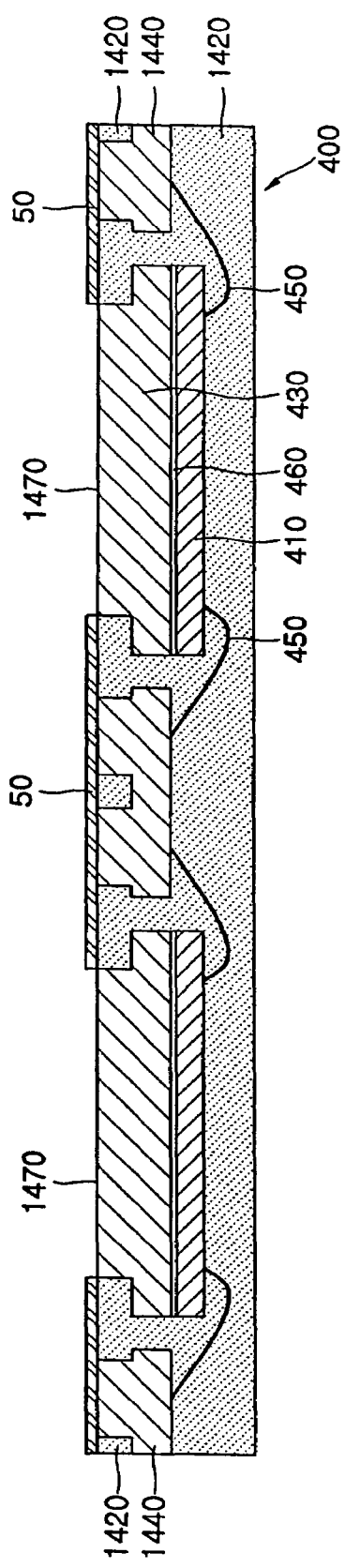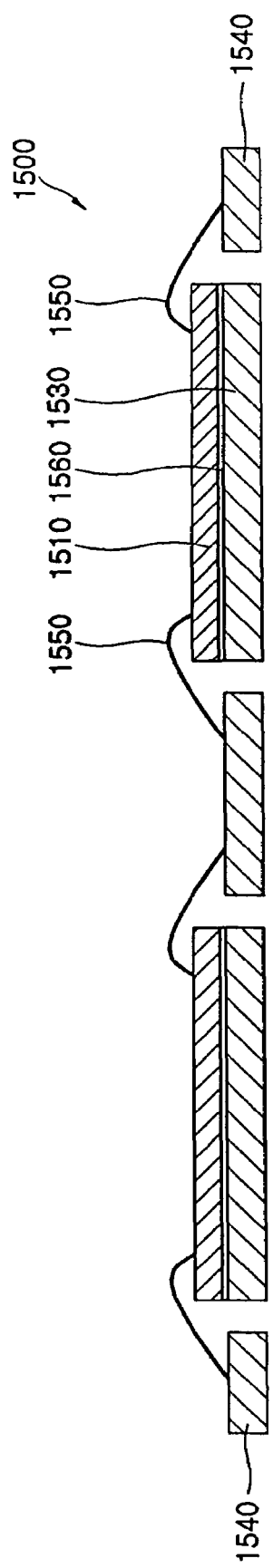

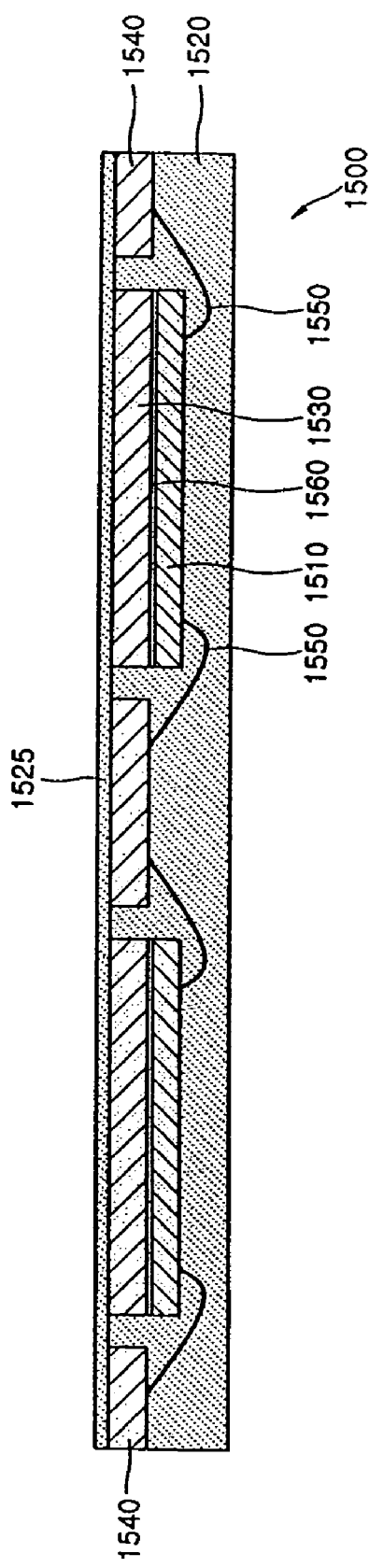
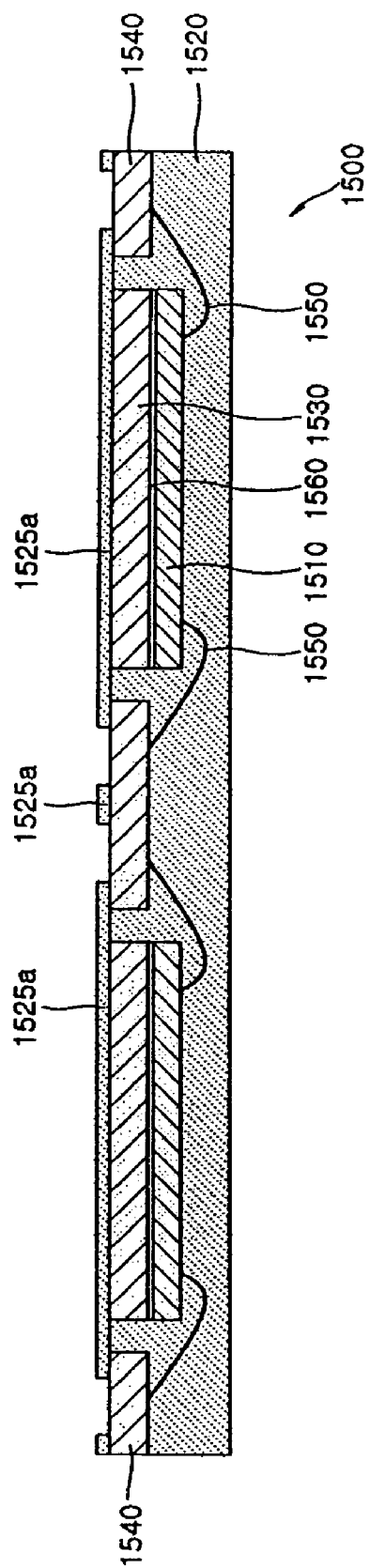
FIG. 27A
FIG. 27B

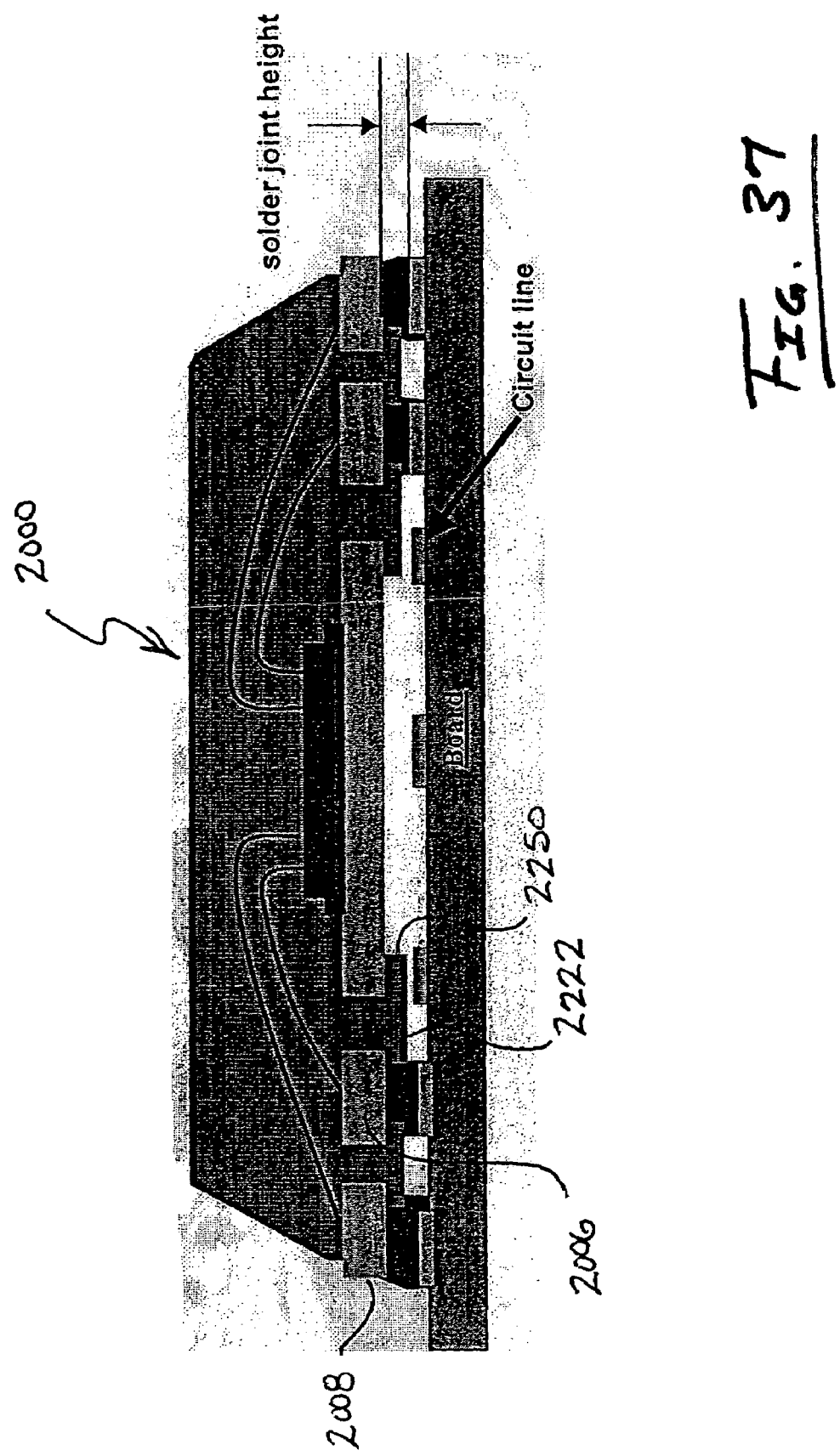

MOLDED LEADLESS PACKAGE HAVING A PARTIALLY EXPOSED LEAD FRAME PAD

BACKGROUND OF THE INVENTION

This application claims the priorities of Korean Patent Application No. 2003-0080143, filed on Nov. 13, 2003, No. 2004-0060691, filed on Jul. 31, 2004 and No. 2004-0071789, filed on Sep. 8, 2004, in the Korean Intellectual Property Office, the disclosures of which are incorporated herein in their entireties by reference.

1. Field of the Invention

The present invention relates to a semiconductor package and, more particularly, to a molded leadless package (MLP) having improved reliability and high thermal transferability. Further, the present invention relates to MLPs singulated by stamping/punching and by sawing, and a method of manufacturing the same.

2. Description of the Related Art

In general, semiconductor packages are packages in which semiconductor chips are mounted on and/or connected to a lead frame. As the semiconductor chip is operated, and/or a voltage of predetermined magnitude is applied to an internal element of the semiconductor chip, heat is generated by the operation of the semiconductor chip. The generation of heat is especially pronounced in the case of a power semiconductor chip to which a voltage of a relatively large magnitude is typically applied and greater quantities of heat are generated. Thus, the transferability of heat generated from a semiconductor chip inside a semiconductor package via an external board greatly affects the stability and reliability of the semiconductor package and the chip it contains.

An MLP including a lead frame pad having a side exposed to efficiently emit heat generated from a semiconductor chip to the outside environment has been widely used in various application fields. The term MLP as used herein, it should be noted, encompasses and includes a variety of leadless chip-scale molded package types, including quad flat pack no leads (QFN).

FIG. 1A is a cross-sectional view illustrating an exemplary conventional MLP disclosed in U.S. Pat. No. 5,172,214. Referring to FIG. 1A, MLP 110 has a structure in which a surface of a lead frame pad 112 to which a semiconductor 111 is attached is exposed from a surface 114 of a package body 113. Also, a portion of each of leads 115 is exposed from the other surface 116 of the package body 113. The leads 115 are electrically coupled to the semiconductor chip 111 by wires 117.

FIG. 1B is a cross-sectional view illustrating an exemplary conventional MLP disclosed in U.S. Pat. No. 6,437,429. Referring to FIG. 1B, MLP 120 includes a die 121, a package body 122, a die pad 123, and leads 124. Die 121 includes upper and lower surfaces 121a and 121b. Each of the leads 124 includes upper and lower surfaces 124a and 124b and a cut surface 124c. A portion of the lower surface 124b of each of the leads 124 is confined to form a metal pad. The metal pad is exposed to the outside of the package body 122 and formed on the same plane as the package body 122 to be electrically coupled to the outside of the MLP 120. A surface of the die pad 123 is attached to the lower surface 121b of the die 121 by an adhesive 126, and an opposite surface of the die pad 123 is exposed to the outside of the package body 122. The leads 124 are electrically coupled to the die 121 by wires 125.

In conventional MLPs having a structure as described with reference to FIGS. 1A and 1B, a surface of a lead frame pad (112 of FIG. 1A) and a surface of a die pad (123 of FIG. 1B) are exposed to the outside. Thus, heat generated from a semiconductor chip (111 of FIG. 1A) and a die (121 of FIG. 1B) can be efficiently emitted to the outside.

However, the above-described conventional MLPs have certain features that may adversely impact their reliability. In other words, because the exposed surfaces of the lead frame pad 112 and the die pad 123 are disposed on substantially the same plane as the surfaces 114a and 122a of the package bodies 113 and 122, respectively, the conventional MLPs are sensitive to thermal stress. More particularly, a high-temperature reflow process, typically involving temperatures between 240° C. and 260° C., is often used to solder the conventional MLPs to a circuit board. The exposed surfaces of the lead frame pad 112 and the die pad 123 are subjected to the high reflow process temperature, thereby subjecting to MLPs to thermal stresses that are generally proportional to the exposed areas of the lead frame pad 112 and the die pad 123. Also, it is not easy to extend the length of a hygroscopic path into the MLPs. Moreover, in the case of FIG. 1A, a step difference between the lead frame pad 112 and leads 115 is great. Thus, there is a limit to which the thickness of the lead frame pad 112 can be increased because it is not easy to bend the leads 115 when the thickness of the lead frame pad 112 is great.

Meanwhile, a semiconductor package includes a semiconductor chip or a die, a lead frame, and a package body. In the semiconductor package, the semiconductor chip is attached on a die pad of the lead frame and electrically coupled to leads of the lead frame by wires. Each of the leads includes an inner lead coupled to the wires and an outer lead serving as an outer connector of the semiconductor package. The inner leads are generally completely sealed by the package body, while the outer leads are totally exposed to the outside of the package body or the surfaces of the outer leads are partially exposed to the outside of the package body. A semiconductor package including such outer leads is called an MLP.

Also, the semiconductor package is classified into a sawing type package or a punch type package according to its manufacturing process. The sawing type package is manufactured by simultaneously molding in a block mold die a package body around a plurality of lead frames on which semiconductor chips are mounted, and cutting the package body and lead frames into individual packages using a sawing process. The punch type package is manufactured by individually molding in individual mold dies a plurality of lead frames on which semiconductor chips are mounted, and separating the lead frames using a punching method.

An example of a conventional sawing type MLP is disclosed in U.S. Pat. No. 6,437,429, entitled "Semiconductor Package with Metal Pads" invented by Chun-Jen Su et al. Also, FIGS. 15A and 15B are a cross-sectional view and a bottom view of the conventional sawing type MLP, respectively.

Referring to FIGS. 15A and 15B, a conventional sawing type MLP 1100 includes a semiconductor chip or a die 1110, a package body 1120, a die pad 1130, and leads 1140. The die 1110 has upper and lower surfaces 1110a and 1110b. The leads 1140 have upper, lower, and cut surfaces 1140a, 1140b, and 1140c, and the entire portion or a portion of each of the lower surfaces 1140b of the leads 1140 is exposed to the outside of the package body 1120 to form metal pads. The metal pads are formed on the same plane as a bottom 1120a of the package body 1120 to be electrically coupled to the outside of the conventional sawing type MLP 1100. The die 1110 is electrically coupled to the leads 1140 by wires 1150. A surface 1130a of the die pad 1130 is adhered to the lower surface 1110b of the die 1110 by an adhesive 1160.

The sawing type package has the following characteristics because of the properties of its manufacturing process. First, a surface 1130b of the die pad 1130 is exposed to the outside of the package body 1120 on generally the same plane as the bottom 1120a of the package body 1120 and the lower surfaces 1140b of the leads 1140. This is because the sawing type package is molded by attaching a cover tape to the die pad 1130 and the bottoms of the leads 1140 to prevent a resin used for molding from flowing into the lower surfaces 1140b of the leads 1140. Also, since the sawing type package is individualized into MLPs using a sawing process the sides of the package body 1120 are generally coplanar with the cut surfaces 1140c of the leads 1140.

FIG. 16 is a schematic cross-sectional view of a structure (hereinafter referred to as a system package) in which an MLP 1100 is mounted on a system circuit board 10. Referring to FIG. 16, coupling pads 12 and circuit lines 14 coupling the coupling pads 12 to each other are formed on an upper surface of the system board 10. The coupling pads 12 and circuit lines 14 are typically formed of a conductive metal, such as, for example, copper or a similar metal, and generally have the same thickness. The MLP 1100 is mounted on the system board 10 so as to join the leads 140 and the coupling pads 12 on a one-to-one basis by corresponding solder joints 16.

According to the prior art, the solder joint 16 is exposed to and may slightly move under pressure applied and heat generated during jointing of the MLP 1100 on the system board 10 by the solder joint 16. This movement may cause the solder joint 16 to flow to one side or the other, and thus the height $h_1$ of the solder joint 16 may be difficult to control or secure. If the height $h_1$ of the solder joint 16 is not adequately controlled above a certain minimum, such as, for example, more than 30 µm, the distance between the surface 1130b of the die pad 1130 and the circuit lines 14 of the system board 10 may be less than desired. As a result, the reliability of the MLP 1100 may be adversely affected by, for example, a die pad 1130 contacting and/or electrically shorting to a circuit line 14 of the system board 10. Further, the sensitivity of solder joint 16 to thermal and/or mechanical stress is significantly increased and the reliability of the system package may be adversely affected if the height $h_1$ of the solder joint 16 is less than the desired minimum and/or insufficient. Moreover, the reliability of the system package may be adversely affected by the MLP 1100 tilting or collapsing such that one or more leads 1140 come into direct contact with corresponding coupling pads 12 due to movement of the solder joint 16 during mounting of the MLP 1100 on the system board 10.

SUMMARY OF THE INVENTION

The present invention provides an MLP having a modified structure in which a portion of a lead frame pad is exposed in order to achieve improved reliability and increased thermal transferability.

The present invention also provides a sawing type MLP which is less susceptible to short-circuiting with circuit lines on a system board, and a method of manufacturing the same.

The present invention also provides a sawing type MLP which improves the reliability of a system package, and a method of manufacturing the same.

The present invention also provides a sawing type MLP which is less susceptible to collapsing or tilting during the process of manufacturing a system package, and a method of manufacturing the same.

The invention comprises, in one form thereof, a molded leadless package including a lead frame pad having first and second surfaces that are opposite to each other. A semiconductor chip is disposed on the first surface of the lead frame pad. A lead is electrically coupled to the semiconductor chip. A molding material covers the first surface of the lead frame pad, the semiconductor chip, and portions of the lead and second surface of the lead frame pad. Portions of the lead and the second surface of the lead frame pad are exposed to the outside. A step difference is formed between a surface of the molding material covering the second surface of the lead frame pad and the second surface of the lead frame pad itself.

A side of the molding material may be slanted.

A side of the molding material may be vertical.

The lead may be bent toward the lead frame pad.

The lead may be flat.

The second surface of the lead frame pad exposed by the molding material may be circular.

The second surface of the lead frame pad exposed by the molding material may be square.

The lead frame pad may include grooves formed on a portion of the second surface of the lead frame pad covered with the molding material.

The grooves may be semicircular.

The grooves may be V-shaped.

The step difference between the surface of the molding material covering the second surface of the lead frame pad and the second surface of the lead frame pad may be between 0.12 mm and 0.15 mm.

The lead may be exposed from a surface of the molding material opposite to the surface of the molding material covering the second surface of the lead frame pad.

The molding material may include a protrusion protruding from a lower surface of the lead.

The protrusion may fully expose the lower surface of the lead.

The protrusion may cover a portion of the lower surface of the lead to expose a portion of the lower surface of the lead.

The molded leadless package may further include a heat sink lead coupled to the lead frame pad to transmit heat generated from the semiconductor chip to the outside.

The lead may be exposed from the surface of the molding material covering the second surface of the lead frame pad.

The molding material covering a portion of the second surface of the lead frame pad and a portion of an exposed surface of the lead may include a protrusion protruding from the second surface of the lead frame pad and the exposed surface of the lead.

The protrusion may fully expose the lower surface of the lead.

The protrusion may cover a portion of the lower surface of the lead to expose only a portion of the lower surface of the lead.

The molded leadless package may further include a wire coupling the lead to the semiconductor chip.

The present invention comprises, in another form thereof, a sawing type molded leadless package including a die pad having upper and lower surfaces opposite to each other. A semiconductor chip is disposed on the upper surface of the die pad. A plurality of leads is disposed around the die pad, making gaps so that bottoms of the leads are on substantially the same plane as the lower surface of the die pad. A plurality of wires electrically couples the semiconductor chip to the plurality of leads. A package body includes a bottom substantially coplanar with the entire bottoms of the leads or a portion thereof, filling the gaps, and covering the die pad, the semiconductor chip, the leads, and the wires. A short-circuit preventing member is formed on the lower surface of the die pad or a portion of the lower surface of the die pad and protrudes from the plane thereof.

According to the present invention, the lower surface of the die pad is on the same plane as the bottoms of the leads. However, since the short-circuit preventing member with a predetermined height is attached on the lower surface of the die pad, the likelihood of a short-circuit between the die pad and circuit lines on a system board is substantially reduced. The height of the short-circuit preventing member may be more than 30 μm, and preferably more than 50 μm. Thus, the reliability of a solder joint coupling the leads to the system board is improved.

According to an aspect of the present invention, the short-circuit preventing member may be one or more posts formed on the lower surface of the die pad. The posts may be symmetrical with respect to the center of the die pad. A height of the posts may be between 30 μm and 130 μm. The posts may be formed of the same material as the package body.

According to a further aspect of the present invention, the short-circuit preventing member is a non-conductive material layer formed on the entire lower surface of the die pad. The short-circuit preventing member is formed, for example, by a screen printing method or a non-conductive material pattern formed on a portion of the lower surface of the die pad by a screen printing method.

According to a still further aspect of the present invention, the short-circuit preventing member is a non-conductive plating layer formed using a plating method. Here, the non-conductive plating layer is formed of a black oxide.

According to yet another aspect of the present invention, the short-circuit preventing member is coupled to a portion of the package body filling the gaps to form a single body with the package body.

According to an even further aspect of the present invention, a method of manufacturing a sawing type molded leadless package includes preparing a lead frame block having an array of a plurality of lead frames. The lead frames include a die pad having upper and lower surfaces opposite to each other, and a plurality of leads disposed around the die pad, making gaps. A channel is patterned to a predetermined depth at the lower surface of the die pad to penetrate through the gaps. A cover tape is attached to a surface of the lead frame block covering the unpatterned lower surface of the die pad. The cover tape is patterned to form openings exposing a portion of the channel. The semiconductor chip is adhered to the upper surface of the die pad. Wire bonding is performed to electrically couple the semiconductor chip to the leads. The lead frame block is molded with a material similar to the material from which the package body is formed using an upper mold die and a lower mold die having portions in which dents are formed, the portions corresponding to the opening. The cover tape is removed, and the molded lead frame block is sawed or singulated to produce individual packages.

According to a still further aspect of the present invention, the patterning of the cover tape is accomplished by etching with a laser. The lead frame block may be molded using the lower mold die including the dents with a depth between 30 μm and 130 μm.

According to yet another aspect of the present invention, there is provided a method of manufacturing a sawing type molded leadless package including preparing a lead frame block having an array of a plurality of lead frames. The lead frames include a die pad having upper and lower surfaces opposite to each other and a plurality of leads disposed around the die pad, making gaps. A cover tape is attached to a surface of the lead frame block including the lower surface of the die pad. A semiconductor chip is adhered to the upper surface of the die pad. The lead frame block is molded with a material similar to the material from which the package body is formed using upper and lower mold dies. The cover tape is removed. A non-conductive material layer or a non-conductive material pattern is formed on the lower surface of the die pad using a screen printing process. The molded lead frame block is sawed and/or singulated to form individual packages.

According to an even further aspect of the present invention, the screen printing process is performed so that the non-conductive material layer or the non-conductive material pattern has a thickness between 30 μm and 130 μm.

According to a still further aspect of the present invention, a method of manufacturing a sawing type molded leadless package includes preparing a lead frame block having an array of a plurality of lead frames. Each lead frame includes a die pad having upper and lower surfaces opposite to each other and a plurality of leads disposed around the die pad, making gaps. A cover tape is attached to a surface of the lead frame block including the lower surface of the die pad. A semiconductor chip is adhered to the upper surface of the die pad. The lead frame block is molded with a material similar to the material from which the package body is formed, using upper and lower mold die. The cover tape is patterned to expose the lower surface of the die pad. A non-conductive plating layer is formed on the exposed lower surface of the die pad using a plating process. The patterned cover tape is removed, and the molded lead frame block is sawed/singulated to form individual packages.

According to yet another aspect of the present invention, a method of manufacturing a sawing type molded leadless package includes preparing a lead frame block having an array of a plurality of lead frames. The lead frames include a die pad having upper and lower surfaces opposite to each other and a plurality of leads disposed around the die pad, making gaps. A cover tape is attached to a surface of the lead frame block including the lower surface of the die pad. A semiconductor chip is adhered to the upper surface of the die pad. The lead frame block is molded with a material similar to the material from which the package body is formed using upper and lower mold dies. The patterned cover tape is removed. A mask exposing the lower surface of the die pad is formed on a surface of the lead frame block to which the cover tape is attached. A non-conductive plating layer is formed on the exposed lower surface of the die pad using a plating process. The mask is removed, and the molded lead frame block is sawed/singulated to form individual packages.

According to yet another aspect of the present invention, there is provided a method of manufacturing a sawing type molded leadless package including preparing a lead frame block having an array of a plurality of lead frames. Each of the lead frames include a die pad having upper and lower surfaces opposite to each other and a plurality of leads disposed around the die pad, making gaps. A semiconductor chip is adhered to the upper surface of the die pad. An upper mold die is adhered to a lower mold die that includes portions corresponding to the gaps and a portion corresponding to the entire lower surface of the die pad or a portion of the lower surface of the die pad, dents being formed therein. A cover tape is attached to an inner surface of the lower mold die. The lead frame is block molded with a material similar to the material from which the package body is formed using upper and lower mold dies. The molded lead frame block is sawed/singulated to form individual packages.

According to yet another aspect of the present invention, there is provided a method of manufacturing a sawing type molded leadless package that includes preparing a lead frame block having an array of a plurality of lead frames. The lead frames include a die pad having upper and lower surfaces opposite to each other and a plurality of leads disposed around the die pad, making gaps; adhering a semiconductor chip to the upper surface of the die pad; preparing an upper mold die and a lower mold die including a flat inner surface; molding the lead frame block with a material of which the package body is formed, using the upper and lower mold dies, allowing a mold flash to be generated on bottoms of the leads and the lower surface of the die pad; patterning the mold flash to expose the bottoms of the leads and cover the entire lower surface of the die pad or a portion of the lower surface of the die pad; and sawing the molded lead frame block.

BRIEF DESCRIPTION OF THE DRAWINGS

The above-mentioned and other features and advantages of this invention, and the manner of attaining them, will become apparent and be better understood by reference to the following description of embodiments of the invention in conjunction with the accompanying drawings, wherein:

FIGS. 23A through 23E are cross-sectional views illustrating a method of manufacturing the MLP of FIGS. 17A and 17B;

FIG. 25 is a cross-sectional view illustrating a method of manufacturing the MLP of FIG. 21;

FIGS. 26A through 26C are cross-sectional views illustrating a method of manufacturing the MLP of FIGS. 22A through 22D;

FIGS. 27A and 27B are cross-sectional views illustrating another method of manufacturing the MLP of FIGS. 22A through 22D;

FIG. 37 illustrates the distance separating the lower surface of the MLP package from the circuit board to which it is mounted and the resulting enhanced solder joint height obtained by the MLP package of FIGS. 29A-C.

DETAILED DESCRIPTION OF THE INVENTION

The present invention will now be described in more detail with reference to the accompanying drawings in which exemplary embodiments of the present invention are shown. The invention may, however, be embodied in many different forms and should not be construed as being limited to the embodiments set forth herein.

Figure 1A:
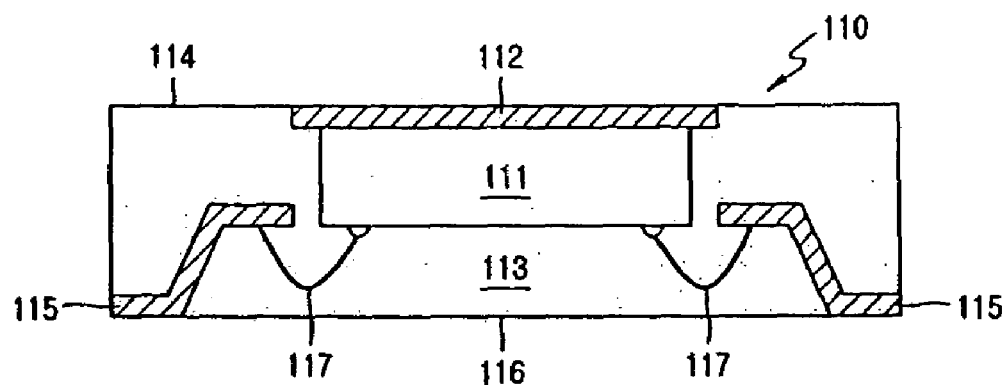
FIG. 1A is a cross-sectional view for illustrating an example of a conventional MLP.
Figure 1B:
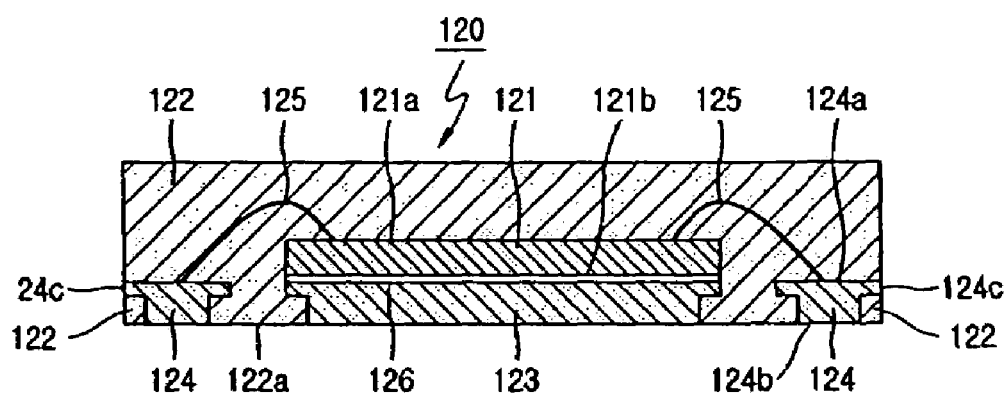
FIG. 1B is a cross-sectional view for illustrating another example of a conventional MLP.
Figure 2A:
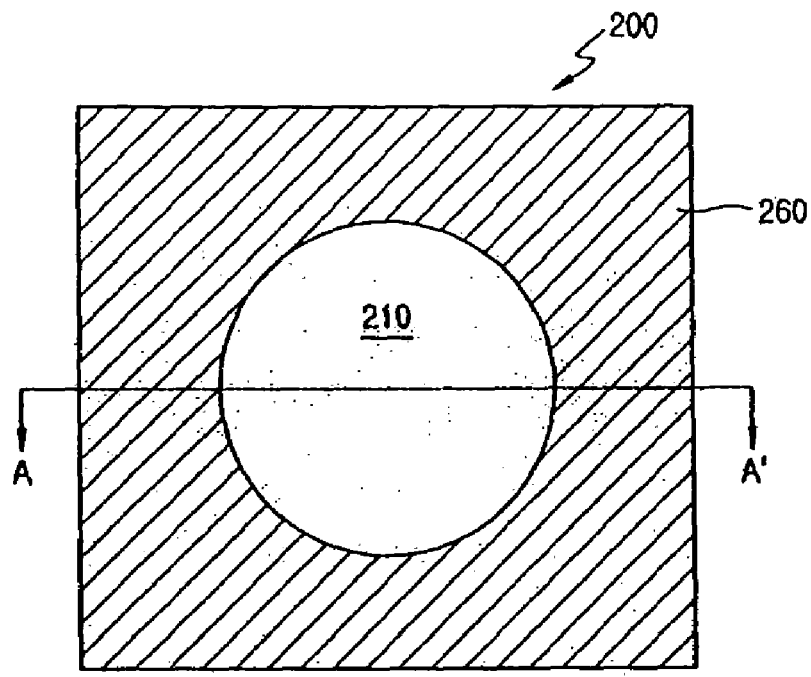
FIGS. 2A and 2B are a plan view and a rear view of an MLP, respectively, according to an embodiment of the present invention.
Figure 2B:
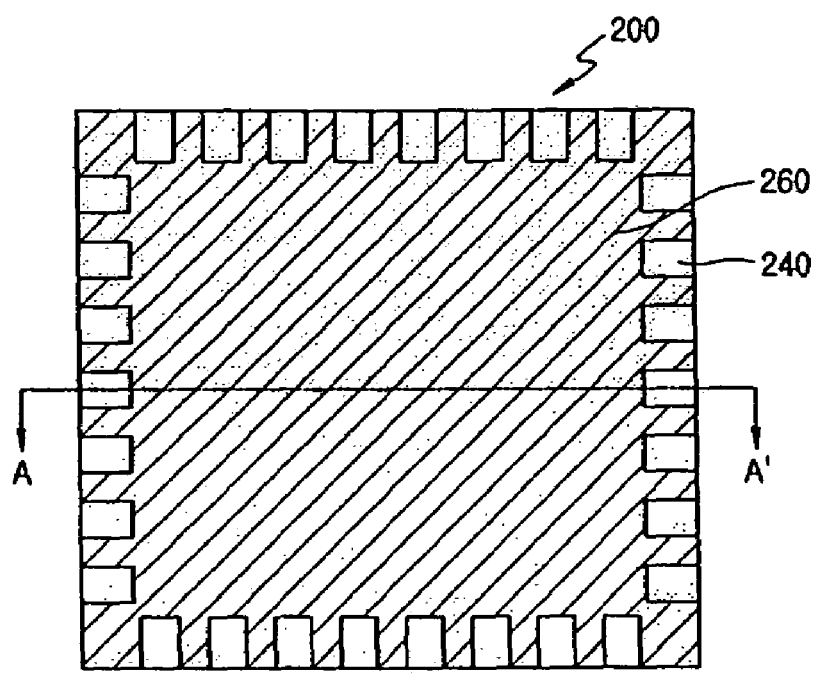

FIGS. 2A and 2B are a plan view and a rear view, respectively, of an MLP according to one embodiment of the present invention.

Referring to FIGS. 2A and 2B, an MLP 200 includes a lead frame pad 210 including an upper surface having a central portion thereof exposed by a molding material 260. The exposed portion of the lead frame pad 210 is, in this embodiment, generally circular in shape. The MLP 200 also includes leads 240 each of which include a lower surface having an edge exposed by the molding material 260. In other words, a plurality of leads 240 is spaced apart from one another at the edge of the molding material 260. As is described more particularly hereinafter, the surface of the molding material 260 exposing the lead frame pad 210 is opposite to the other surface of the molding material 260 exposing leads 240. For example, as shown in FIG. 2A, the surface of the molding material 260 exposing the lead frame pad 210 is an upper surface, and the other surface of the molding material 260 exposing leads 240 is a lower surface.

Figure 3A:
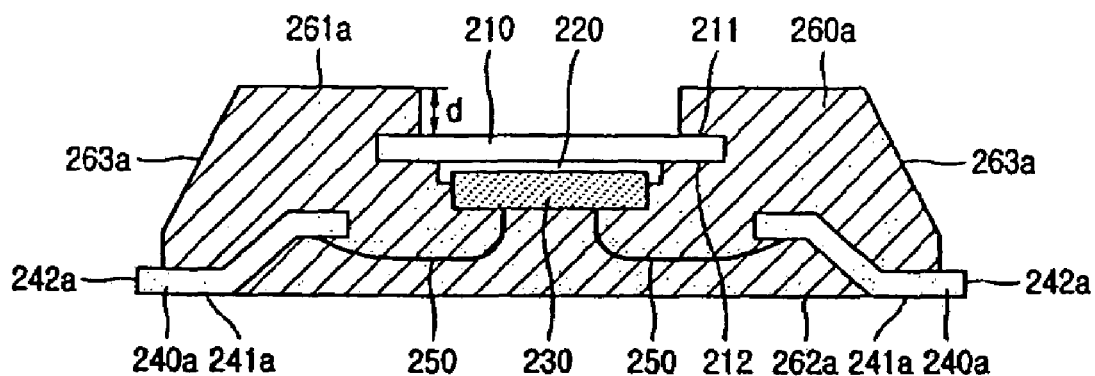
FIGS. 3A through 3J are cross-sectional views for illustrating different examples of the MLP of FIGS. 2A and 2B.

FIG. 3A is a cross-sectional view illustrating an exemplary configuration of the MLP of FIGS. 2A and 2B taken along line A-A' of FIGS. 2A and 2B. Referring now to FIG. 3A, the lead frame pad 210 includes first and second surfaces 211 and 212 that are opposite to each other. A semiconductor chip 230 is adhered to the second surface 212 of the lead frame pad 210. An adhesive material 220, such as, for example, solder, is disposed between the lead frame pad 210 and the semiconductor chip 230. The first surface 211 of the lead frame pad 210 is exposed by a molding material 260a. Here, the entire first surface 211 is not exposed. Rather, only a portion of the first surface 211 is exposed. In other words, a portion of the first surface 211 of the lead frame pad 210 is covered with the molding material 260a whereas another portion of the first surface 211 is not covered by the molding material 260a and is thus exposed to the outside of the molding material 260a. The exposed portion of the first surface 211 of the lead frame pad 210 is circular as shown in FIG. 2A. Lower surfaces 241a of leads 240a are also exposed to the outside of the molding material 260a. Inside the molding material 260a, the leads 240a are electrically coupled to the semiconductor chip 230 by wires 250. The molding material 260a encloses the remaining portion except the exposed portion of the first surface 211 of the lead frame pad 210 and the lower surfaces 241a and sides 242a of the leads 240a.

An upper surface 261a of the molding material 260a exposing the first surface 211 of the lead frame pad 210 is not on the same plane as the first surface 211 of the lead frame pad 210, but has a step difference relative thereto. In other words, the upper surface 261a of the molding material 260a is disposed at a predetermined distance d from the first surface 211 of the lead frame pad 210. The predetermined distance d is preferably from approximately 0.12 mm to approximately 0.15 mm. Since the first surface 211 of the lead frame pad 210 is spaced a predetermined distance d from the upper surface 261a of the molding material 260a as described above, a hygroscopic path extends by at least the predetermined distance d. It is also relatively easy to adjust the exposed area of the lead frame pad 210 regardless of the original area thereof. Thus, although exposed to a relatively high temperature reflow process when MLP 200 is soldered on a board, thermal stress to MLP 200 is significantly reduced.

A side 263a of the molding material 260a is slanted. This corresponds to a case where the molding material 260a is formed to allow a punched type package singulation method. In this case, an end of each of the leads 240a protrudes from the molding material 260a up to a length of from approximately 0.8 mm to approximately 0.15 mm. Inside the molding material 260a, leads 240a are formed or bent toward the lead frame pad 210. The leads 240a are bent or formed using a lead shaping process, such as, for example, a stamping process.

Figure 3B:
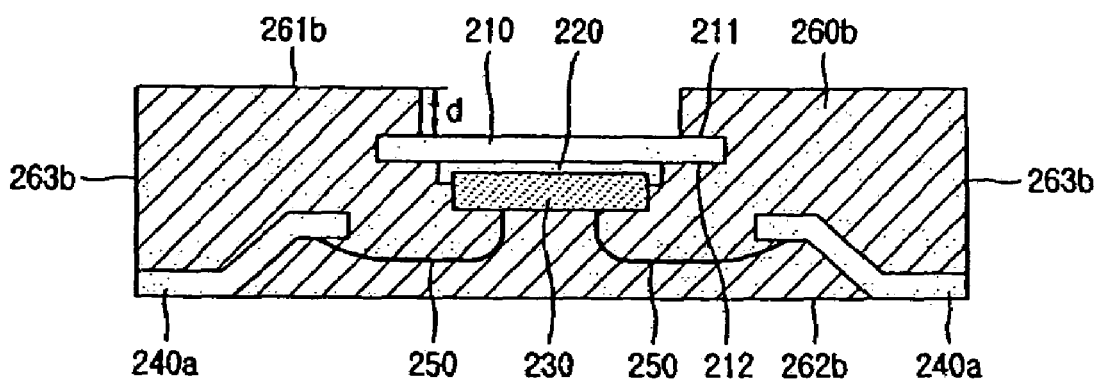

FIG. 3B is a cross-sectional view of another exemplary configuration of MLP 200 taken along line A-A' of FIGS. 2A and 2B. The embodiment of MLP 200 shown in FIG. 3B is generally similar to the embodiment shown in FIGS. 2A, 2B and 3A, and therefore the same reference characters are used in FIG. 3B to identify elements therein that correspond to the elements shown in FIGS. 2A, 2B and 3A. Accordingly, descriptions of elements shown in FIG. 3B that are common and/or similar to those shown and described in reference to FIGS. 2A, 2B and 3A are not repeated.

Referring now to FIG. 3B, it is shown that side 263b of the molding material 260b of the MLP is generally vertical (rather than slanted as side 263a shown in the configuration of FIG. 3A) and corresponds to the configuration wherein molding material 260b is cut and singulated by a sawing means, such as a blade, and is therefore of the sawing type package. In the configuration of FIG. 3B, an end of each of the leads 240a does not protrude from the molding material 260b.

Figure 3C:
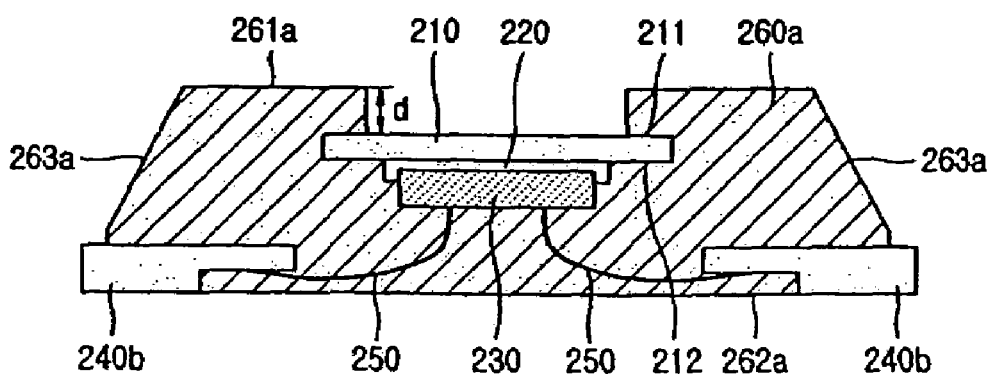

FIG. 3C is a cross-sectional view illustrating another exemplary configuration of MLP 200 taken along line A-A' of FIGS. 2A and 2B. The embodiment of MLP 200 shown in FIG. 3C is generally similar to the embodiments previously described and therefore the same reference characters are used in FIG. 3C to identify elements therein that correspond to the elements shown in and described with reference to the prior figures. Accordingly, descriptions of elements shown in FIG. 3C that are common and/or similar to those shown in and described with reference to the prior figures are not repeated.

Referring now to FIG. 3C, it is shown that the shape of leads 240b are flat inside the molding material 260a rather than being bent similar to leads 240a shown in FIG. 3A. Leads 240b are formed using an etching process, rather than a stamping process, and are thus flat.

Figure 3D:
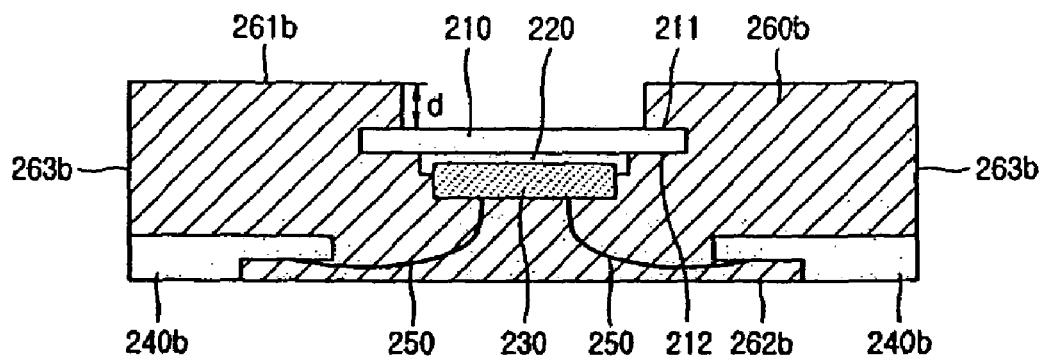

FIG. 3D is a cross-sectional view illustrating yet another exemplary embodiment of the MLP 200 taken along line A-A' of FIGS. 2A and 2B. The embodiment of MLP 200 shown in FIG. 3D is generally similar to the embodiments previously described, and therefore the same reference characters are used to identify elements therein that correspond to the elements shown in the prior figures. Accordingly, descriptions of elements shown in FIG. 3D that are common and/or similar to those shown and described in reference to the prior figures are not repeated.

Referring now to FIG. 3D, side 263b of molding material 260b is generally vertical rather (than slanted similar to side 263a shown in FIG. 3C) and corresponds to the configuration wherein molding material 260b is cut and singulated by a sawing means, such as a blade, and is therefore of the sawing type package. In the configuration of FIG. 3D, an end of each of the leads 240b does not protrude from the molding material 260b.

Figure 3E:
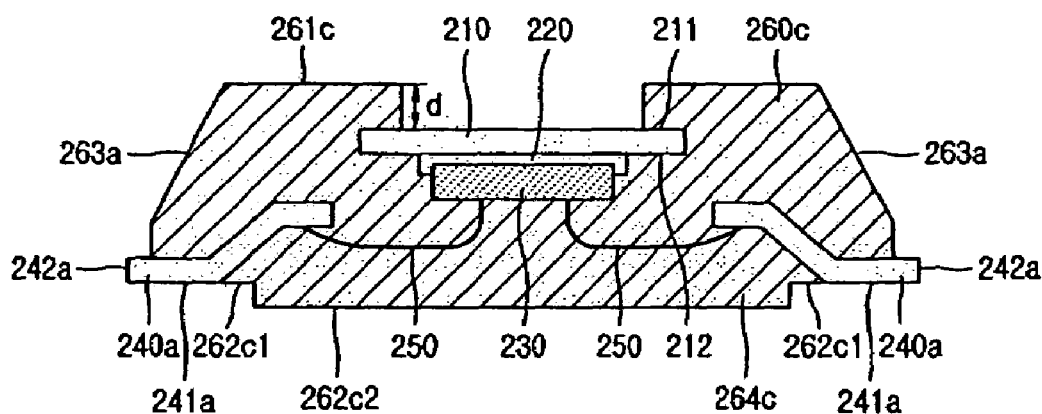
Figure 3F:
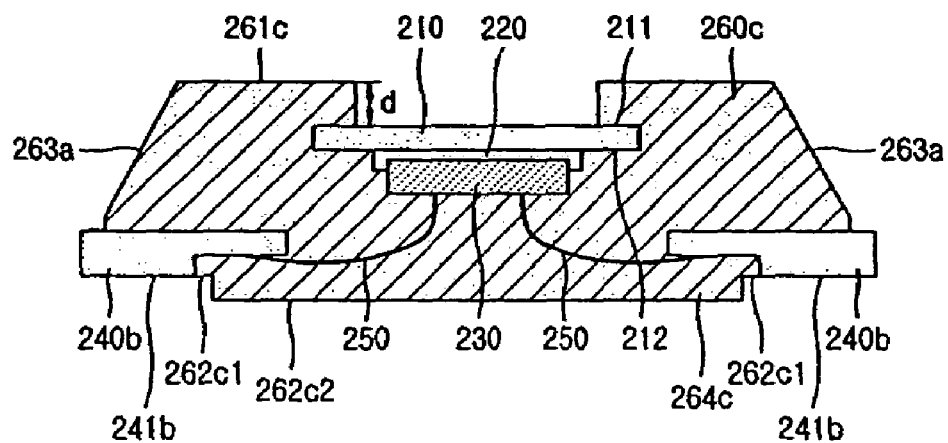

FIGS. 3E and 3F are cross-sectional views illustrating exemplary configurations of MLP 200 taken along line A-A' of FIGS. 2A and 2B. The embodiments of MLP 200 shown in FIGS. 3E and 3F are generally similar to the embodiments previously described, and therefore the same reference characters are used to identify elements therein that correspond to the elements shown in the prior figures. Accordingly, descriptions of elements shown in FIGS. 3E and 3F that are common and/or similar to those shown and described in reference to the prior figures are not repeated.

Referring now to FIGS. 3E and 3F, molding material 260c includes a first surface 261c that is on a different level or separate plane than second surfaces 262c1 and 262c2. More particularly, protrusion 264c is formed at a lower portion of the molding material 260c. The lower side or portion of molding material 260c includes second surface 262c1 that is on the same level as lower surfaces 241a/241b of leads 240a/240b and second surface 262c2 that is a lower surface of the protrusion 264c and protrudes or extends from and is disposed in a different plane from second surface 262c1. The protrusion 264c ensures that when the MLP is soldered to a circuit board (not shown) that surfaces 262c1 and 262c2 are spaced a predetermined distance from and/or above the board, and thereby improves the reliability of solder joint (not shown) adhering the MLP to the board. Protrusion 264c also enhances reliability of the MLP by reducing the likelihood that wires 250 will be exposed to the outside of the molding material 260c.

Figure 3G:
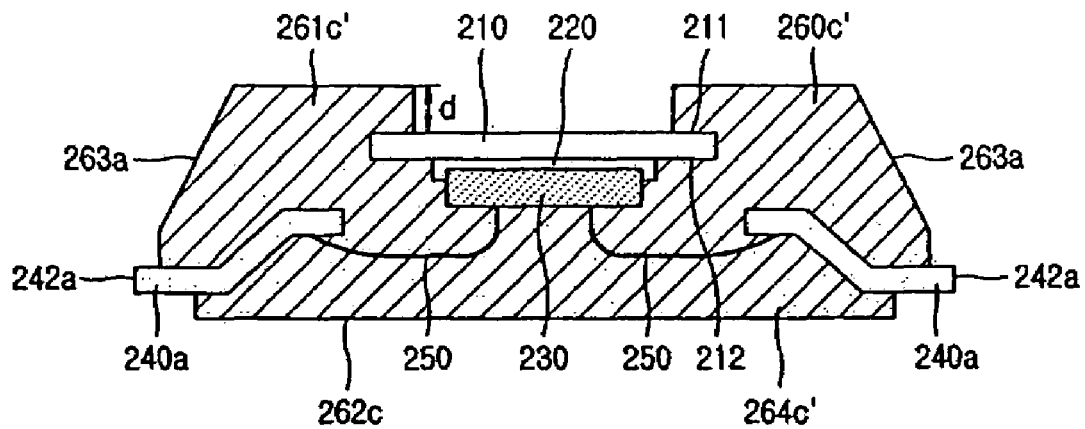
Figure 3H:
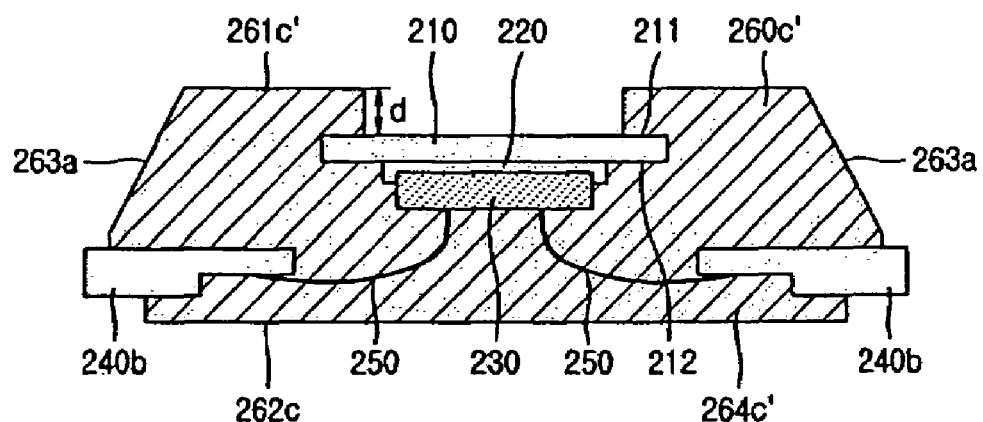

FIGS. 3G and 3H are cross-sectional views illustrating still further exemplary embodiments of MLP 200 taken along line A-A' of FIGS. 2A and 2B. The embodiments of MLP 200 shown in FIGS. 3G and 3H are generally similar to the embodiments previously described, and therefore the same reference characters are used to identify elements therein that correspond to the elements shown in the prior figures. Accordingly, descriptions of elements shown in FIGS. 3G and 3H that are common and/or similar to those shown and described in reference to the prior figures are not repeated.

Referring now to FIGS. 3G and 3H, each of the MLPs of the embodiments shown therein has molding material 260c' with an upper first surface 261c' and a lower second surface 262c. A protrusion 264c' is formed at a lower portion of the molding material 260c' and, unlike the protrusion 264c of FIGS. 3E and 3F, covers a portion of a lower surface of each of leads 240a/240b. Protrusion 264c' similarly improves the reliability of the solder joints (not shown) adhering the MLP to the board and enhances reliability of the MLP by reducing the likelihood that wires 250 will be exposed to the outside of the molding material 260c.

Figure 3I:
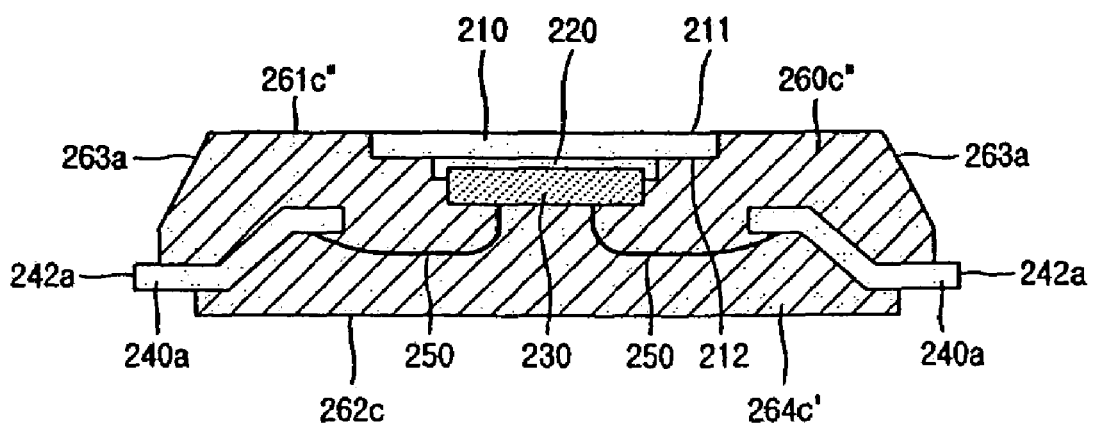
Figure 3J:
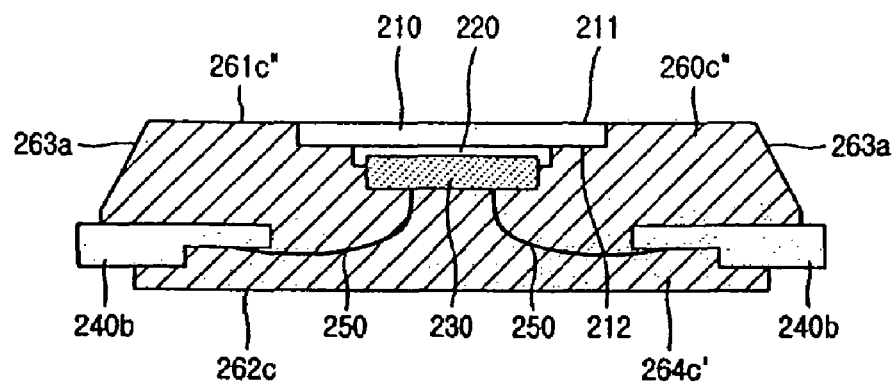

FIGS. 3I and 3J are cross-sectional views illustrating still further exemplary embodiments of MLP 200, taken along line A-A' of FIGS. 2A and 2B. The embodiments of MLP 200 shown in FIGS. 3I and 3J are generally similar to the embodiments previously described, and therefore the same reference characters are used to identify elements therein that correspond to the elements shown in the prior figures. Accordingly, descriptions of elements shown in FIGS. 3I and 3J that are common and/or similar to those shown and described in reference to the prior figures are not repeated.

Referring now to FIGS. 3I and 3J, each of the MLPs depicted therein include upper first surface 261c" of the molding material 260c" that is on the same level as and generally coplanar with the exposed surface of the lead frame pad 210. Although not shown, lead frame pad 210 has anchor means to interface with, i.e., anchor or lock it within, the molding materials 260c. The anchor or locking means can be variously configured, such as, for example, a half etch notch on the perimeter or half etch tabs extending further into the molding material. The locking means also provides a longer hygroscopic path. Protrusion 264c' is (similar to FIGS. 3G and 3H) formed at a lower portion of the molding material 260c" and covers a portion of a lower surface of each of leads 240a/240b. Protrusion 264c' improves the reliability of the solder joints (not shown) adhering the MLP to the board and enhances reliability of the MLP by reducing the likelihood that wires 250 will be exposed to the outside of the molding material 260c.

Figure 4A:
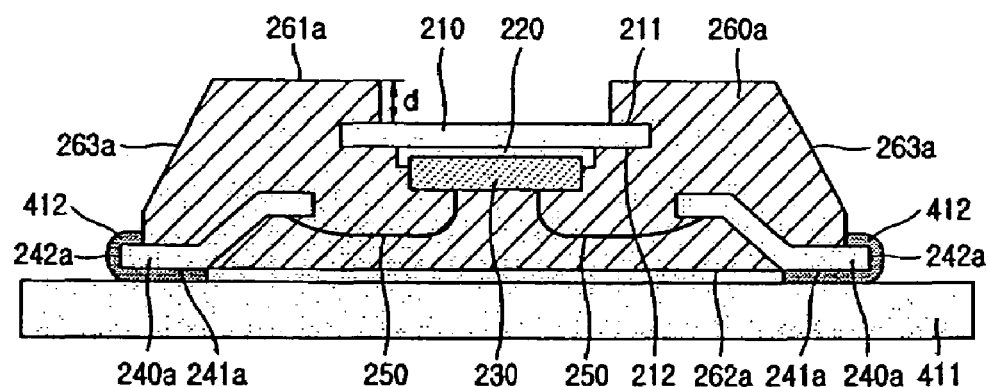
FIGS. 4A through 4D are cross-sectional views for illustrating application examples of the MLP of FIG. 3A.
Figure 4B:
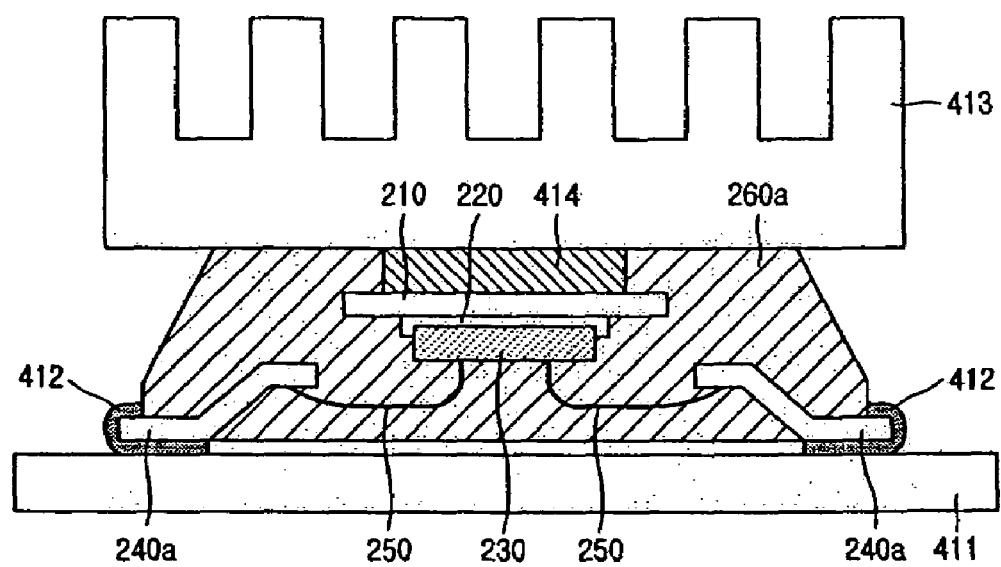

FIGS. 4A and 4B are cross-sectional views illustrating application examples of the MLP of FIG. 3A. As shown in FIG. 4A, the MLP of the present invention is adhered to a board 411 using a solder 412. In other words, the exposed portions of the leads 240a are adhered to a surface of the board 411 by the solder 412. As shown in FIG. 4B, a heat sink 413 is adhered to an upper portion of the MLP by a solder 414. Here, the solder 414 is disposed in a space on the exposed portion of the first surface 211 of the lead frame pad 210 enclosed by the molding material 260a.

Figure 4C:
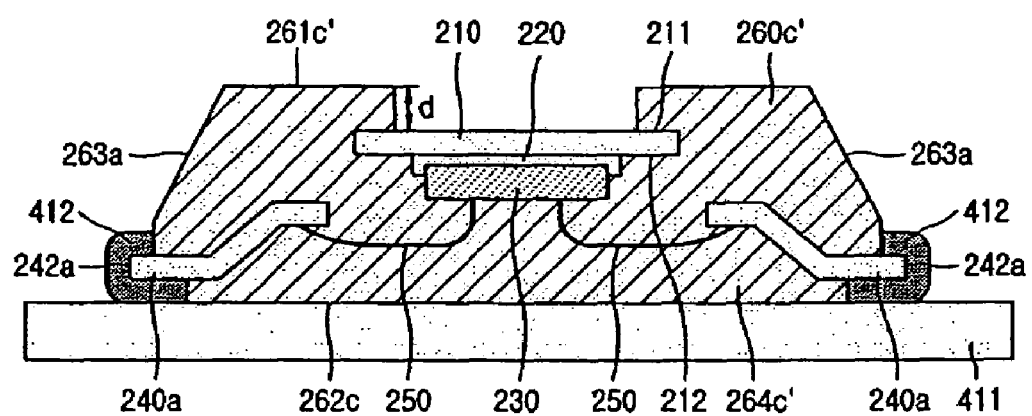
Figure 4D:
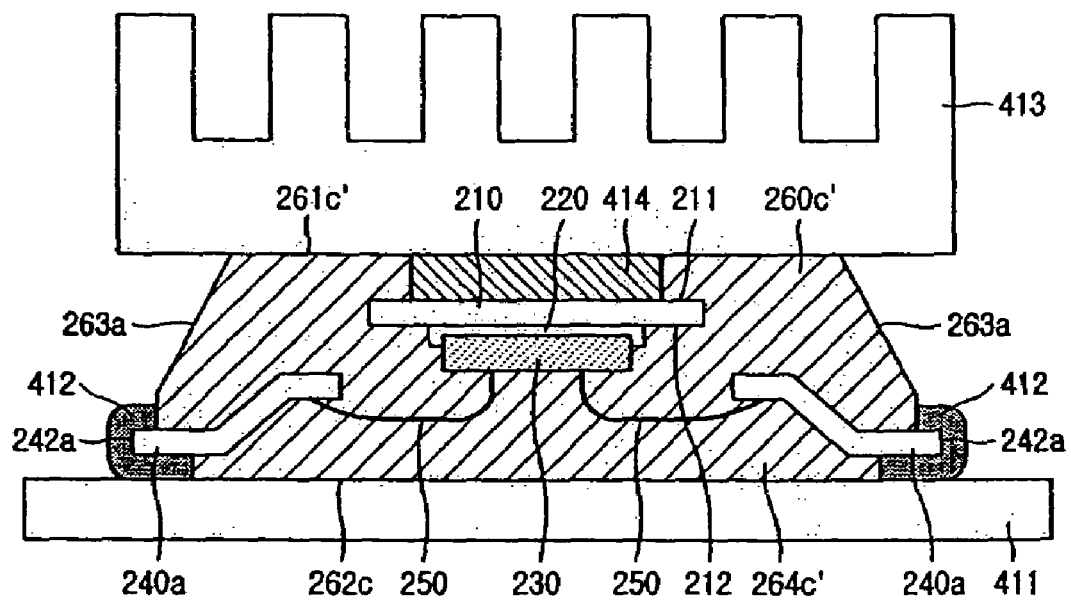

FIGS. 4C and 4D are cross-sectional views illustrating application examples of the MLP of FIG. 3G. As shown in FIG. 4C, the MLP of the present invention is adhered to the board 411 by the solder 412. In other words, the exposed portions of the leads 240a are adhered to the surface of the board 411 by the solder 412. Here, the solder 412 is prevented from flowing to a side due to a side of the protrusion 264c' of the molding material 260c' of the MLP. As a result, the reproducibility and reliability of the solder joint is improved. As shown in FIG. 4D, the heat sink 413 is adhered to the upper portion of the MLP by the solder 414. Here, the solder 414 is disposed in the space on the exposed portion of the first surface 211 of the lead frame pad 210 enclosed by the molding material 260c'.

Figure 5A:
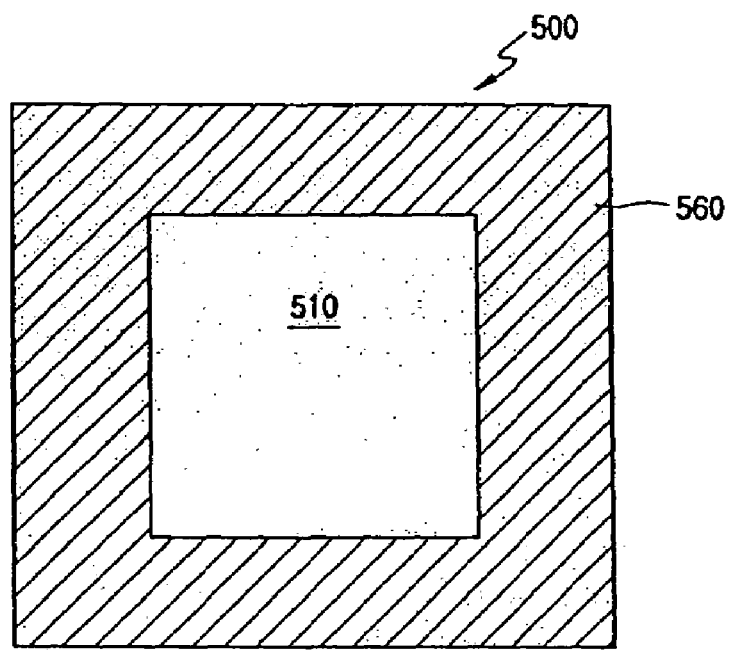
FIGS. 5A and 5B are a plan view and a rear view of an MLP, respectively, according to another embodiment of the present invention.
Figure 5B:
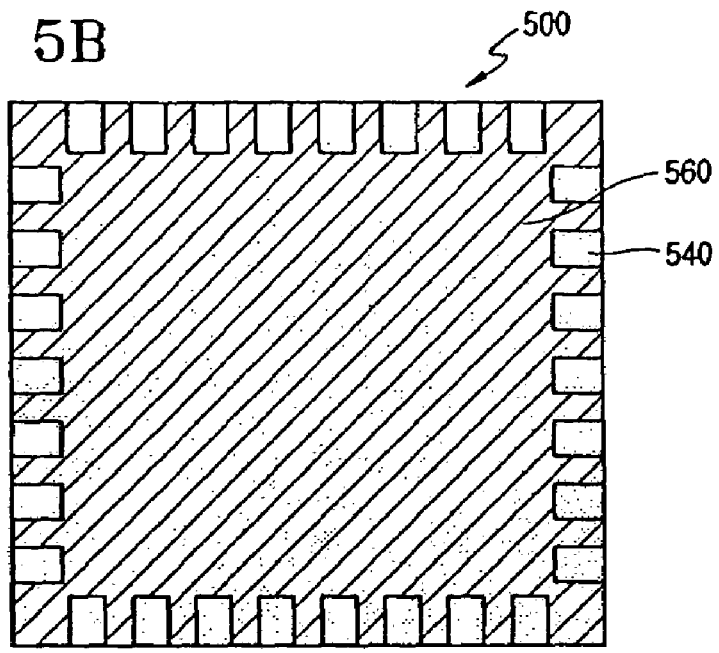

FIGS. 5A and 5B a plan view and a rear view of an MLP, respectively, according to another embodiment of the present invention. Referring to FIGS. 5A and 5B, an MLP 500 of the present embodiment includes a lead frame pad 510 including an upper surface having the central portion exposed by a molding material 560. The exposed surface of the lead frame pad 510 is, in this embodiment, square. The MLP 500 also includes leads 540 including lower surfaces having edges exposed by the molding material 560. In other words, a plurality of leads 540 are spaced apart from one another at the edge of the molding material 560. A surface of the molding material 560 exposing the lead frame pad 510 is opposite to the other surface of the molding material 560 exposing the leads 540. For example, as shown in FIG. 5A, the surface of the molding material 560 exposing the lead frame pad 510 is an upper surface, and the other surface of the molding material 560 exposing the leads 540 is a lower surface.

Figure 6A:
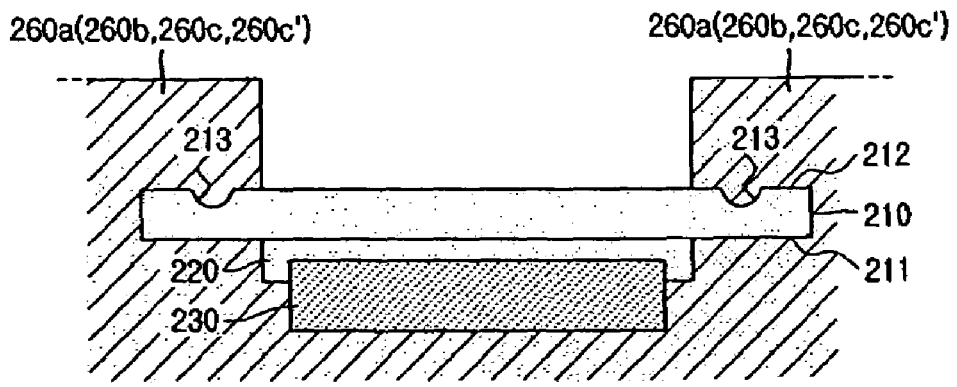
FIGS. 6A and 6B are cross-sectional views for illustrating examples of a lead frame pad used in an MLP of the present invention.
Figure 6B:
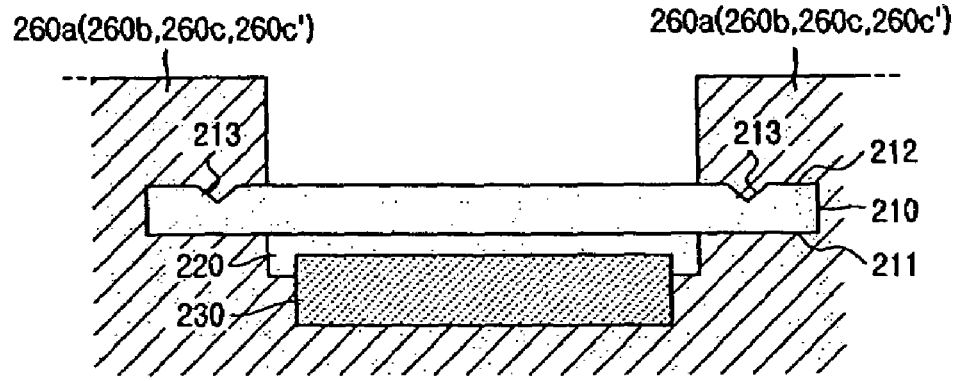

FIGS. 6A and 6B are cross-sectional views illustrating exemplary embodiments of a lead frame pad used in conjunction with the MLP of the present invention. The same reference numerals used in FIGS. 3A-3H are used in FIGS. 6A and 6B to refer to corresponding and/or similar elements.

As shown in FIGS. 6A and 6B, the second surface 212 of the lead frame pad 210 is divided into a portion exposed to the outside of the molding material 260a, 260b, 260c or 260c' and a portion covered with the molding material 260a, 260b, 260c or 260c'. Grooves 213 are formed at the portion of the second surface 212 covered with the molding material 260a, 260b, 260c or 260c'. Although not seen from the cross-section, grooves 213 are disposed and extend along the length of the periphery of the lead frame pad 210 (i.e., grooves 213 extend in a direction into and/or out of the paper of FIG. 6A).

Grooves 213 may be semicircular as shown in FIG. 6A or may be V-shaped as shown in FIG. 6B. In a case where the lead frame pad 210 is formed using an etching process, the grooves 213 are semicircular. However, in a case where the lead frame pad 210 is formed using a stamping process, the grooves 213 are V-shaped. The grooves 213 serve to extend a hygroscopic path through and/or within which moisture flows. The grooves 213 also serve as anchors between the lead frame pad 210 and the molding material 260a, 260b, 260c or 260c' so as to strongly adhere the molding material 260a, 260b, 260c or 260c' to the lead frame pad 210.

Figure 7A:
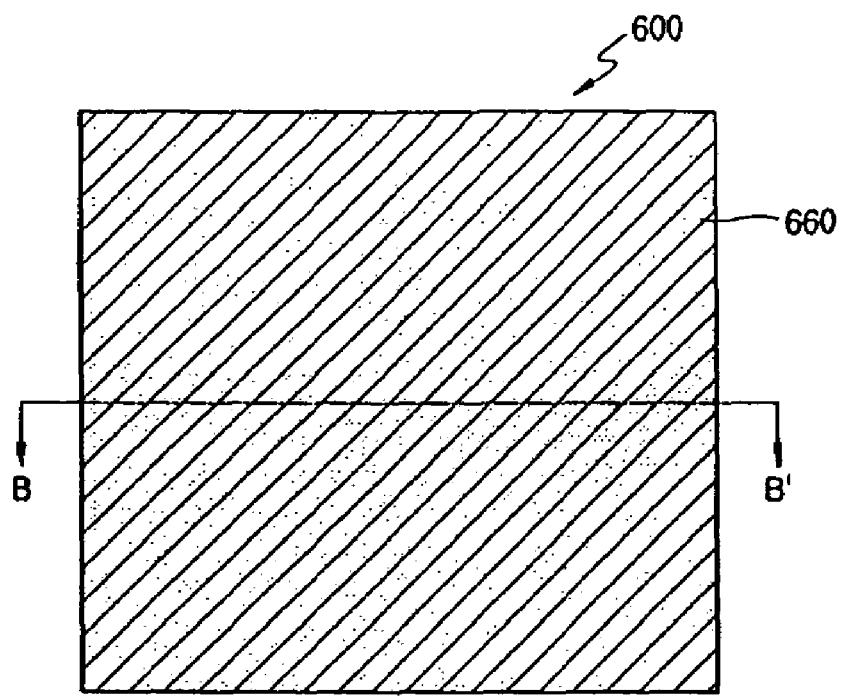
FIGS. 7A and 7B are a plan view and a rear view of an MLP, respectively, according to still another embodiment of the present invention.
Figure 7B:
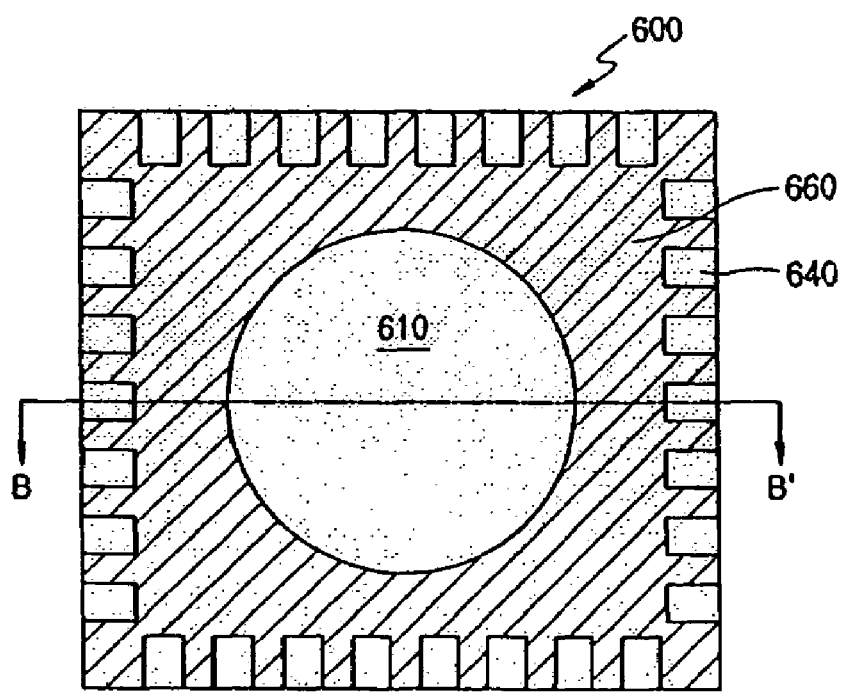

FIGS. 7A and 7B are a plan view and a rear view, respectively, of another embodiment of an MLP of the present invention. Referring to FIGS. 7A and 7B, MLP 600 includes an upper surface that is fully covered with molding material 660. A lower surface of the MLP 600 is formed so that a portion of a surface of the lead frame pad 610 and a portions of each of leads 640 are exposed to the outside of the molding material 660. The exposed surface of the lead frame pad 610 is circular. A plurality of leads 640 is spaced apart from one another at the edge of the molding material 660. Differently from the MLP 200 described with reference to FIGS. 2A and 2B, in the MLP 600, a surface of the molding material 660 exposing the lead frame pad 610 is the same as a surface of the molding material 660 exposing the leads 640.

Figure 8A:
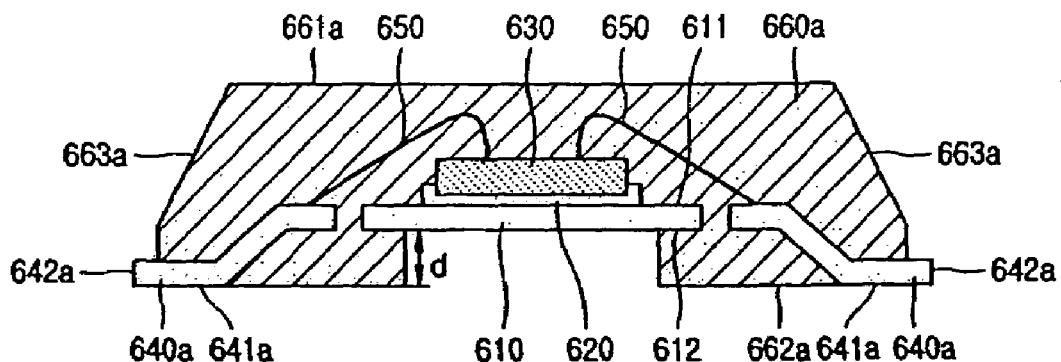
FIGS. 8A through 8G are cross-sectional views for illustrating different examples of the MLP of FIGS. 7A and 7B.

FIG. 8A is a cross-sectional view illustrating an exemplary configuration of MLP 600 taken along line B-B' of FIGS. 7A and 7B. Referring to FIG. 8A, the lead frame pad 610 includes first and second surfaces 611 and 612 that are opposite to each other. A semiconductor chip 630 is adhered to the first surface 611 of the lead frame pad 610. An adhesive, for example, a solder 620, is disposed between the lead frame pad 610 and the semiconductor chip 630. The second surface 612 of the lead frame pad 610 is exposed to the outside of a molding material 660a. Here, not the entire second surface 612 but only a portion of the second surface 612 is exposed. In other words, a portion of the second surface 612 of the lead frame pad 610 is covered with the molding material 660a, while a portion of the second surface 612 of the lead frame pad 610 is not covered by and is thus exposed to the outside of the molding material 660a. Only lower surfaces 641a of leads 640a are exposed to the outside of the molding material 660a. Inside the molding material 660a, the leads 640a are electrically coupled to the semiconductor chip 630 by wires 650. The molding material 660a encloses the remaining portion except a portion of the second surface 612 of the lead frame pad 610 and the lower surfaces 641a and sides 642a of the leads 640a. Here, no elements or structures are exposed through upper surface 661a of the molding material 660a. The lead frame pad 610 and the leads 640a are exposed to the outside through a lower surface 662a of the molding material 660a.

The lower surface 662a of the molding material 660a exposing the second surface 612 of the lead frame pad 610 is not on the same level as the second surface 612 of the lead frame pad 610 but has a step difference. In other words, the lower surface 662a of the molding material 660a is disposed a predetermined distance d from the second surface 612 of the lead frame pad 610. The predetermined distance d is preferably from approximately 0.12 mm to approximately 0.15 mm. Since the second surface 612 of the lead frame pad 610 is spaced apart from the lower surface 662a of the molding material 660a as described above, a hygroscopic path extends by the predetermined distanced. The exposed area of the lead frame pad 610 is easily adjusted regardless of the original area thereof. Thus, although exposed to a relatively high temperature reflow process when MLP 600 is soldered on a board, thermal stress to MLP 600 is significantly reduced.

A side 663a of the molding material 660a is slanted. This corresponds to a case where the molding material 660a is formed to allow a punched type package singulation process. In this case, an end of each of the leads 640a protrudes from the molding material 660a by from approximately 0.8 mm to approximately 0.15 mm. Inside the molding material 660a the leads 640a are formed and/or bent toward the lead frame pad 610 using a lead shaping process, such as, for example, a stamping process.

Figure 8B:
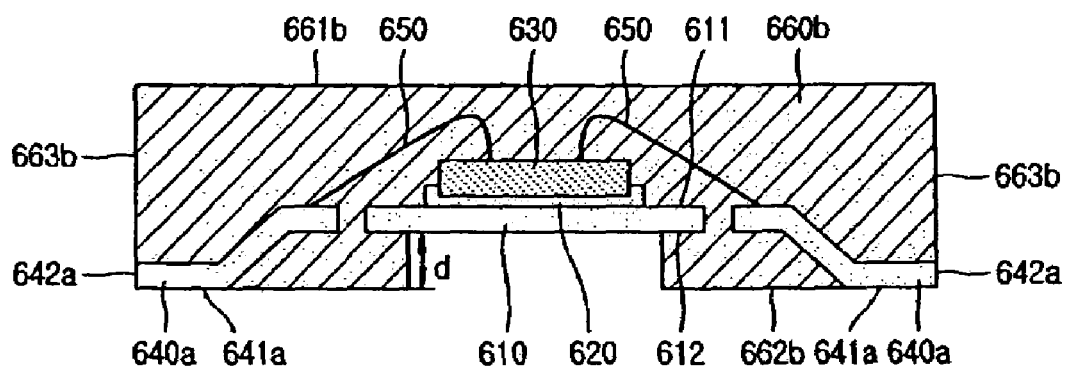

FIG. 8B is a cross-sectional view illustrating an exemplary configuration of MLP 600 taken along line B-B' of FIGS. 7A and 7B. The same reference numerals used in FIG. 8A are used in FIG. 8B to refer to corresponding and/or similar elements. As shown in FIG. 8B, side 663b of molding material 660b is generally vertical (rather than slanted as side 663a shown in the configuration of FIG. 8A), and corresponds to the configuration wherein molding material 660b is formed to be singulated by a sawing type package singulation process and is cut by a sawing means, such as a blade, and thus side 663b of molding material 660b is vertical. In this case, the ends of the leads 640a do not protrude from the molding material 660b.

Figure 8C:
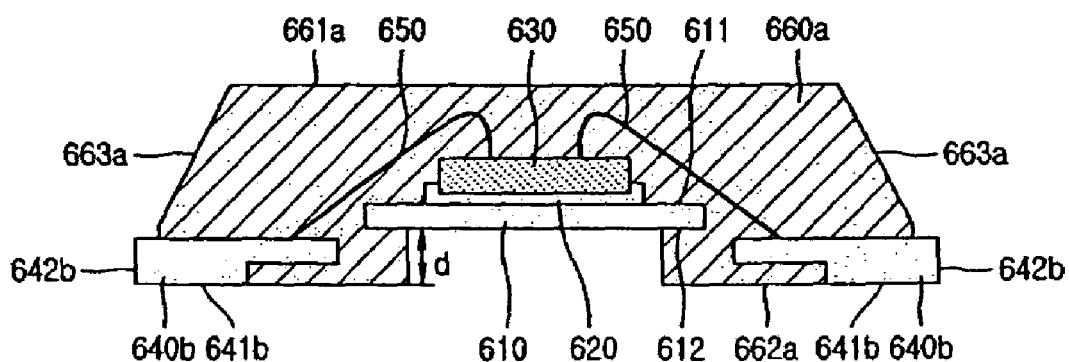

FIG. 8C is a cross-sectional view illustrating still another exemplary configuration of MLP 600 taken along line B-B' of FIGS. 7A and 7B. The same reference numerals used in FIG. 8A are used in FIG. 8C to refer to corresponding and/or similar elements. As shown in FIG. 8C, leads 640b are flat inside the molding material 260a rather than being bent or formed similar to the leads shown in FIGS. 8A and 8B. Leads 640b are manufactured using an etching process, rather than a stamping process, and are thus flat.

Figure 8D:
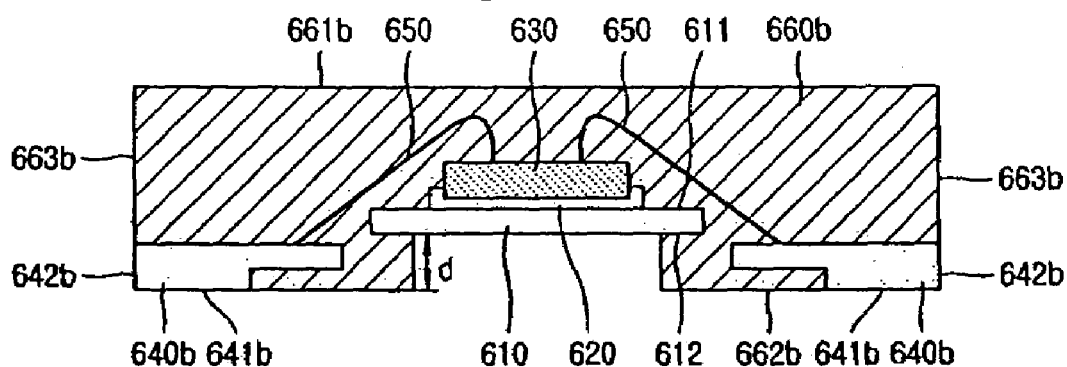

FIG. 8D is a cross-sectional view illustrating yet another exemplary configuration of MLP 700 taken along line B-B' of FIGS. 7A and 7B. The same reference numerals used in FIG. 8C are used to refer to corresponding and/or similar elements in FIG. 8D. As shown in FIG. 8D, side 663b of molding material 660b is generally vertical (rather than slanted), and corresponds to the configuration wherein molding material 660b is formed for a sawing type package singulation process and is cut by a sawing means, such as a blade, and thus side 663b is generally vertical. In this case, the ends of leads 640b do not protrude from the molding material 660b.

Figure 8E:
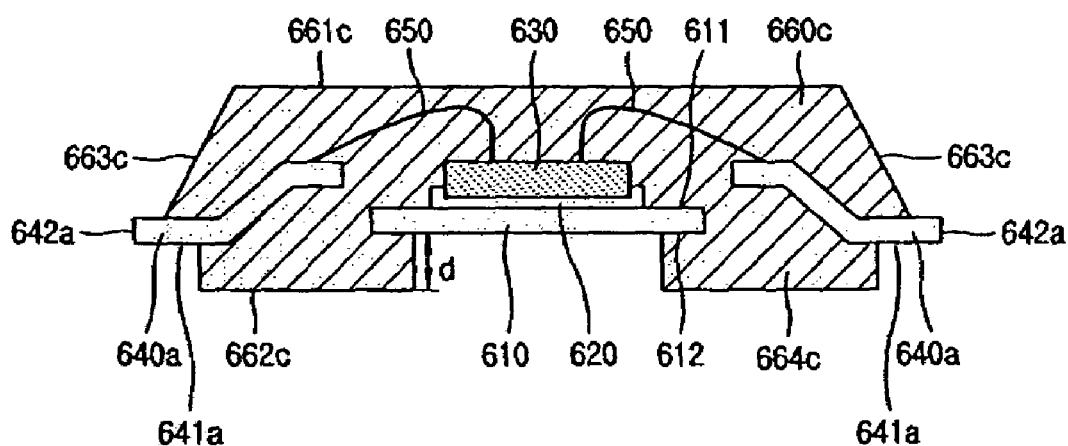
Figure 8F:
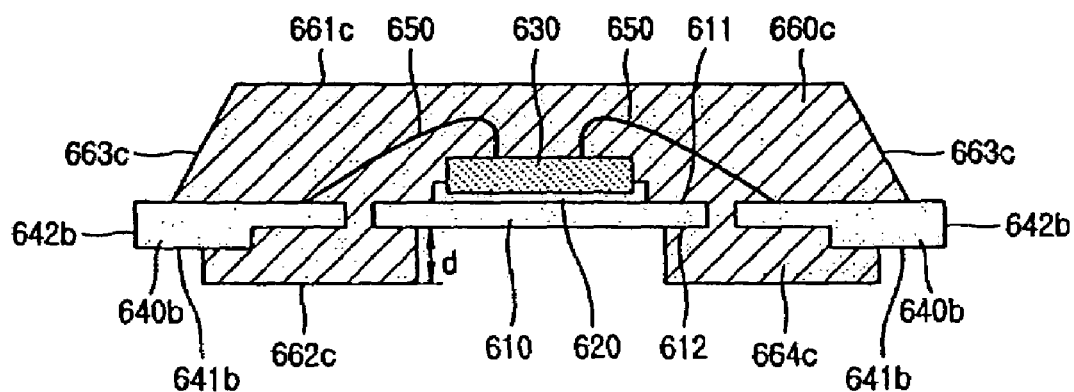

FIGS. 8E and 8F are cross-sectional views illustrating further exemplary configurations of MLP 700 taken along line B-B' of FIGS. 7A and 7B. The same reference numerals used in FIGS. 8A and 8C are used to refer to corresponding and/or similar elements in FIGS. 8E and 8F. Referring now to FIGS. 8E and 8F, it is shown that molding material 660c includes an upper first surface 661c and two lower second surfaces or protrusions 662c and 664c. Protrusions 662c and 664c are generally coplanar relative to each other, but are not on the same plane or level as lower surfaces 641a/641b of leads 640a/640b or the exposed surface of the lead frame pad 610. Protrusion 662c and 664c ensure that when the MLP is soldered to a circuit board (not shown) the lower surfaces 641a/641b of leads 640a/640b are spaced a predetermined distance from and/or above the board and thereby reduce the likelihood of the solder bump/joint shifting and/or compacting. Thus, protrusions 662c and 664c enhance the repeatability and reliability of the soldering process/joint.

Figure 8G:
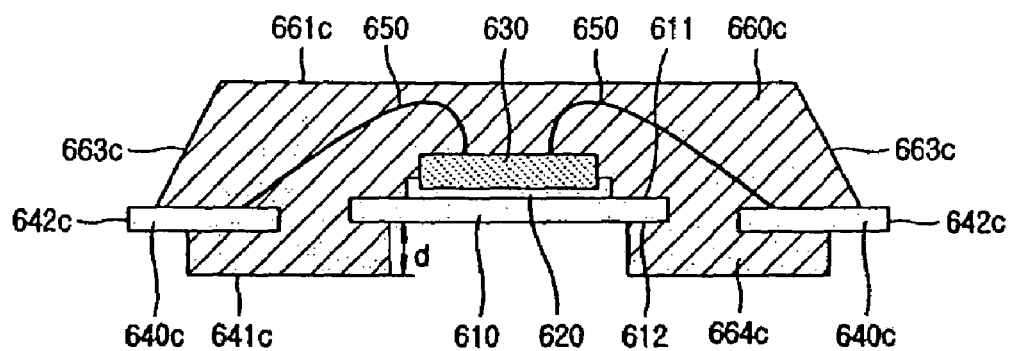

FIG. 8G is a cross-sectional view illustrating yet another exemplary configuration of MLP 700 taken along line B-B' of FIGS. 7A and 7B. The same reference numerals used in of FIG. 8G are also used in FIGS. 8E and 8F in reference to corresponding and/or similar elements. As shown in FIG. 8G, leads 640c include flat upper and lower surfaces which are on the same level, i.e., are substantially coplanar with, the upper and lower surfaces of lead frame pad 610.

Figure 9A:
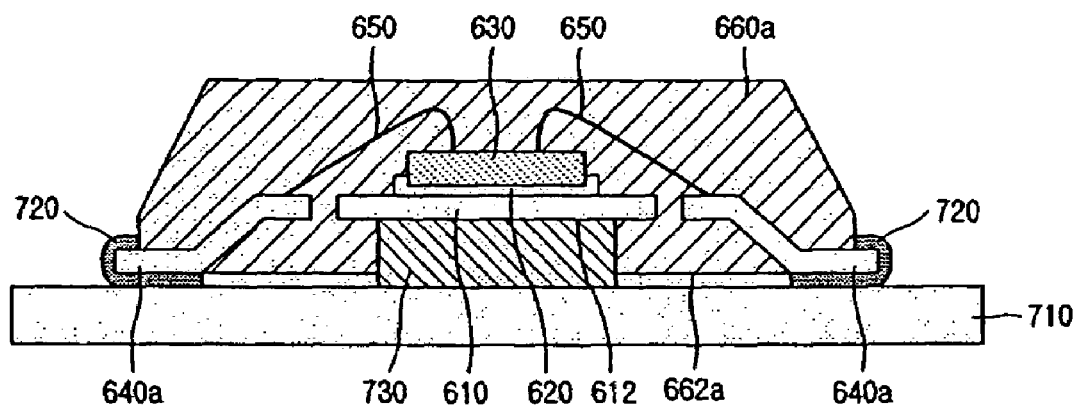
FIGS. 9A through 9D are cross-sectional views for illustrating application examples of the MLP of FIG. 8A.
Figure 9B:
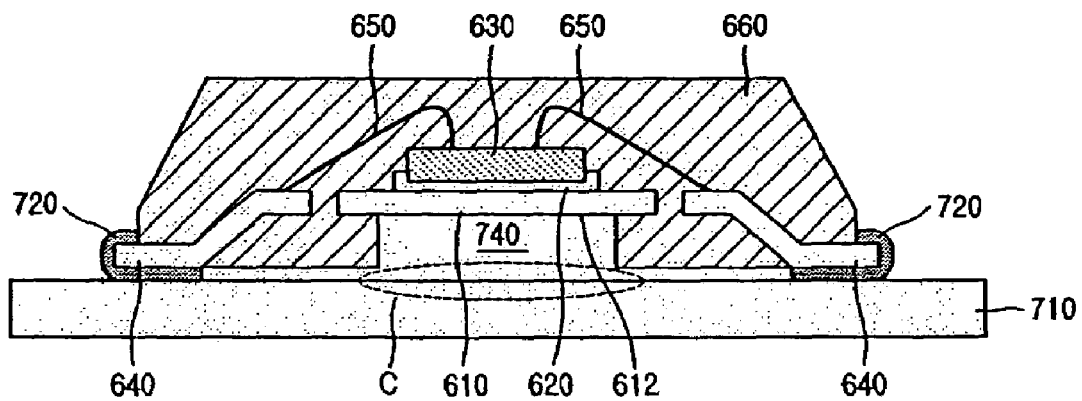

FIGS. 9A and 9B are cross-sectional views illustrating application examples of the configuration of MLP 700 illustrated in FIG. 8A. As shown in FIG. 9A, MLP 700 is adhered to a board 710 by solders 720 and 730. In other words, exposed portions of leads 640a are adhered to the surface of the board 710 by the solder 720. An exposed portion of the lead frame pad 610 is also adhered to the surface of the board 710 by the solder 730. In this case, a lower surface 662a of molding material 660a has a step difference, i.e., is spaced a predetermined distance apart from, second surface 612 of the lead frame pad 610. A space (not referenced) is defined by molding material 660a surrounding the step difference or separation between lower surface 662a and second surface 612 that accommodates solder 730. Thus, even when a large amount of solder 730 is used to couple frame pad 610 to board 710, the adhesion of leads 640a to board 710 by solder 720 is not adversely affected, i.e., leads 640a are not significantly "pulled" away from the surface of board 710 by solder 730.

As shown in FIG. 9B, leads 640 may be adhered to the board 710 without adhering or soldering lead frame pad 610 to the board 710. In this case, a space 740 of predetermined size/area is formed between a portion C of the surface of board 710 and the exposed portion of the second surface 612 of the lead frame pad 610. Space 740 ensures that any circuit runners or patterns formed on portion C of board 710 are not contacted or shorted by the MLP or any component thereof. However, it is to be understood that when solder is disposed in the space 740 an undesired electrical short may occur.

Figure 9C:
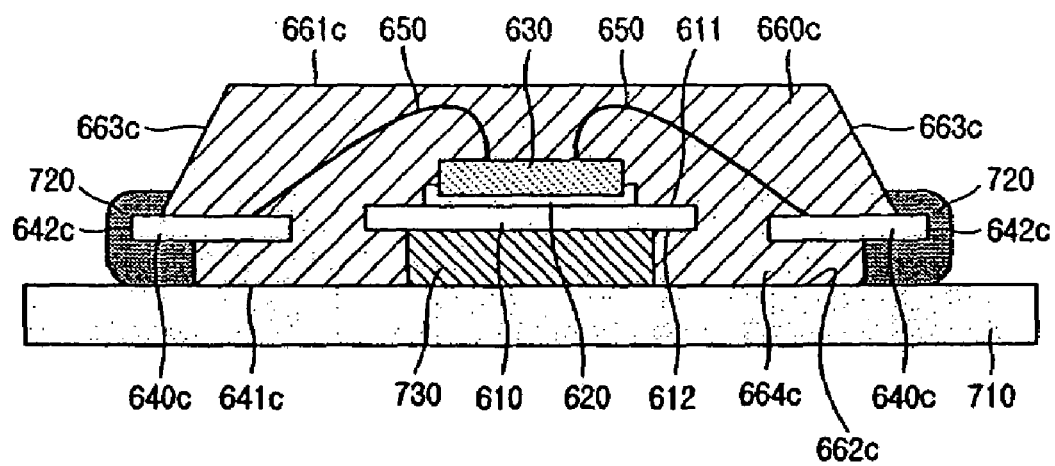
Figure 9D:
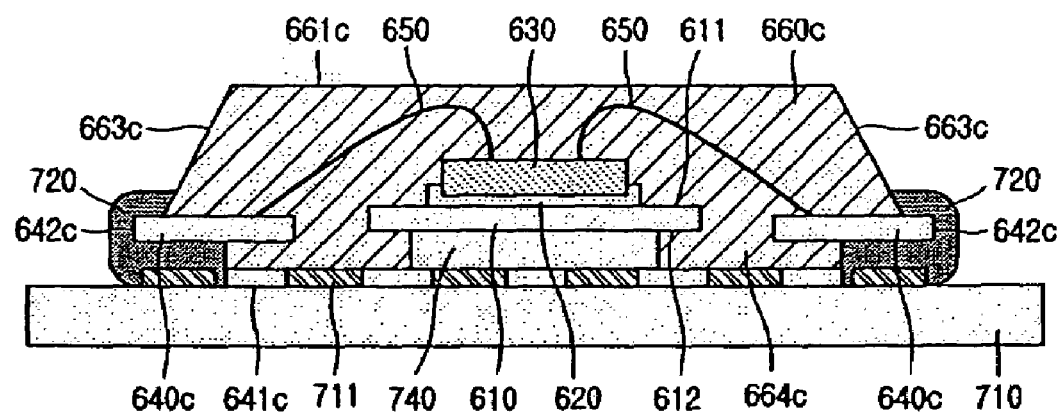

FIGS. 9C and 9D are cross-sectional views illustrating application examples of the configuration of MLP 700 depicted in FIG. 8G. As shown in FIG. 9C, the MLP is adhered to board 710 by solders 720 and 730. In other words, the exposed portions of the leads 640c are adhered to the surface of the board 710 by the solder 720. The exposed portion of the lead frame pad 610 is adhered to the surface of the board by the solder 730. In this case, the lower surface 662c of protrusion 664c has a step difference, i.e., is spaced a predetermined distance, from the second surface 612 of lead frame pad 610. A space (not referenced) is defined by molding material 660c surrounding the step difference or separation between lower surface 662c and second surface 612 that accommodates solder 730. Thus, even when a large amount of solder 730 is used to couple frame pad 610 to board 710, the adhesion of leads 640c to board 710 by solder 720 is not adversely affected, i.e., leads 640c are not significantly "pulled" away from the surface of board 710 by solder 730.

As shown in FIG. 9D, leads 640c may be adhered to board 710 without adhering or soldering lead frame pad 610 to board 710. Here, space 740 having a predetermined size/area is defined between a portion of the surface of the board 710 and the exposed portion of the second surface 612 of the lead frame pad 610. Thus, inadvertent shorting together of the exposed portion of second surface 612 with the circuit patterns 711 disposed on the portion of the surface of board 710 underneath the MLP and within space 740 is substantially reduced. Of course, however, if a solder is disposed in the space 740 undesired electric short may occur.

Figure 10A:
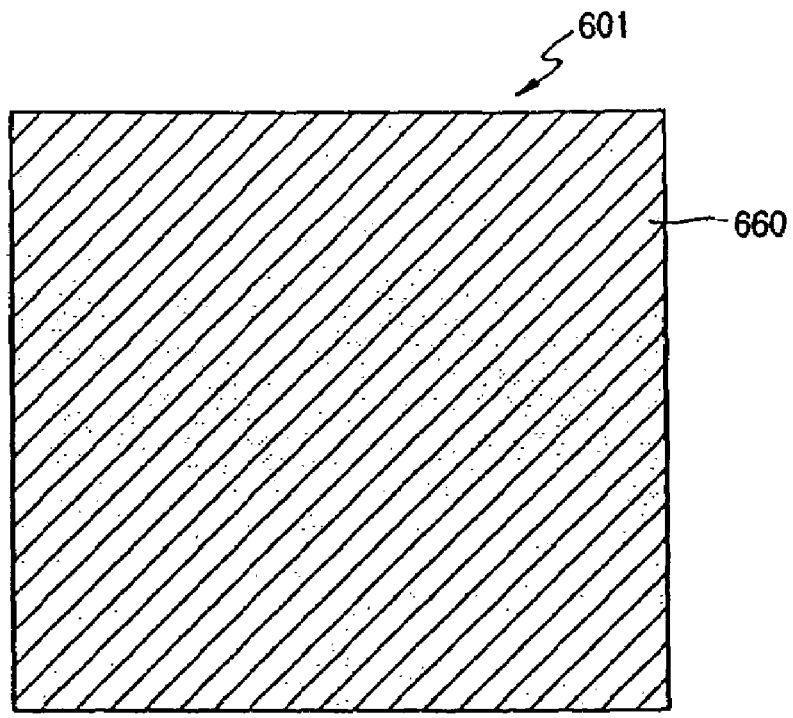
FIGS. 10A and 10B are a plan view and a rear view of an MLP, respectively, according to yet another embodiment of the present invention.
Figure 10B:
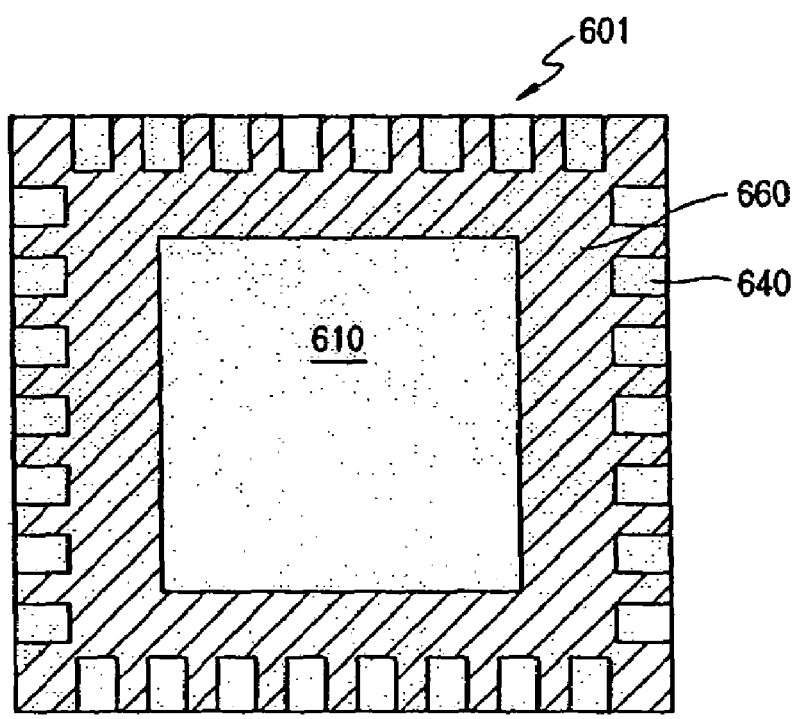

FIGS. 10A and 10B are plan and rear views, respectively, of an MLP according to yet another embodiment of the present invention. Referring to FIGS. 10A and 10B, an MLP 601 of the present embodiment includes an upper surface that is fully covered with a molding material 660. A lower surface of the MLP 601 is formed so that a portion of a surface of a lead frame pad 610 and a portion of each of leads 640 are exposed to the outside of the molding material 660. The exposed portion of the surface of the lead frame pad 610 is, in this embodiment, square in shape. Here, a plurality of leads 640 are spaced apart from one another at the edge of the molding material 660.

Figure 11A:
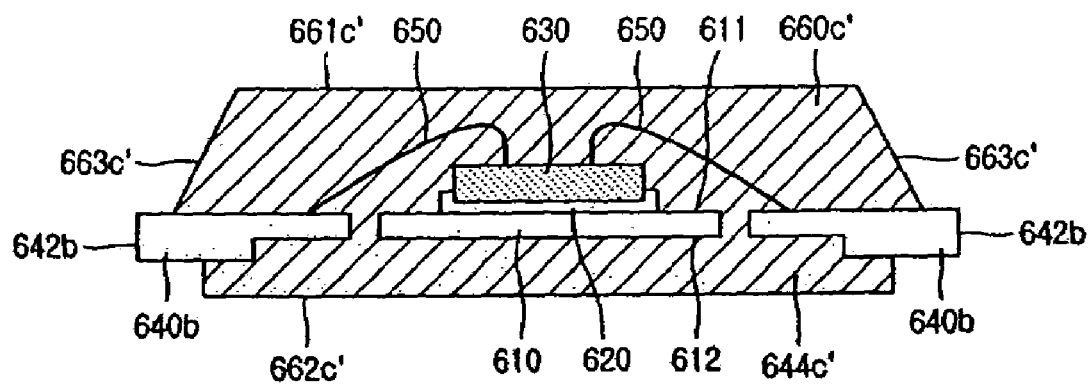
FIGS. 11A through 11D are cross-sectional views of MLPs, according to yet other embodiments of the present invention.

FIG. 11A is a cross-sectional view of an MLP according to yet another embodiment of the present invention. The same reference numerals used in FIG. 8F are used in FIG. 11A to refer to corresponding and/or similar elements therein. As shown in FIG. 11A, the MLP of the present embodiment is similar to the MLP of FIG. 8F with the exception that no surface or portion of lead frame pad 610 is exposed to the outside of molding material 660c'. In other words, the lower surface 612 of lead frame pad 610 is covered with molding material 660c'. Protrusion 644c' formed from molding material 660c' at the bottom surface of molding material 660c'.

Figure 11B:
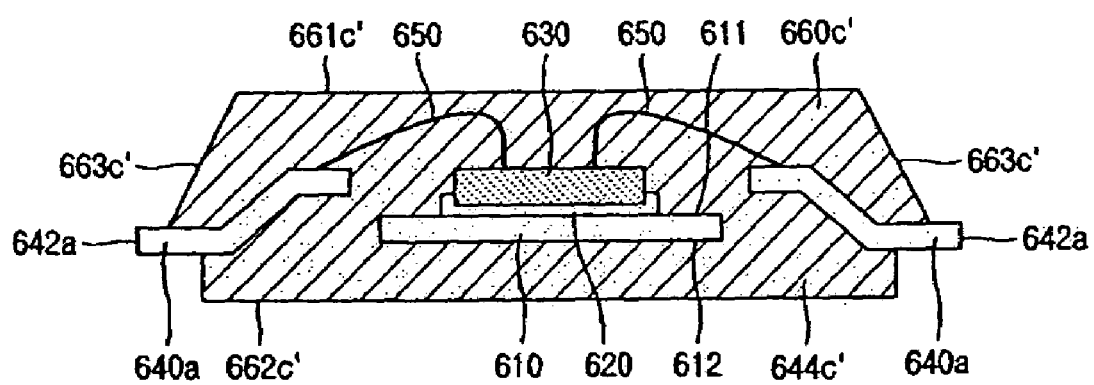

FIG. 11B is a cross-sectional view of an MLP according to yet another embodiment of the present invention. The same reference numerals used in FIG. 8E are used in FIG. 11B when referring to corresponding and/or similar elements. Referring now to FIG. 11B, the MLP of the present embodiment is similar to the MLP of FIG. 8E except that no surface or portion of lead frame pad 610 is exposed to the outside of molding material 660c'. In other words, the lower surface 612 of the lead frame pad 610 is covered with molding material 660c'. Protrusion 644c' formed from molding material 660c' at the bottom surface of molding material 660c'.

Figure 11C:
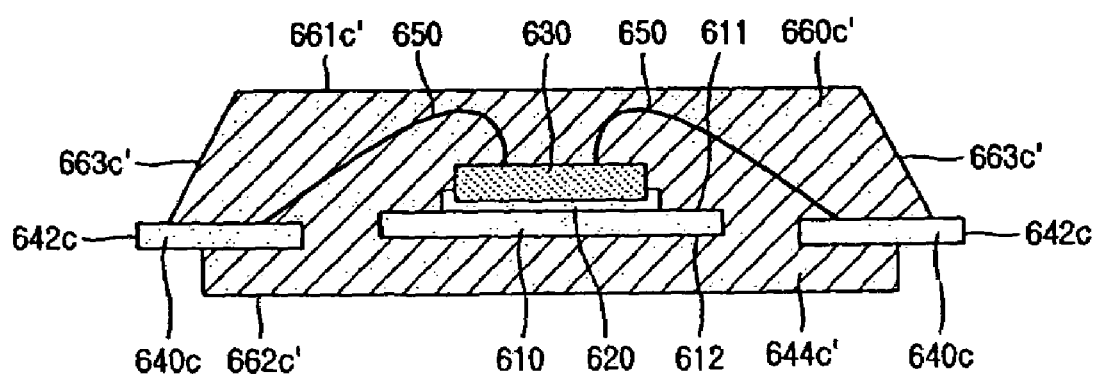

FIG. 11C is a cross-sectional view of an MLP according to yet another embodiment of the present invention. The same reference numerals used in FIG. 8G are used to refer to corresponding and/or similar elements in FIG. 11C. Referring now to FIG. 11C, the MLP of the present embodiment is similar to the MLP of FIG. 8G except that no surface or portion of lead frame pad 610 is exposed to the outside of molding material 660c'. In other words, the lower surface 612 of the lead frame pad 610 is covered with a molding material 660c'. Protrusion 644c' formed from molding material 660c' at the bottom surface of molding material 660c'.

Figure 11D:
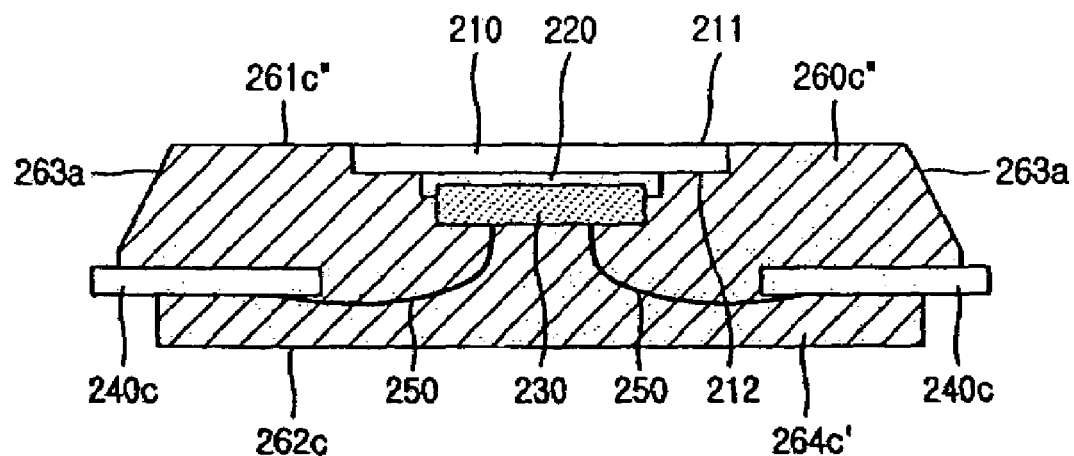

FIG. 11D is a cross-sectional view of an MLP according to an even further embodiment of the present invention. The same reference numerals used in FIG. 3J are used when referring to corresponding and/or similar elements in FIG. 11D. Referring now to FIG. 11D, the MLP of the present embodiment is similar to the MLP of FIG. 3J except that upper and lower surfaces of leads 240c are flat rather than etched.

Figure 12A:
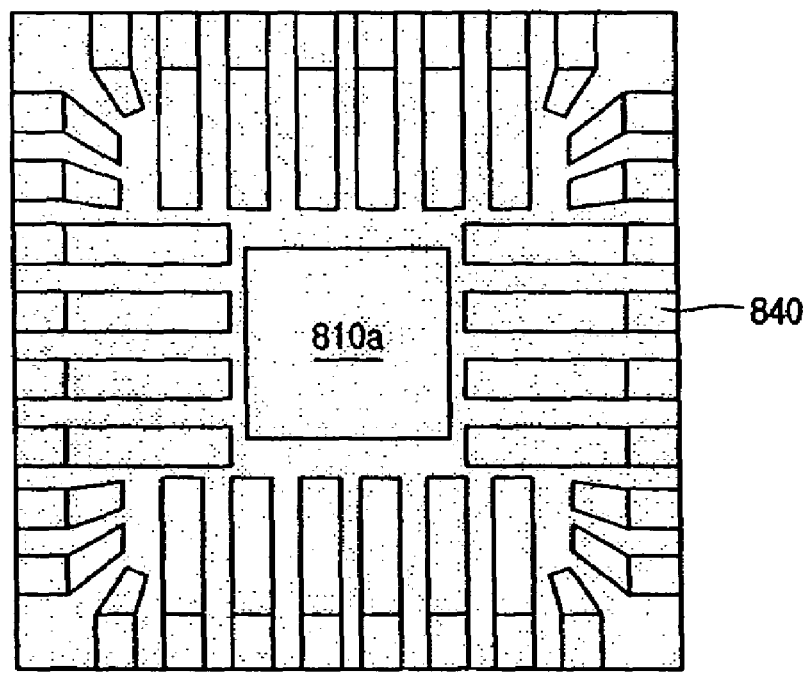
FIGS. 12A and 12B are plan views for illustrating examples of a lead frame applied to an MLP according to yet another embodiment of the present invention.
Figure 12B:
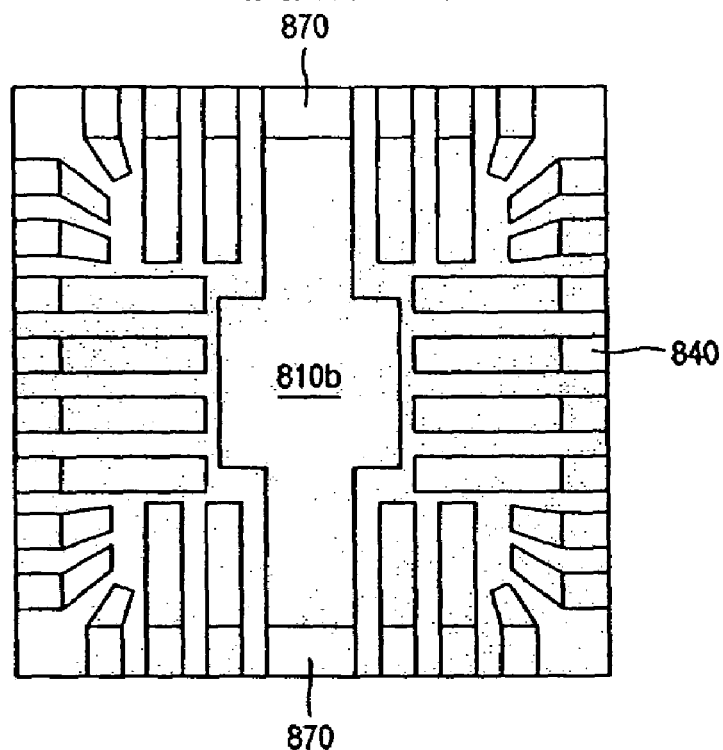
Figure 12C:
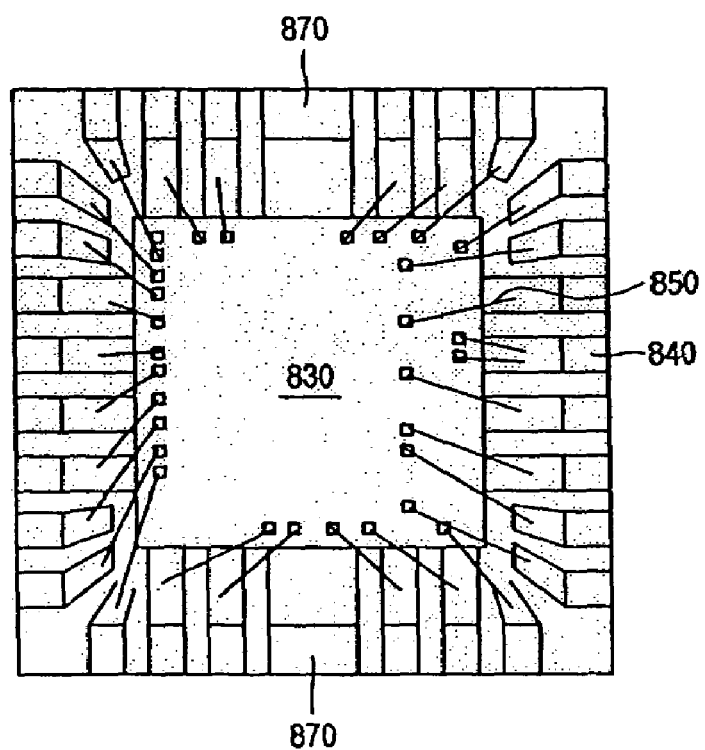
FIG. 12C is a plan view for illustrating a semiconductor chip mounted on the lead frame of FIG. 12B.

FIGS. 12A and 12B are plan views illustrating examples of a lead frame applied to an MLP of the present invention, and FIG. 12C is a plan view for illustrating a semiconductor chip mounted on the lead frame of FIG. 12B.

Referring to FIG. 12A, the lead frame has a structure in which a lead frame pad 810a is disposed in the center, and a plurality of signal leads 840 is disposed around the lead frame pad 810a. Referring to FIG. 12B, a lead frame is similar to the lead frame of FIG. 12A in that a lead frame pad 810b is disposed in the center, and a plurality of signal leads 840 are disposed around the lead frame pad 810b. However, the lead frame of FIG. 12B is different from the lead frame of FIG. 12A in that heat sink leads 870 extend from upper and lower portions of the lead frame pad 810b. In other words, the lead frame of FIG. 12A does not include heat sink leads, while the lead frame of FIG. 12b includes heat sink leads. As shown in FIG. 12C, in a case of the lead frame including heat sink leads, a semiconductor chip 830 is adhered to the lead frame pad 810b. The semiconductor chip 830 is electrically coupled to the signal leads 840 by wires 850, but is not electrically coupled by signal leads to the heat sink leads 870. This is because the heat sink leads 870 serve to transfer and/or emit heat rather than electrical signals.

Figure 13A:
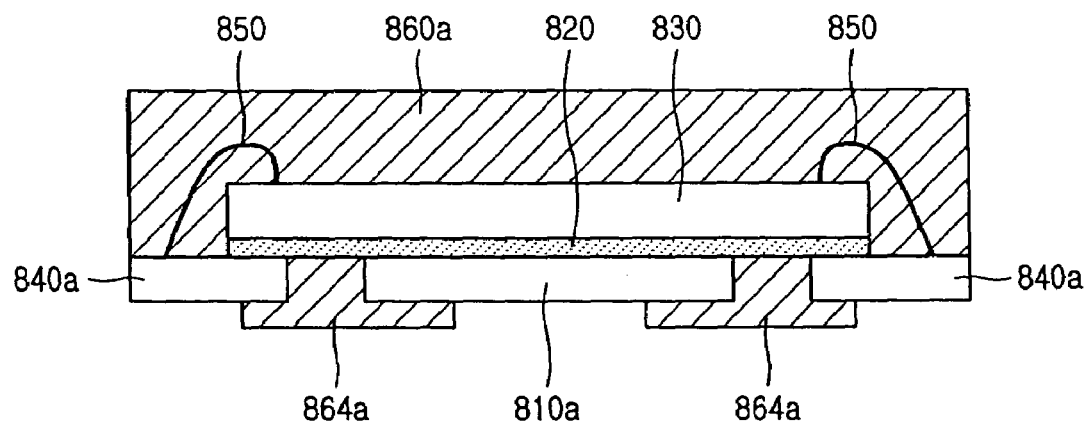
FIGS. 13A through 13H are cross-sectional views for illustrating examples of an MLP adopting the lead frame of FIG. 12A not including heat sink leads.
Figure 13B:
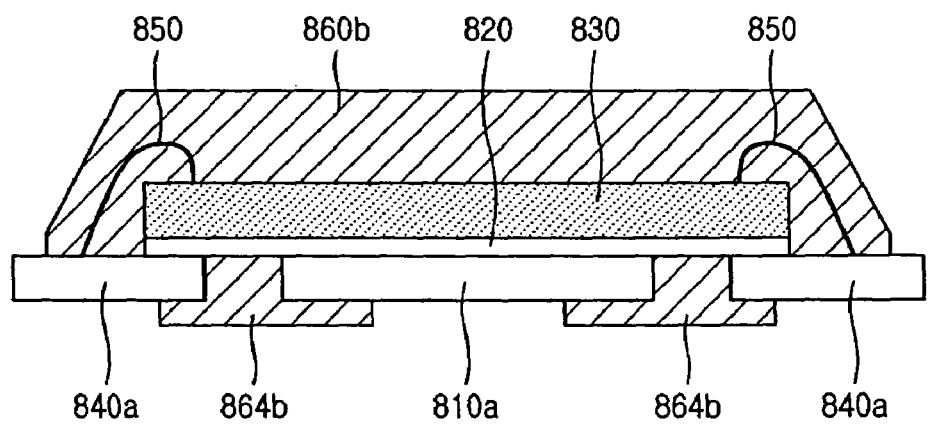

FIGS. 13A and 13B are cross-sectional views illustrating exemplary embodiments of an MLP having the lead frame of FIG. 12A (i.e., not including heat sink leads). The same references numerals are used FIGS. 13A and 13B when referring to corresponding and/or similar elements.

Referring now to FIG. 13a, the semiconductor chip 830 is adhered to an upper surface of the lead frame pad 810a by a solder 820. The semiconductor chip 830 is also adhered to a portion of a surface of each of the signal leads 840a. The semiconductor chip 830, a portion of each of the upper and lower surfaces of the signal leads 840a, a side of the lead frame pad 810a, and a portion of a lower surface of the lead frame pad 810 are covered with molding material 860a. Only the sides and a portion of the lower surfaces of signal leads 840a, and a portion of the lower surface of the lead frame pad 810a, are exposed to the outside of the molding material 860a. In particular, the molding material 860a includes a protrusion 864a extending below of a predetermined distance from the lower surfaces of the signal leads 840a and the lower surface of the lead frame pad 810a. Thus, a lower surface of the protrusion 864a of the molding material 860a has a step difference with, i.e., is spaced a predetermined distance from, the lower surfaces of the signal leads 840a and the lower surface of the lead frame pad 810a. The molding material 860a of the MLP is configured to allow a sawing type package singulation method using a sawing means, such as a blade, and thus a side of the molding material 860a is generally vertical. In this case, the ends of the signal leads 840a do not protrude from the molding material 860a.

Referring to FIG. 13B, the MLP of the present embodiment has a structure in which molding material 860b is formed for a punched type package singulation method using a mold, and thus a side of the molding material 860b is slanted. The remaining elements of the MLP of the present embodiment are the same as those of the MLP of FIG. 13A and thus the detailed description thereof is not repeated.

Figure 13C:
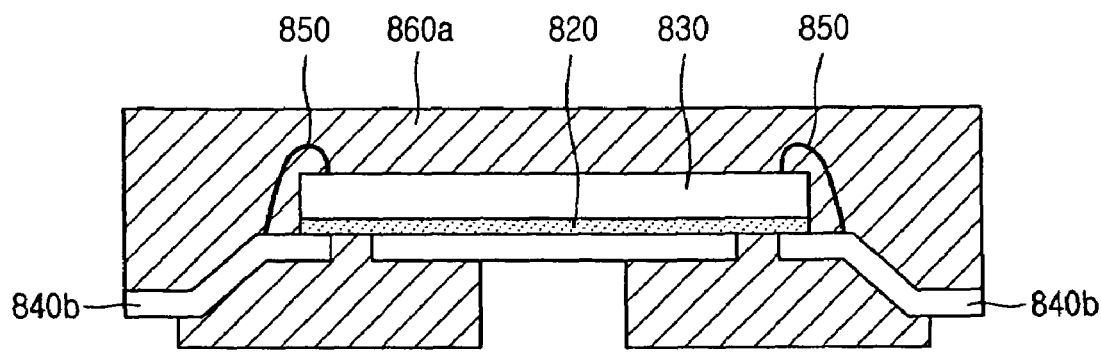
Figure 13D:
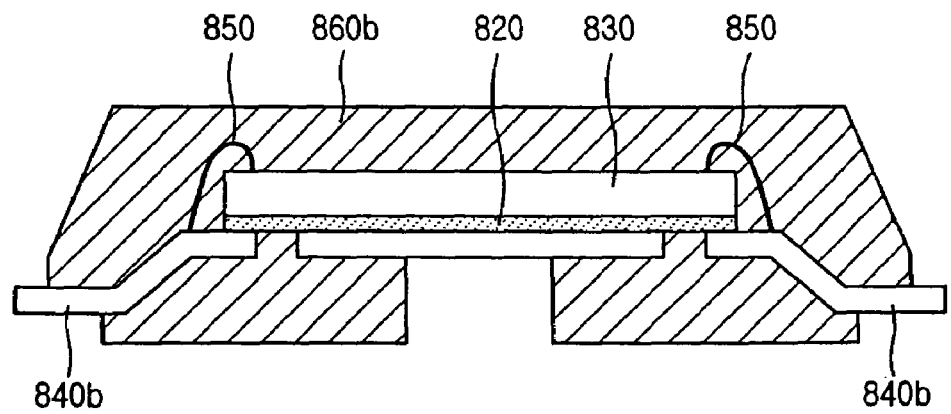
Figure 13E:
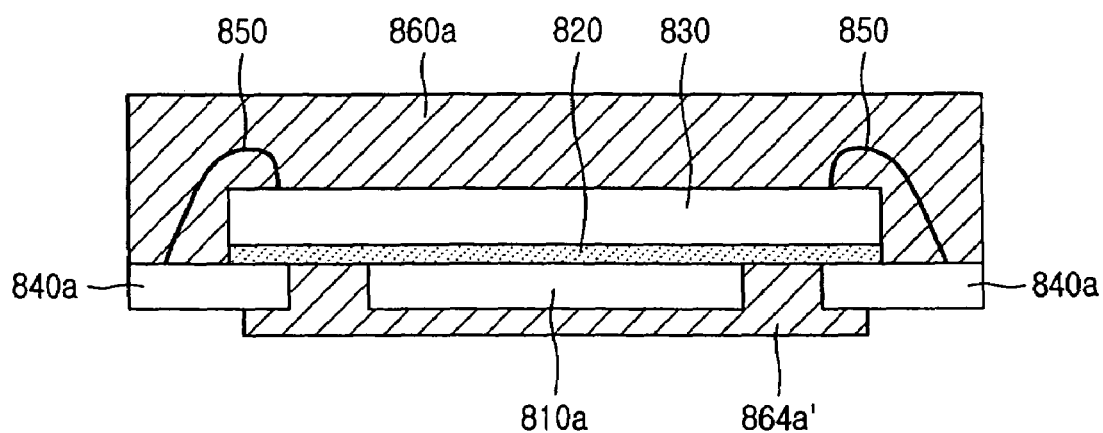
Figure 13F:
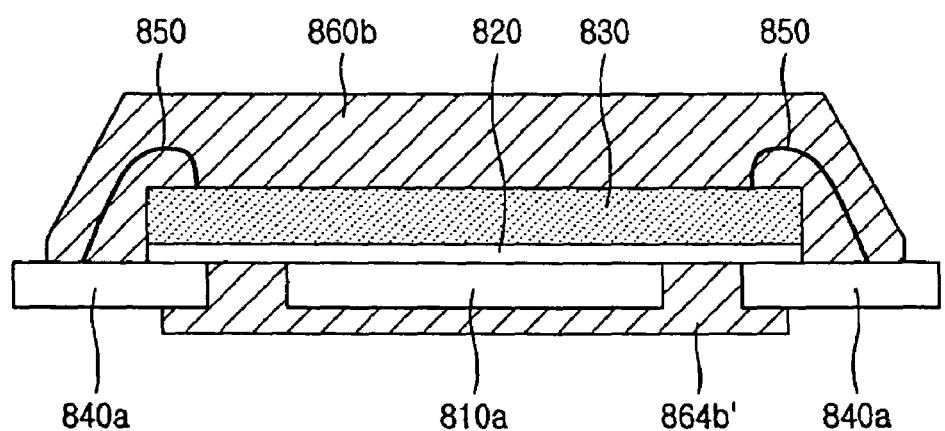
Figure 13G:
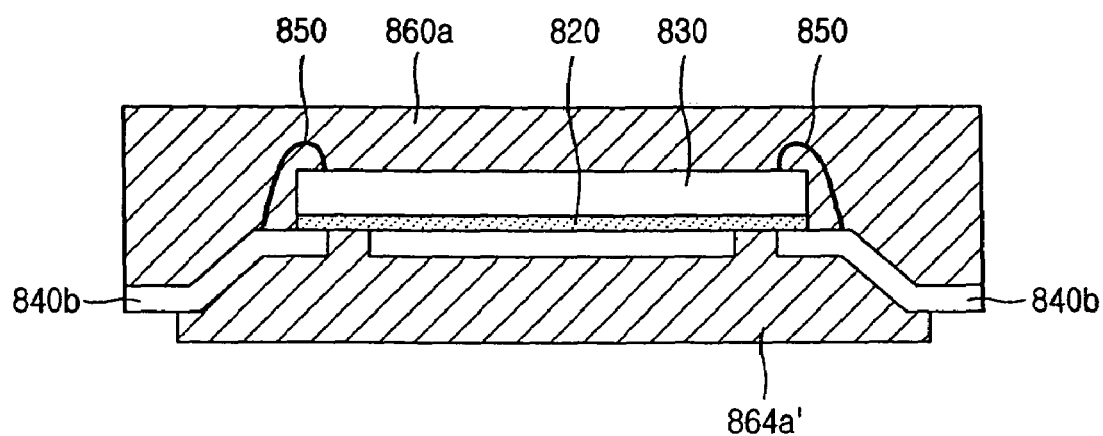
Figure 13H:
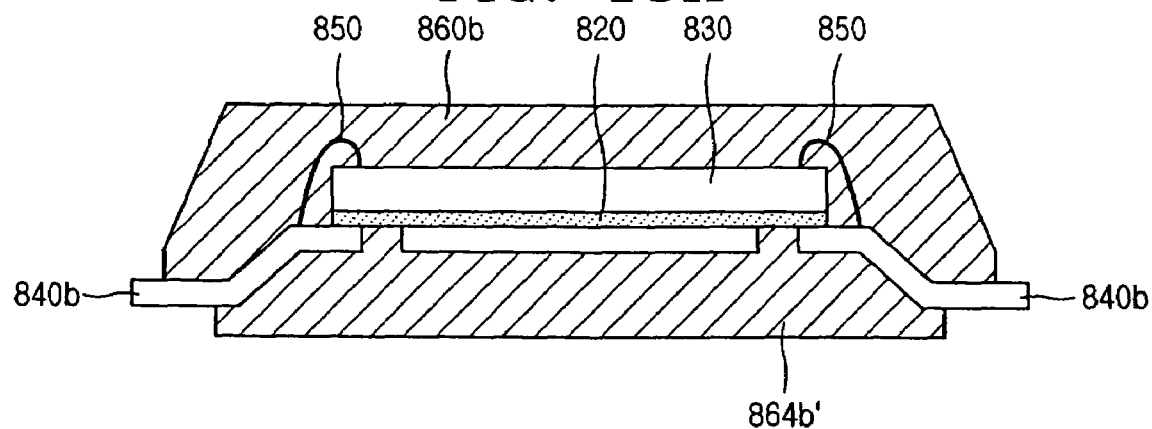

FIGS. 13C and 13D are cross-sectional views illustrating different examples of an MLP having the lead frame of FIG. 12A (i.e., not including heat sink leads). The same reference numerals are used in FIGS. 13C and 13D as were used in FIGS. 13A and 13B, respectively, when referring to corresponding and/or similar elements.

Referring to FIGS. 13C and 13D, the MLPs of the present embodiment are different from the MLPs of FIGS. 13A and 13B in that signal leads 840b are formed and/or bent. In detail, the signal leads 840b of the MLPs of the present embodiment are formed using a stamping process and are thus bent. As a result, the signal leads 840b are different from the signal leads 840a that are formed using an etching process and are thus flat. A step difference between an exposed surface of the lead frame pad 810a and a lower surface of the protrusion 864a/864b of the molding material 860a/860b is thus relatively larger than in the case of the MLPs of FIGS. 13A and 13B.

FIGS. 13E, 13F, 13G, and 13H are cross-sectional views illustrating different examples of an MLP having the lead frame of FIG. 12A (i.e., not including heat sink leads). The same reference numerals are used in FIGS. 13E, 13F, 13G, and 13H as were used in FIG. 13A, 13B, 13C, and 13D when referring to corresponding and/or similar elements.

Referring now to FIGS. 13E, 13F, 13G, and 13H, the MLPs of the present embodiments are different from the MLPs of the previous embodiments in that the lower surface of the lead frame pad 810a is fully covered with a protrusion 864a'/864b' of the molding material 860a/860b.

Figure 14A:
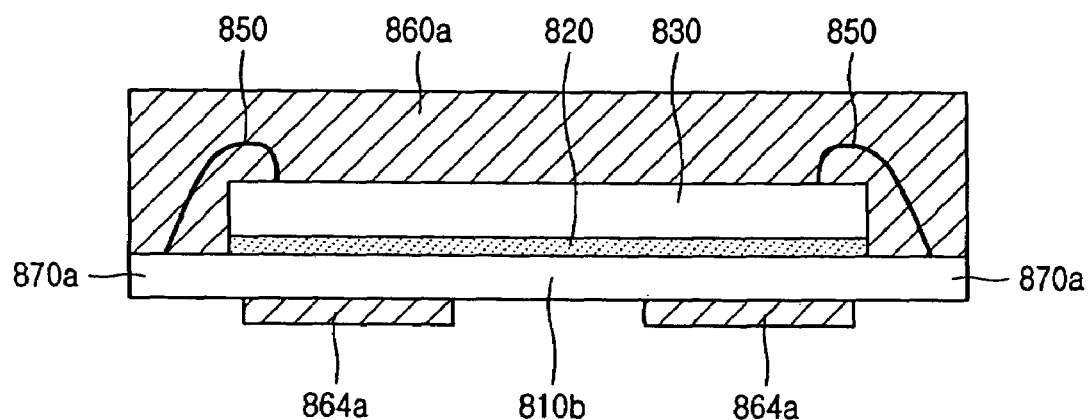
FIGS. 14A through 14F are cross-sectional views for illustrating examples of an MLP adopting the lead frame of FIG. 12B including heat sink leads.
Figure 14B:
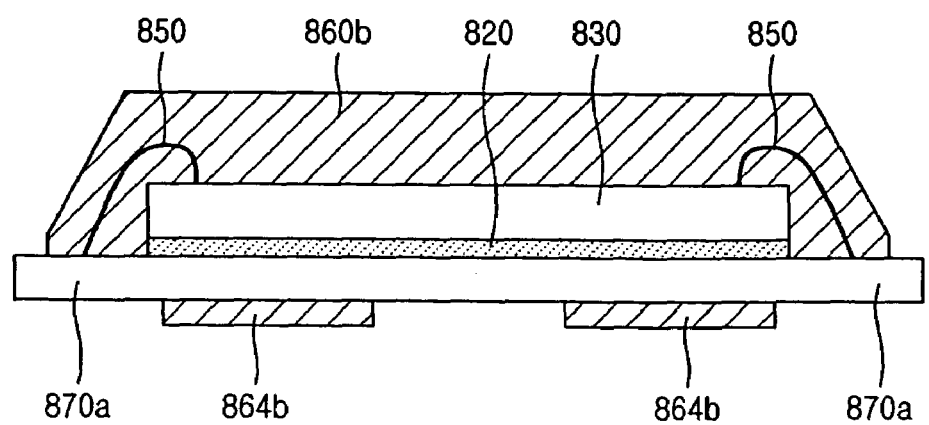

FIGS. 14A and 14B are cross-sectional views illustrating examples of an MLP having the lead frame of FIG. 12B (i.e., including one or more heat sink leads) taken along a vertical direction of the plan view of FIG. 12B. Cross-sectional views taken along a horizontal direction of the plan view of FIG. 12B are the same as those of FIGS. 13A and 13B, although wires 850 do not contact heatsink 870a but instead contact leads 840 which are hidden in this view. The same reference numerals are used in FIGS. 14A and 14B to refer to corresponding and/or similar elements.

Referring to FIG. 14A, the semiconductor chip 830 is adhered to the upper surface of the lead frame pad 810b by solder 820. The semiconductor chip 830 is also adhered by solder 820 to a portion of the surface of heat sink lead 870a. The semiconductor chip 830, a portion of each of upper and lower surfaces of the heat sink lead 870a, and a portion of the lower surface of the lead frame pad 810a are covered with the molding material 860a. However, a side of the heat sink lead 870a, a portion of the lower surface of the heat sink lead 870a, and a portion of the lower surface of the lead frame pad 810a are exposed to the outside of the molding material 860a. In particular, the molding material 860a includes a protrusion 864a extending below the heat sink lead 870a and the lower surface of the lead frame pad 810a. As a result, the lower surface of the protrusion 864a has a step difference, i.e., is spaced a predetermined distance, from the heat sink lead 870a and the lower surface of the lead frame pad 810a. The molding material 860a of the MLP is formed for a sawing type package singulation method using a sawing means such as a blade, and thus a side of the molding material 860a is generally vertical. In this case, ends of the heat sink lead 870a do not protrude from the molding material 860a.

Referring to FIG. 14B, in the MLP of the present embodiment, the molding material 860b is formed for a punched type package singulation method, and thus a side of the molding material 860b is slanted. The remaining elements of the MLP of the present embodiment are substantially similar to those of the MLP of FIG. 14A and thus the detailed description thereof is not repeated.

Figure 14C:
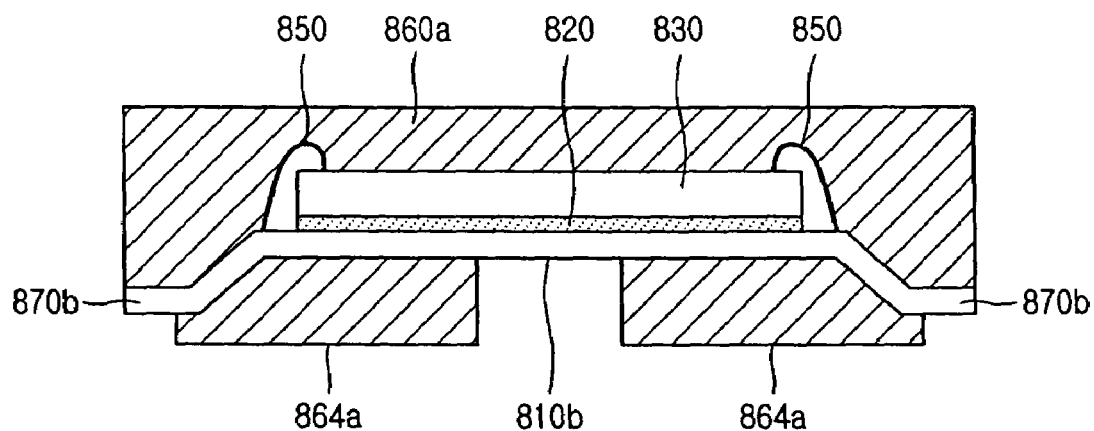
Figure 14D:
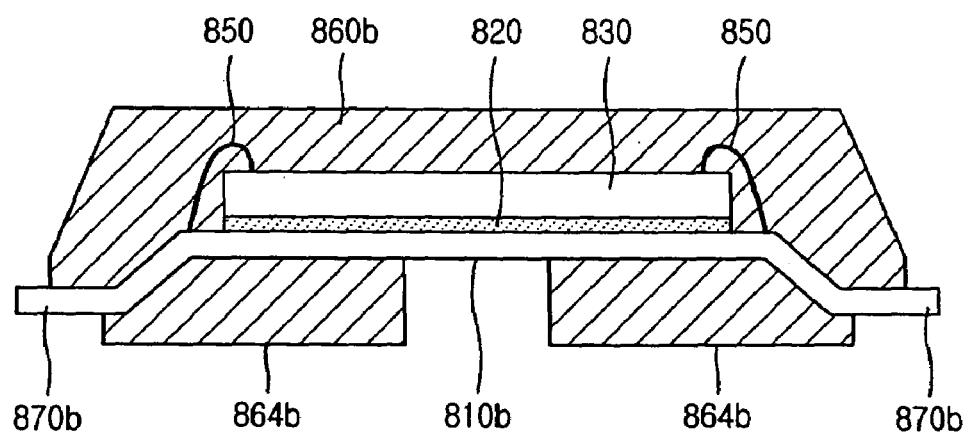

FIGS. 14C and 14D are cross-sectional views illustrating different examples of an MLP having the lead frame of FIG. 12B (i.e., including a heat sink lead) taken along a vertical direction of the plan view of FIG. 12B. Cross-sectional views taken along a horizontal direction of the plan view of FIG. 12B are the same as those of FIGS. 13C and 13D, although wires 850 do not contact heatsink 870b but instead contact leads 840 which are hidden in this view. The same reference numerals are used in FIGS. 14C and 14D when referring to elements that correspond and/or are similar to the elements in FIGS. 14A and 14B.

Referring to FIGS. 14C and 14D, the MLPs of the present embodiments are different from the MLPs of FIGS. 14A and 14B in that a heat sink lead 870b is formed and/or bent. In detail, the heat sink lead 870b of each of the MLPs of the present embodiments is formed, such as, for example, by a stamping process, and is thus bent. The heat sink lead 870b is different from the heat sink lead 870a, which is formed using an etching process and is thus flat. As a result, a step difference between an exposed surface of the lead frame pad 810b and the lower surface of the protrusion 864a/864b of the molding material 860a/860b is relatively larger or greater than in the case of each of the MLPs of FIGS. 14A and 14B.

Figure 14E:
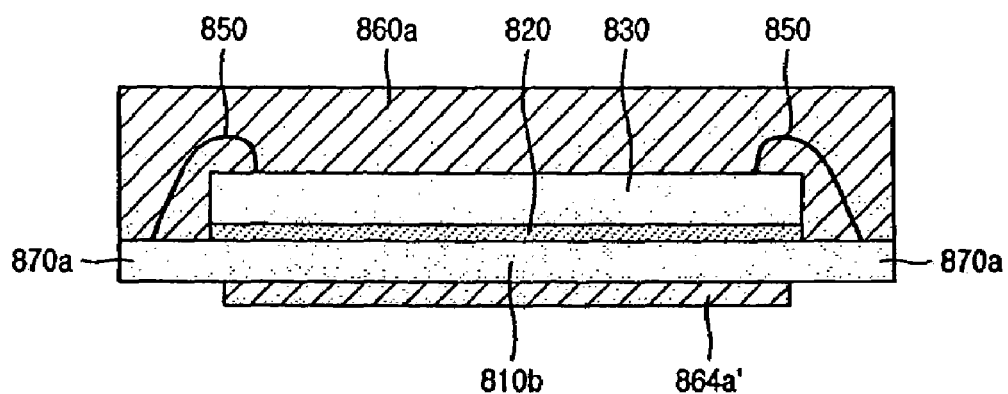
Figure 14F:
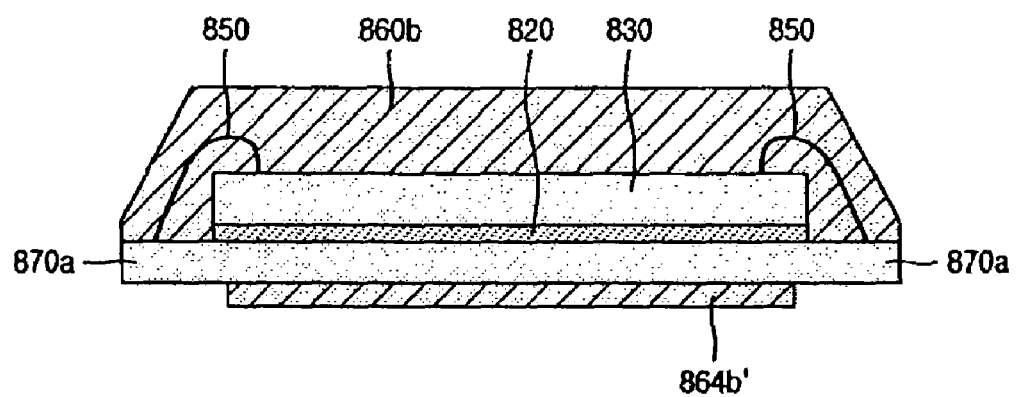

FIGS. 14E and 14F are cross-sectional views illustrating different examples of an MLP having the lead frame of FIG. 12B (i.e., without a heat sink lead). The same reference numerals used in FIGS. 13A and 13B are also used in FIGS. 14E and 14F to refer to similar and/or corresponding elements.

Referring to FIGS. 14E and 14F, the MLPs of the present embodiments are different from the MLPs of the previous embodiments in that a lower surface of the lead frame pad 810b is fully covered with the protrusion 864a'/864b' of the molding material 860a/860b. The remaining elements of the MLPs of the present embodiments are substantially similar to those of the MLPs of the previous embodiments and thus the detailed description thereof is not repeated.

In the embodiments of the MLP described above in regard to FIGS. 14E and 14F, a portion of a first surface of the lead frame pad is exposed by the molding material. Here, a surface of the molding material covering the first surface of the lead frame pad has a step difference from the first surface of the lead frame pad. Thus, the amount, area and/or length of the lead frame that is exposed can be adjusted to a desired amount to thereby reduce thermal stress and enhance the reliability of the MLP. Further, a hygroscopic path extends by a length corresponding to the step difference. Moreover, even when the exposed surface of the lead frame pad is disposed opposite to leads, a distance between the lead frame pad and the leads can be reduced. Thus, the thickness of the lead frame pad can be increased. Grooves disposed on the surface of the lead frame pad contribute to further extending the hygroscopic path and increasing an adhesive strength of the molding material to the lead frame pad.

A sawing type MLP which can be prevented from short-circuiting with circuit lines on a system board and a method of manufacturing the sawing type MLP will now be described.

Figure 17A:
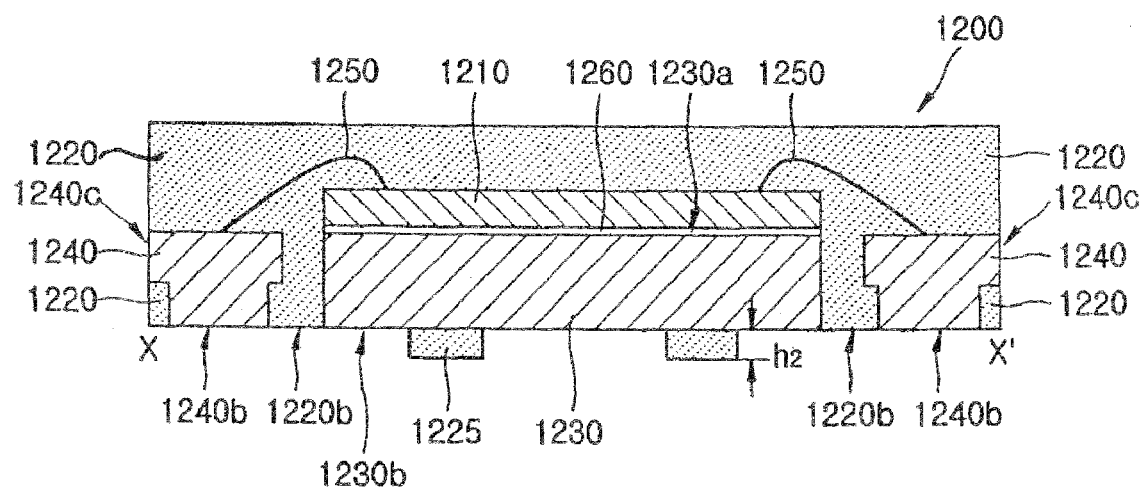
FIGS. 17A and 17B are cross-sectional views illustrating examples of an MLP according to an embodiment of the present invention.
Figure 17B:
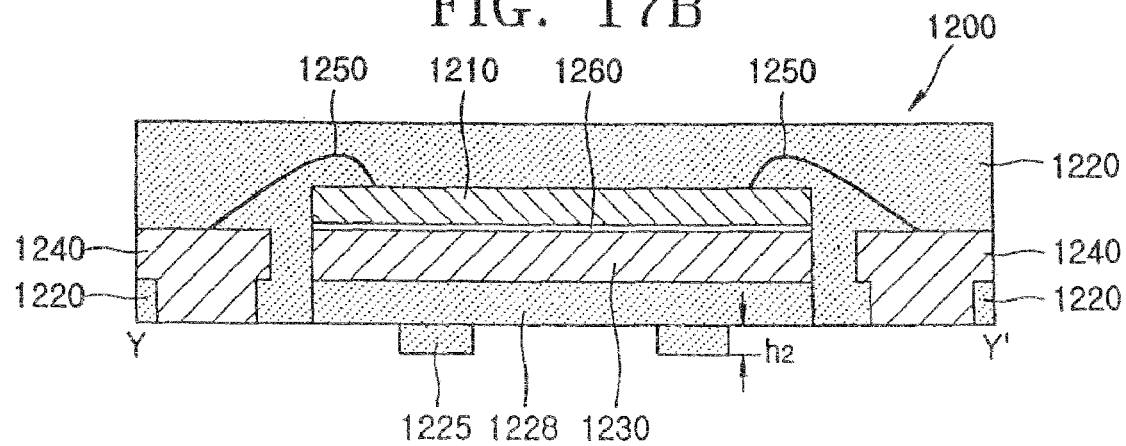
Figure 18A:
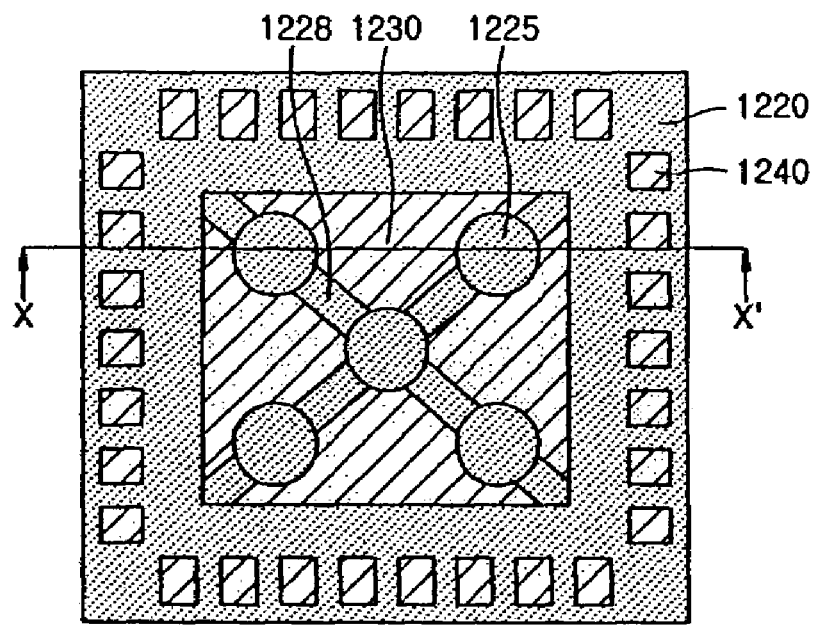
FIGS. 18A and 18B are bottom views of the MLP of FIGS. 17A and 17B.
Figure 18B:
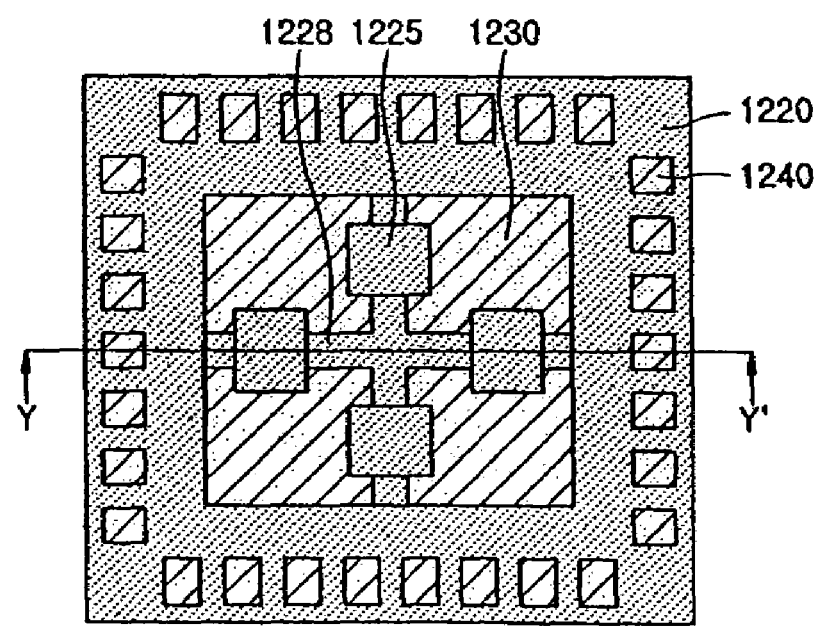

FIGS. 17A and 17B are cross-sectional views illustrating exemplary embodiments of an MLP according to the present invention, and FIGS. 18A and 18B are bottom views of the MLP of FIGS. 17A and 17B. Here, the cross-sectional view of FIG. 17A is taken along line X-X' of FIG. 18A, and the cross-sectional view of FIG. 17B is taken along line Y-Y' of FIG. 18B.

Referring now to FIGS. 17A and 17B, a sawing type MLP 1200 includes a semiconductor chip 1210, a die pad 1230, wires 1250, a package body 1220, and short-circuit preventing members 1225.

Die pad 1230 includes upper and lower surfaces 1230a and 1230b that are opposite to each other. A lower edge of the die pad 1230 is optionally recessed to a predetermined depth by etching. As shown in FIGS. 22A through 22D, die pad 1530 is not recessed and thus has upper and lower portions with the same width. In other words, the present embodiment is not confined to the structure of the die pad 1230 disclosed in U.S. Pat. No. 6,437,429.

Also, the semiconductor chip 1210 is adhered to an upper surface 1230a of the die pad 1230 by an insulating adhesive 1260, such as, for example, an epoxy adhesive, solder, or the like. The insulating adhesive 1260 may be any kind of insulating adhesive.

A plurality of leads 1240 are disposed around the die pad 1230, making predetermined gaps. Bottoms 1240b of the leads 1240 are formed on the same plane as, i.e., are substantially coplanar with, a lower surface 1230b of the die pad 1230. Like the die pad 1230, edges of the leads 1240 are optionally recessed to a predetermined depth using etching. The leads 1240 are electrically coupled to the semiconductor chip 1210 by wires 1250 made of a metallic electrically conductive material, such as, for example, gold or the like.

The package body 1220 is formed of an epoxy molding compound (EMC) or the like. A bottom of the package body 1220 is on the same plane as, i.e., is substantially coplanar with, the bottoms 1240b of the leads 1240 and the lower surface 1230b of the die pad 1230 so that at least the bottoms 1240b of the leads 1240 and the lower surface 1230b of the die pad 1230 are exposed. Also, the package body 1220 fills the predetermined gaps and covers the die pad 1230, the semiconductor chip 1210, the leads 1240, and the wires 1250.

Figure 15A:
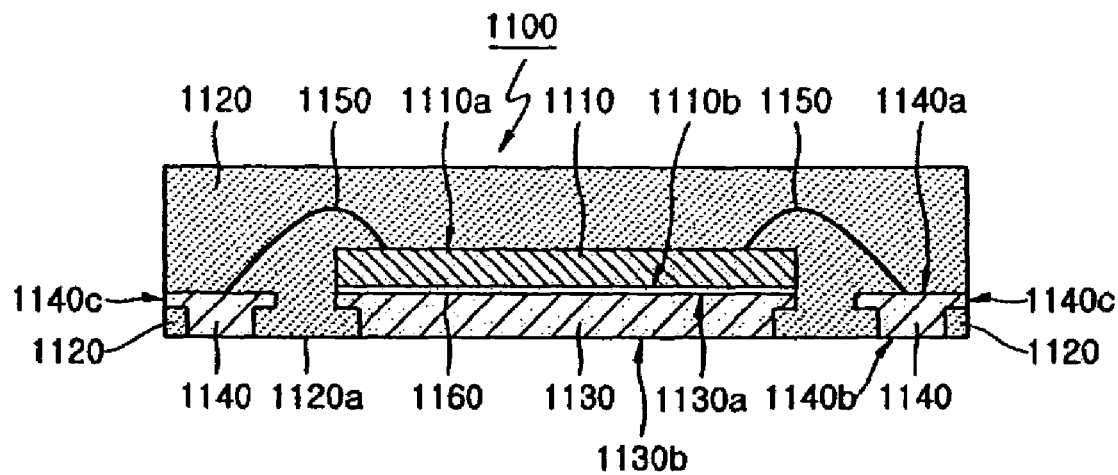
FIG. 15A is a cross-sectional view illustrating an example of a conventional MLP.
Figure 15B:
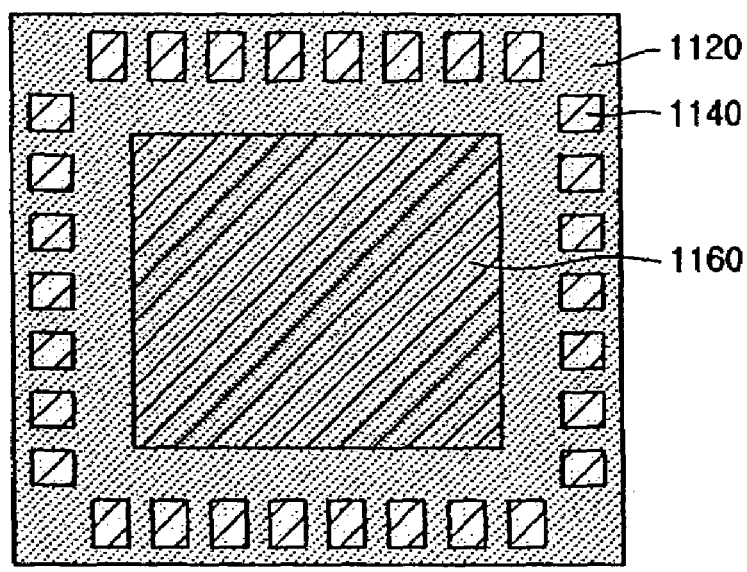
FIG. 15B is a bottom view of the conventional MLP of FIG. 15A.

The above-described sawing type MLP 1200 of the present embodiment may have the same structure as the sawing type MLP 1100 shown in FIG. 15A. However, the sawing type MLP 1200 of the present embodiment has the following characteristics.

According to the present embodiment, one or more short-circuit preventing members 1225, such as, for example, posts or studs, are formed on the lower surface 1230b of the die pad 1230. The posts 1225 are formed of the same material as the package body 1220 or any other suitable (non-electrically conducting) material. If a plurality of posts 1225 is formed, the posts 1225 are preferably symmetrical with respect to the center of the die pad 1230 to prevent tilting of the sawing type MLP 1200. FIGS. 18A and 18B are bottom views of the sawing type MLP 1200 and illustrate examples of the arrangement of the posts 1225.

Figure 16:
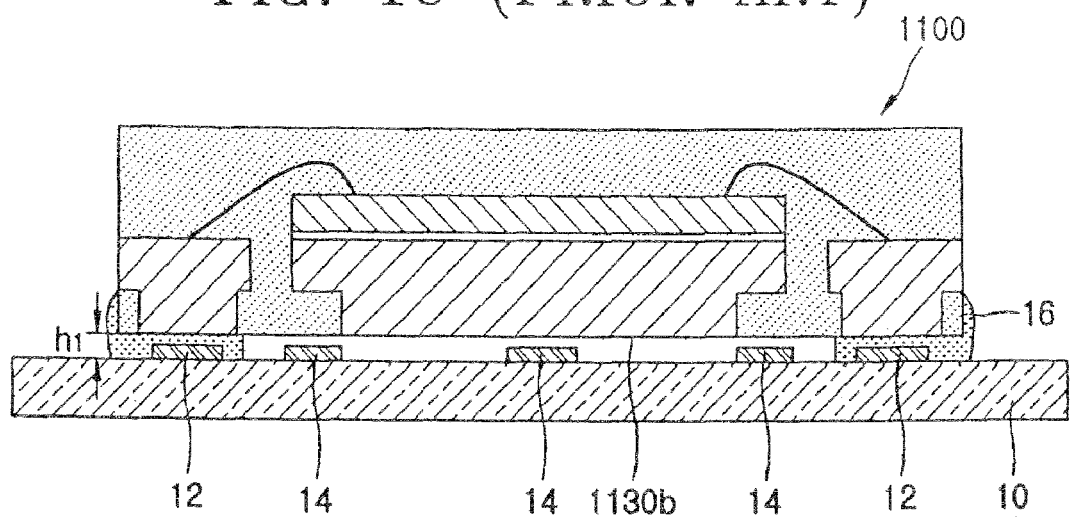
FIG. 16 is a schematic cross-sectional view of a system package in which the MLP of FIG. 15A is mounted on a system board.

As shown in FIGS. 17A and 17B, the posts 1225 preferably have a predetermined minimum height $h_2$ to ensure the die pad 1230 and the circuit lines 14 of FIG. 16 on the system board do not contact each other and/or short-circuit. The posts 1225 also, by having the predetermined minimum height $h_2$, improve the reliability of the solder joint 16 (FIG. 16) that joins leads 1240 and coupling pads 12 of the system board. Considering two functions of the posts 1225 and a manufacturing process of the sawing type MLP 1200 of the present embodiment, the predetermined height $h_2$ of the posts 1225 is preferably between 30 μm and 130 μm.

Moreover, as shown in FIGS. 18A and 18B, a channel (1232 of FIG. 23A) having predetermined width and depth is optionally formed on the lower surface 1230b of die pad 1230. The channel serves as a path through which a material used for the package body 1220 can be provided to the posts 1225, i.e., a runner of an EMC molding process. The channel is not an indispensable element but is optionally used dependent upon the manufacturing process to be employed. The channel serving as the runner penetrates through gaps between the die pad 1230 and the leads 1240 and through an area of the lower surface 1230b of the die pad 1230 in which the posts 1225 are disposed. However, the shape of the channel is not confined to the shape illustrated in FIGS. 18A and 18B. In general, the channel is filled with the material used for the package body 1220 to form a channel filler 1228.

Figure 23C:
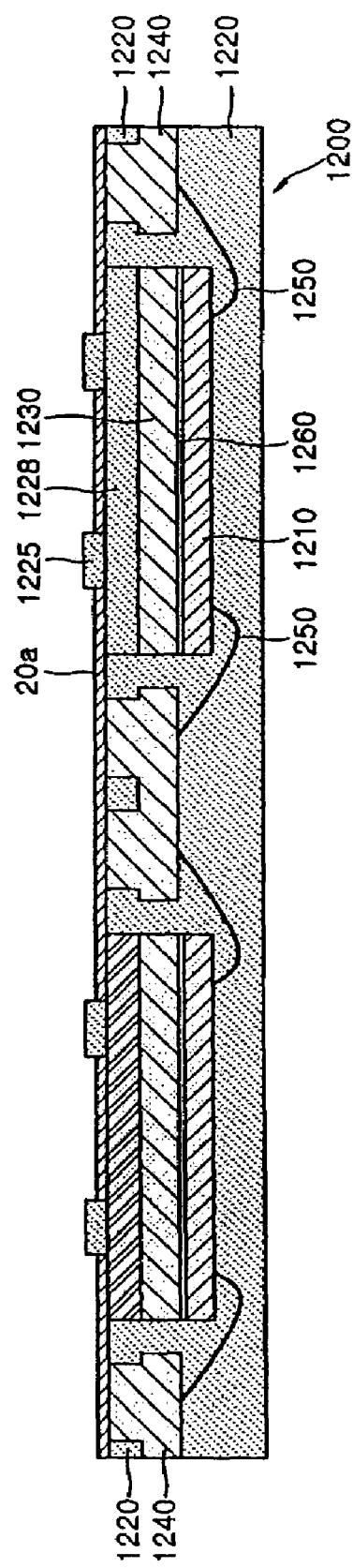

FIGS. 23A through 23E are cross-sectional views illustrating one embodiment of a method for manufacturing the MLP 1200 shown in FIGS. 17A and 17B. Referring now to FIG. 23A, a lead frame block is shown in which a plurality of die pads 1230 and leads 1240 are arrayed. The lead frame block is generally used in a block molding process for manufacturing a sawing type MLP, and is a structure in which the plurality of die pads 1230 and leads 1240 are arrayed in horizontal and vertical directions to be coupled to one another. As previously described, the die pad 1230 has upper and lower surfaces that are opposite to each other. The die pad 1230 also forms gaps with the plurality of leads 1240. Moreover, channel 1232 is patterned on the lower surface of the die pad 1230 to a predetermined depth so as to penetrate through the gaps. The channel 1232 has predetermined width and depth and may be X-shaped as shown in FIG. 18A or a cross-shaped as shown in FIG. 18B.

A cover tape 20 is attached to the bottoms of the leads 1240 and the lower surface of the die pad 1230 and covers the channel 1232. The cover tape 20 prevents molding flash from being generated due to the penetration of molding material, such as an EMC, into an interface between a lower mold die (not shown) and lead frames 1230 and leads 1240 in the molding process. In the block molding process, the cover tape 20 generally covers the entire lead frames 1230 and leads 1240.

Referring to FIG. 23B, the cover tape 20 is patterned to form openings 22 exposing a portion of the channel 1232. The openings 22 are formed in areas of the cover tape 20 corresponding to areas in which the posts 1225 shown in FIG. 18A or 18B are to be formed. The cover tape 20 may be patterned using a laser system or other appropriate methods.

Referring to FIG. 23C, a die adhering process and a wire bonding process are performed using a known semiconductor packaging processes. Generally, the structure of FIG. 23B is turned upside down, a semiconductor chip 1210 is adhered to an upper surface of the die pads 1230. An adhesive 1260, such as solder, is used to adhere the dies 1210 to the die pads 1230. Next, the wire bonding process is performed to couple the semiconductor chips 1210 to the leads 1240.

Thereafter, a molding process is performed using upper and lower mold dies (not shown) used for molding a block lead frame. Here, an EMC may be used as the molding material. The upper mold die has a conventional structure, while the lower mold die has a different structure from a conventional structure. In other words, the present embodiment uses a lower mold die having an inner surface with portions in which dents or recesses are formed to form the posts 1225, the portions corresponding to the openings 22 of a cover tape 20*a*.

The shape and height of the posts 1225 are determined depending on the shape and depth of the dents or recesses formed in the lower mold die. Therefore, the dents or recesses may be circular as shown in FIG. 18A, square as shown in FIG. 18B, or any other desired shape. As previously described, the depth of the dents or recesses is preferably between 30 μm and 130 μm.

Figure 23D:
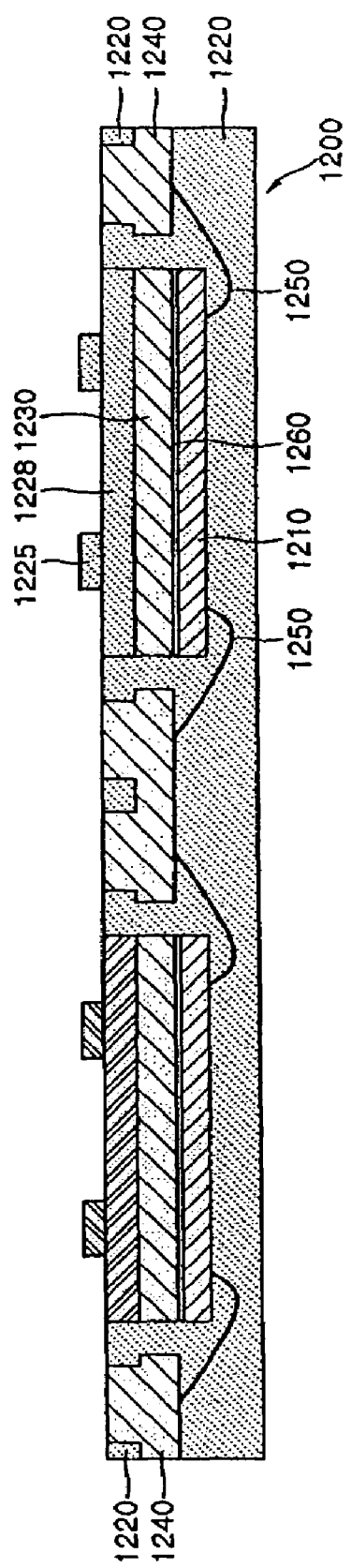

Referring to FIG. 23D, when the molding material is hardened after a predetermined period of time elapses, the upper and lower mold dies are removed, and the cover tape 22*a* is removed. As a result, the package body 1220, the channel filler 1228, and the posts 1225 are formed.

Figure 23E:
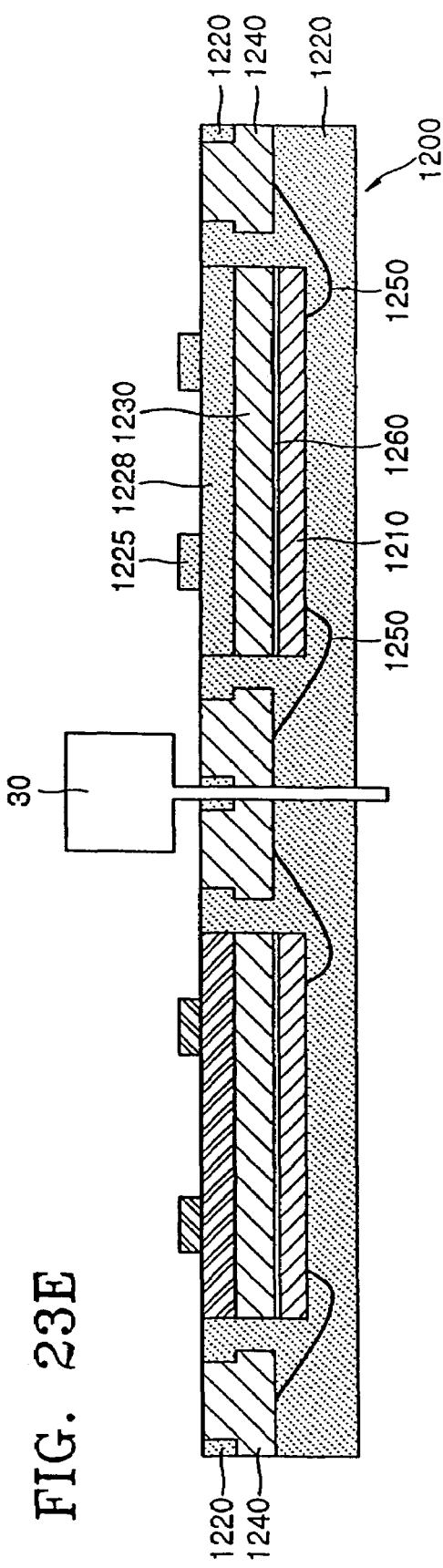

Referring to FIG. 23E, the molded lead frame block is sawed using a blade 30 or the like. As a result, an individual sawing type MLP 1200 as shown in FIG. 17A or 17B is completed.

Figure 19:
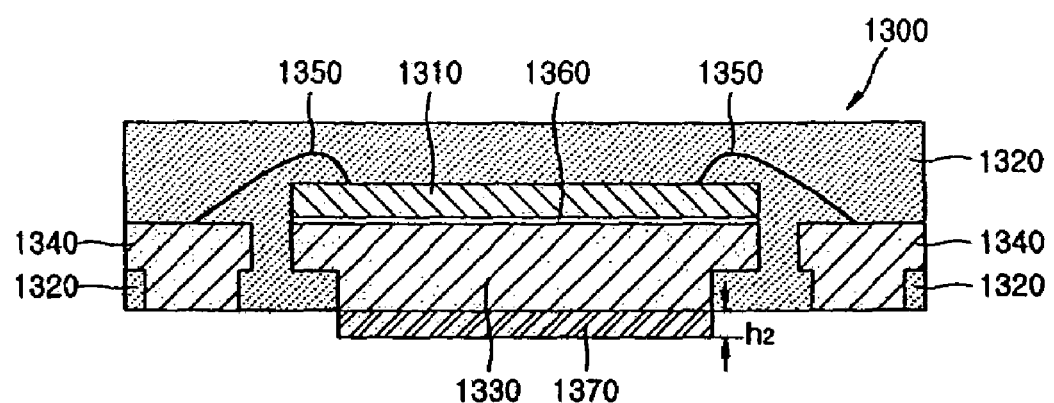
FIG. 19 is a cross-sectional view of an MLP according to another embodiment of the present invention.

FIG. 19 is a cross-sectional view of a sawing type MLP according to another embodiment of the present invention, and FIGS. 20A through 20D illustrate examples of a bottom view of the sawing type MLP of FIG. 19. In FIGS. 19 and 20A through 20D, reference numerals 1310, 1340, 1350, and 1360 denote a semiconductor chip, leads, wires, and an adhesive layer, respectively.

Referring to FIGS. 19 and 20A through 20D, a sawing type MLP 1300 according to the present embodiment has the same structure as the sawing type MLP 1200 except for the shape and/or material of a short-circuit preventing member 1370. Thus, the following description focuses on the different elements/aspects of this embodiment without repeating a detailed discussion of the common and/or similar elements.

In a case of the sawing type MLP 1300 of FIGS. 19 and 20A through 20D, the short-circuit preventing member 1370 is formed on a lower surface of a die pad 1330. In other words, the sawing type MLP 1300 does not have the structure shown in FIGS. 23A and 23B, for example, in which the lower surface of the die pad 1230 is recessed to a predetermined depth to form channel 1232 which is filled with the channel filler 1228 on the same level as the lower surface of the die pad 1230.

Figure 20A:
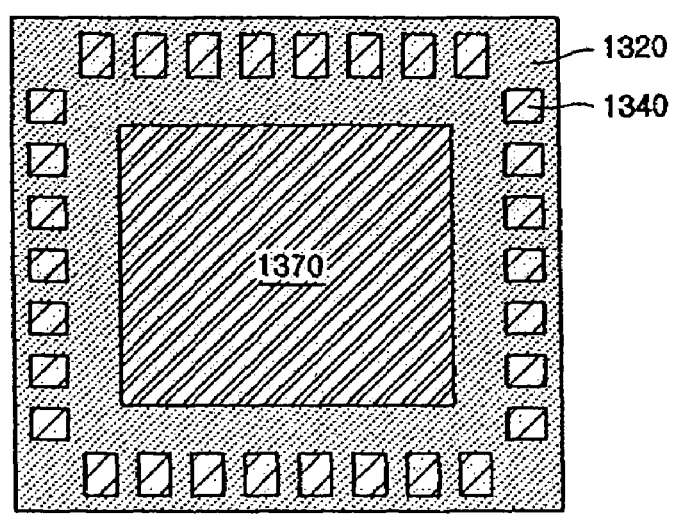
FIGS. 20A through 20D illustrate examples of a bottom view of the MLP of FIG. 19.
Figure 20B:
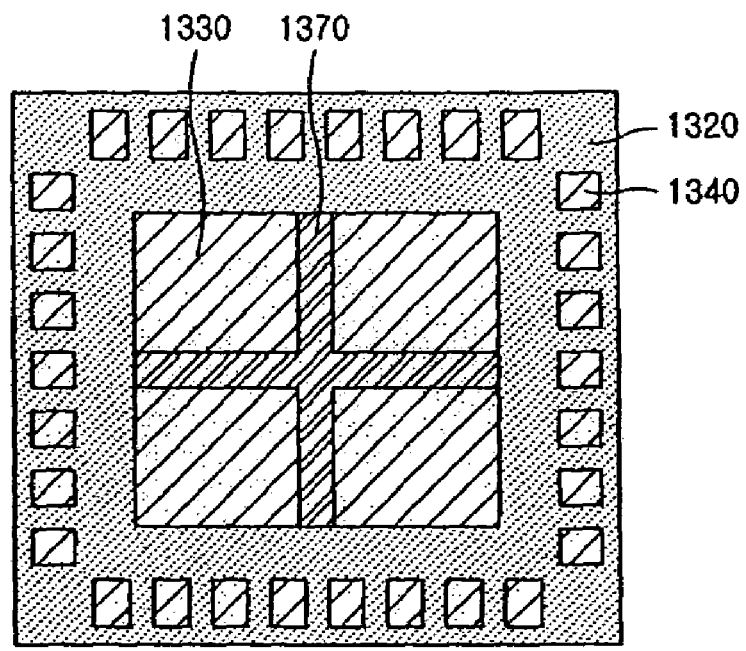
Figure 20C:
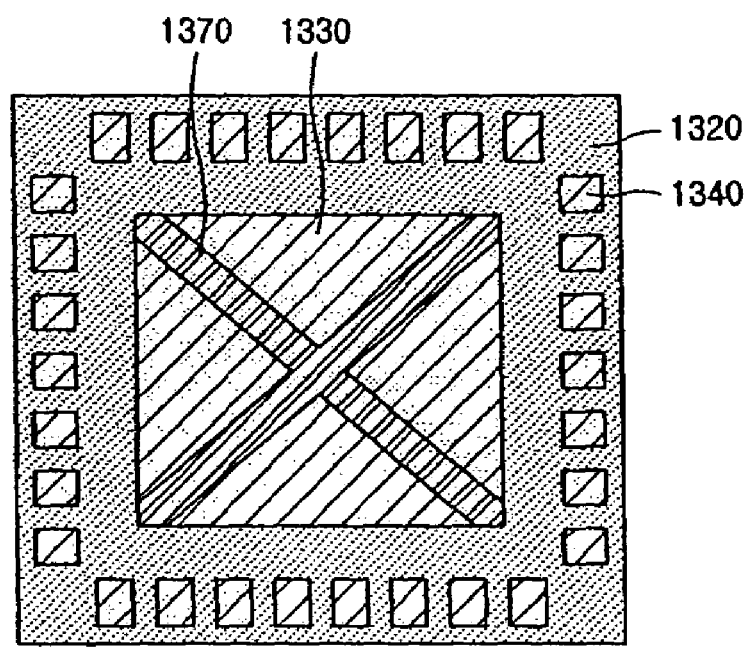
Figure 20D:
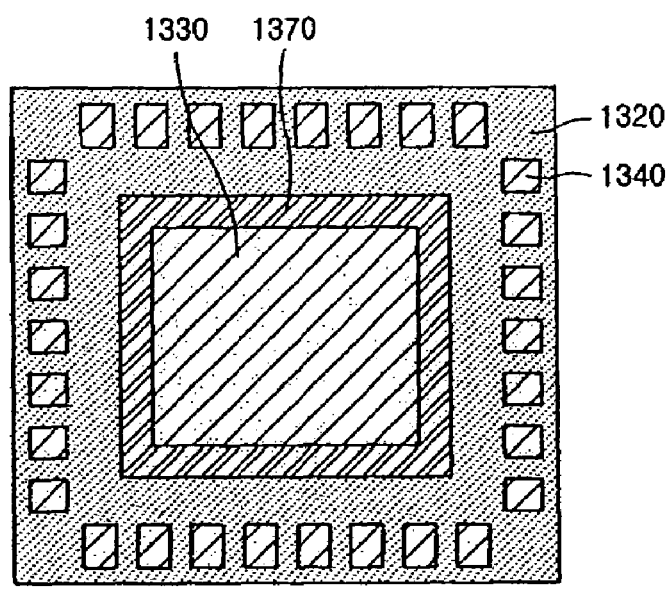

The short-circuit preventing member 1370 may have any shape. The short-circuit preventing member 1370 may cover the entire portion of a second surface of the die pad 1330 (FIG. 20A) or may cover a portion of the second surface of the die pad 1330 as shown in FIGS. 20B through 20D. In the latter case, the short-circuit preventing member 1370 may be cross-shaped as shown in FIG. 20B, X-shaped as shown in FIG. 20C, or square ring-shaped as shown in FIG. 20D. The short-circuit preventing member 1370 may also be island-shaped similar to the posts of the previous embodiment. Whatever the shape of short-circuit preventing member 1370, it is preferably symmetrical with respect to the center of the die pad 1330 as in the previous embodiment to prevent tilting of the MLP. Also, the short-circuit preventing member 1370 preferably has a predetermined height $h_2$, preferably from approximately 30 μm to approximately 130 μm.

Unlike the previous embodiment, the short-circuit preventing member 1370 does not need to be formed of the same material as the package body 1320. This is because the short-circuit preventing member 1370 can be formed using a separate process from the molding process. However, the short-circuit preventing member 1370 is preferably formed of a material having a good insulating characteristic and high value of hardness. Therefore, the short-circuit preventing member 1370 may be formed of the same material as the package body 1320, i.e., an EMC, or another plastic and electrically insulating material.

Figure 24A:
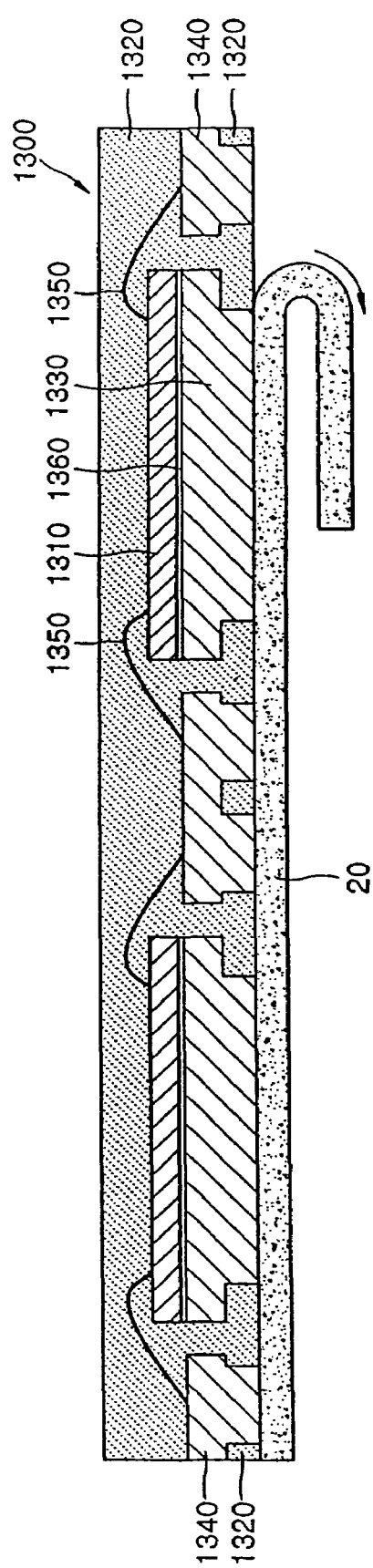
FIGS. 24A through 24C are cross-sectional views illustrating a method of manufacturing the MLP of FIG. 19.
Figure 24B:
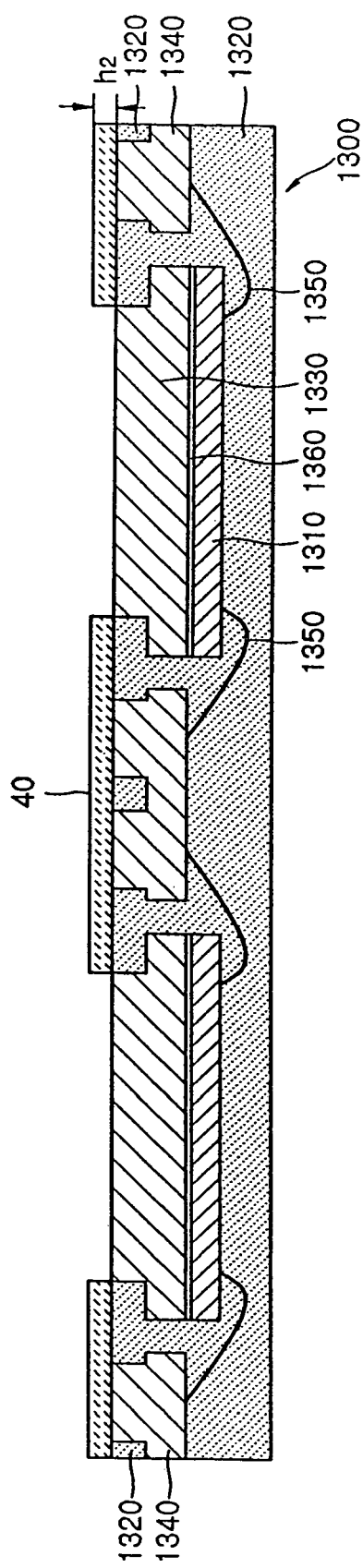
Figure 24C:
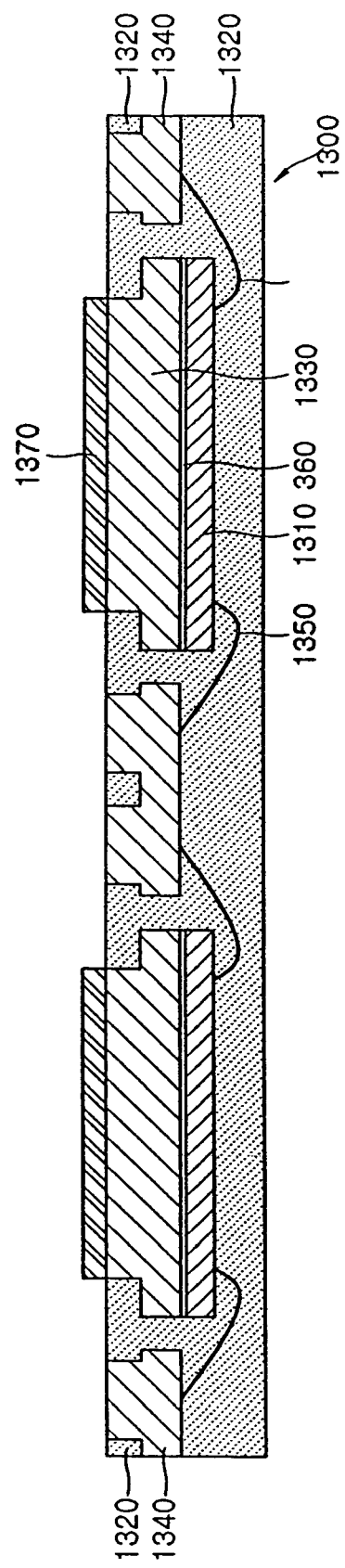

FIGS. 24A through 24C are cross-sectional views illustrating one embodiment of a method of manufacturing the sawing type MLP 1300 of FIG. 19 having short-circuit preventing member 1370 using a screen printing method.

Referring to FIG. 24A, processes from a die adhering process up to a molding process are performed using the method of manufacturing the conventional sawing type MLP 1100. In other words, a cover tape 20 is attached to bottoms of die pad 1330 and leads 1340 according to a method of manufacturing a general block mold package. Then, die adhering, wire bonding, and molding processes are performed. The cover tape 20 is detached from the resultant structure which has undergone the molding process.

Referring to FIG. 24B, a screen printing process is performed using a screen mask 40 with a predetermined pattern. The predetermined pattern of the screen mask 40 varies with the shape of the short-circuit preventing member 1370 to be formed. Also, a height $h_2$ of the screen mask 40 may vary with the height of the short-circuit preventing member 1370 to be formed. In other words, the shape and height of the short-circuit preventing member 1370 is determined depending on the pattern and thickness of the screen mask 40 used in the screen printing process. As a result of the screen printing process, the short-circuit preventing member 1370 with a predetermined shape is formed on the exposed surface of die pad 1330 as shown in FIG. 24C. A singulation or separation process is performed, such as, for example, sawing with a blade, to complete the sawing type MLP 1300 as shown in FIG. 19.

Figure 21:
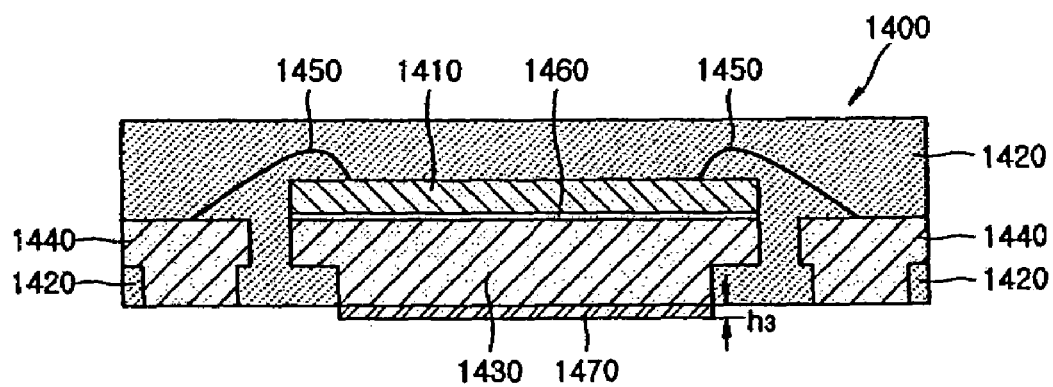
FIG. 21 is a cross-sectional view of an MLP according to still another embodiment of the present invention.

FIG. 21 is a cross-sectional view of a sawing type MLP, according to still another embodiment of the present invention. Here, reference numerals 1410, 1440, 1450, and 1460 denote a semiconductor chip, leads, wires, and an adhesive layer, respectively.

Referring now to FIG. 21, a sawing type MLP 1400 according to the present embodiment has the same general structure as the sawing type MLP 1200 of the previous embodiment except for the shape and/or material of a short-circuit preventing member 1470. More particularly, similar to the previous embodiment, sawing type MLP 1400 of the present embodiment includes short-circuit preventing member 1470 on a lower surface of die pad 1430. In other words, the sawing type MLP 1400 according to the present embodiment does not have the structure in which the lower surface of the die pad 1230 is recessed to a predetermined depth to form the channel which is filled with a material such as the channel filler 1228 on the same level as the lower surface of the die pad 1230.

Further, the short-circuit preventing member 1470 of the embodiment of FIG. 21 may take virtually any desired shape. However, the short-circuit preventing member 1470 preferably has a shape covering the entire portion of a second surface of the die pad 1430 in terms of its manufacturing characteristics as shown in FIG. 20A. Also, unlike the previous embodiment, the short-circuit preventing member 1470 does not need to be formed of the same material as a package body 1420 since the short-circuit preventing member 1470 is formed using a separate process from the process used to mold/form package body 1420.

FIG. 25 is a cross-sectional view illustrating one embodiment of a method for manufacturing the sawing type MLP 1400 of FIG. 21. Referring now to FIG. 25, processes from a molding process to a cover tape detaching process are performed using the method of manufacturing the conventional sawing type MLP 1100. In other words, a cover tape (not shown) is attached to the bottoms of die pad 1430 and leads 1440 according to the method of manufacturing the general block mold package. Then, die adhering, wire bonding, and molding processes are performed. The cover tape is then removed from the resultant structure which has undergone the molding process.

The short-circuit preventing member 1470 of FIG. 25 is formed using a plating process. Since the short-circuit preventing member 1470 must be formed of an insulating material, i.e., an electrically non-conductive material, the plating process used in the present embodiment is also performed using a non-conductive material. For example, the black oxide pattern 1470 is formed on the exposed or lower surface of the die pad 1430 by a plating process using a non-conductive material such as a black oxide. A mask pattern 50 as shown in FIG. 25 may be used in the plating process to define the shape of the black oxide pattern 1470. Here, the mask pattern 50 may a cover tape that is patterned using a laser or the like. After the black oxide pattern 1470 is formed, a sawing process is performed to individualize the sawing type MLP 1400.

Referring again to FIG. 21, the short-circuit preventing member 1470 formed by the plating process using the non-conductive material has excellent insulating characteristics. Further, the short-circuit preventing member 1470 is formed using a relatively simple process. However, the maximum height $h_3$ of the short-circuit preventing member 1470 is limited, i.e., to approximately 2 μm, due to the properties of the plating process using the non-conductive material. Thus, it is preferable that short-circuit preventing member 1470 covers the entire lower surface of the die pad 1430.

FIGS. 22A through 22D are cross-sectional views illustrating exemplary configurations of sawing type MLPs of the present invention. Here, in the sawing type MLPs shown in FIGS. 22A and 22B, a die pad 1530 and edges of leads 1540a are not half-etched as disclosed in U.S. Pat. No. 6,143,981. In sawing type MLPs shown in FIGS. 22C and 22D, the die pad 1530 and edges of leads 1540b are half-etched as disclosed in U.S. Pat. No. 6,437,429. In FIGS. 22A through 22D, reference numerals 1510 and 1560 denote a semiconductor chip and an adhesive layer, respectively. In other words, the present invention can be applied regardless of whether edges of lead frames 1530 and 1540 are half-etched. This can be applied to the previous embodiments.

Referring to FIGS. 22A through 22D, sawing type MLPs 1500a through 1500d according to the present embodiment have the same structure as the sawing type MLP 1200 according to the previous embodiment except for the shapes of short-circuit preventing members 1525a and 1525b. Thus, the description of the same or similar elements will not be repeated.

As in the previous embodiment, in the sawing type MLPs 1500a through 1500d, the short-circuit preventing members 1525a and 1525b are formed on the lower/exposed surface of the die pad 1530. In other words, unlike the previous embodiment, the sawing type MLPs 1500a through 1500d do not have a structure in which the lower surface of the die pad 1530 is recessed to a predetermined depth to form a channel which is filled with the channel filler 1228 on the same level as the lower surface of the die pad 1530. However, as in the previous embodiment, the short-circuit preventing members 1525a and 1525b according to the present embodiment are formed of the same material as package body 1520. This is because the short-circuit preventing members 1525a and 1525b can be formed together with the package body 1520 in a single molding process as in the previous embodiment.

Figure 22A:
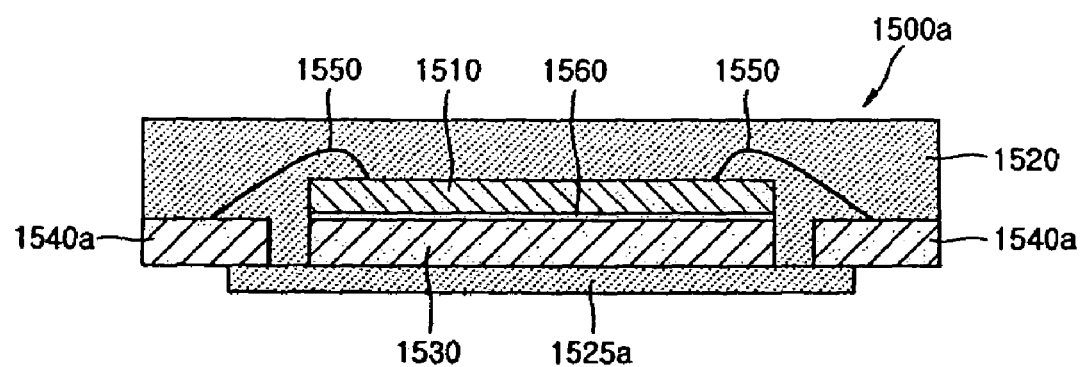
FIGS. 22A through 22D are cross-sectional views illustrating examples of an MLP according to yet another embodiment of the present invention.
Figure 22B:
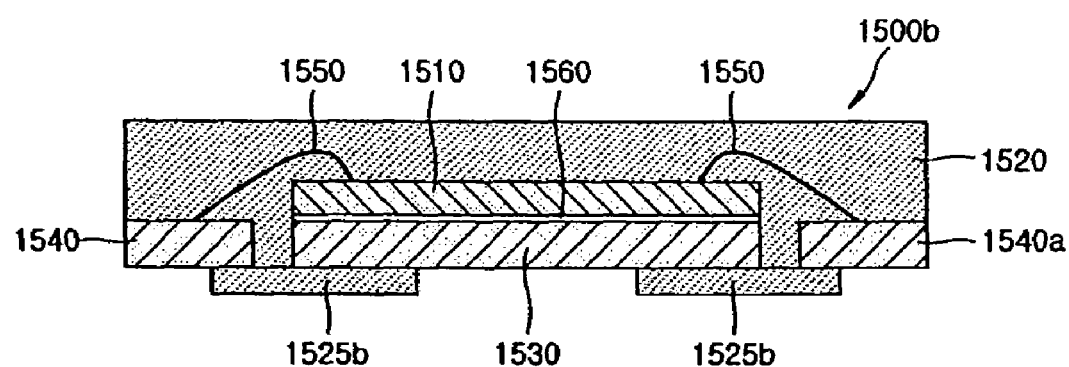
Figure 22C:
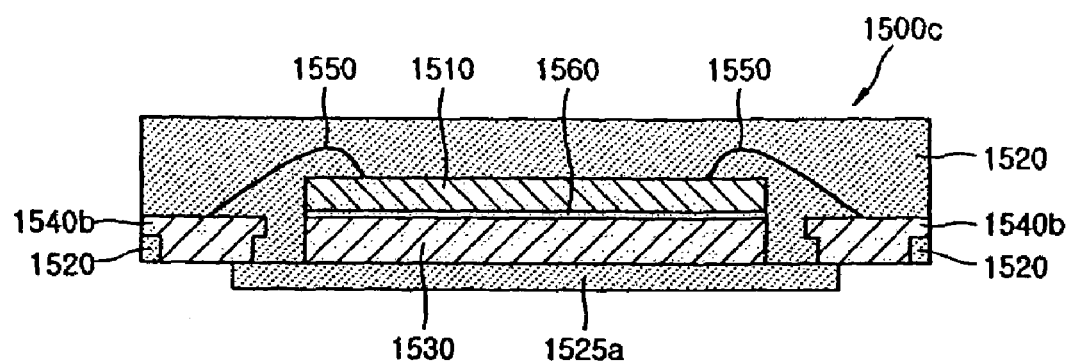
Figure 22D:
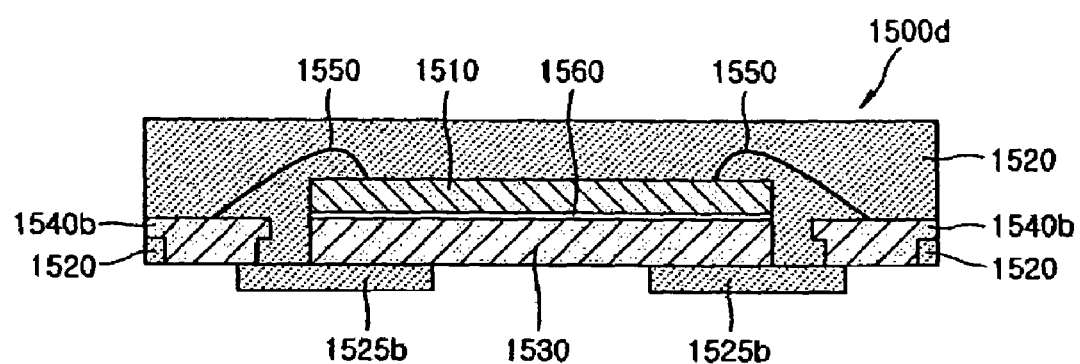

Also, the short-circuit preventing members 1525a and 1525b may have virtually any desired shape. In other words, the short-circuit preventing members 1525a and 1525b may cover the entire lower surface of the die pad 1530 as shown in FIGS. 22A and 22C or a portion of the lower surface of the die pad 1530 as shown in FIGS. 22B and 22D. However, according to the present embodiment, since a path for a molding material, i.e., a channel, is not formed at the die pad 1530, the short-circuit preventing members 1525a and 1525b are at least coupled to portions of the package body 1520 filling gaps between the die pad 1530 and leads 1540a and 1540b.

Figure 26B:
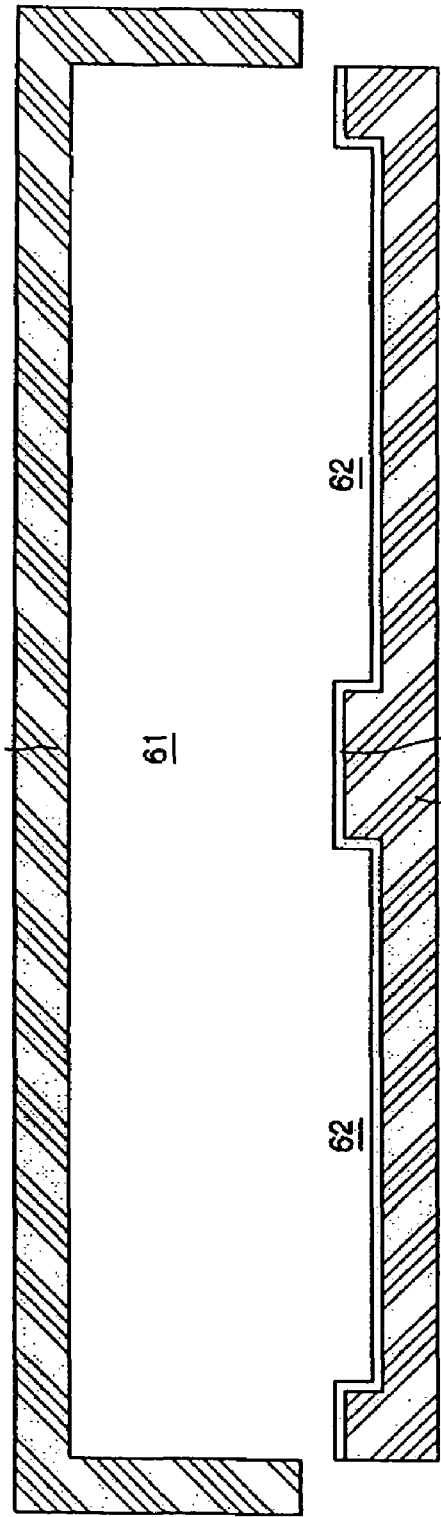
Figure 26C:
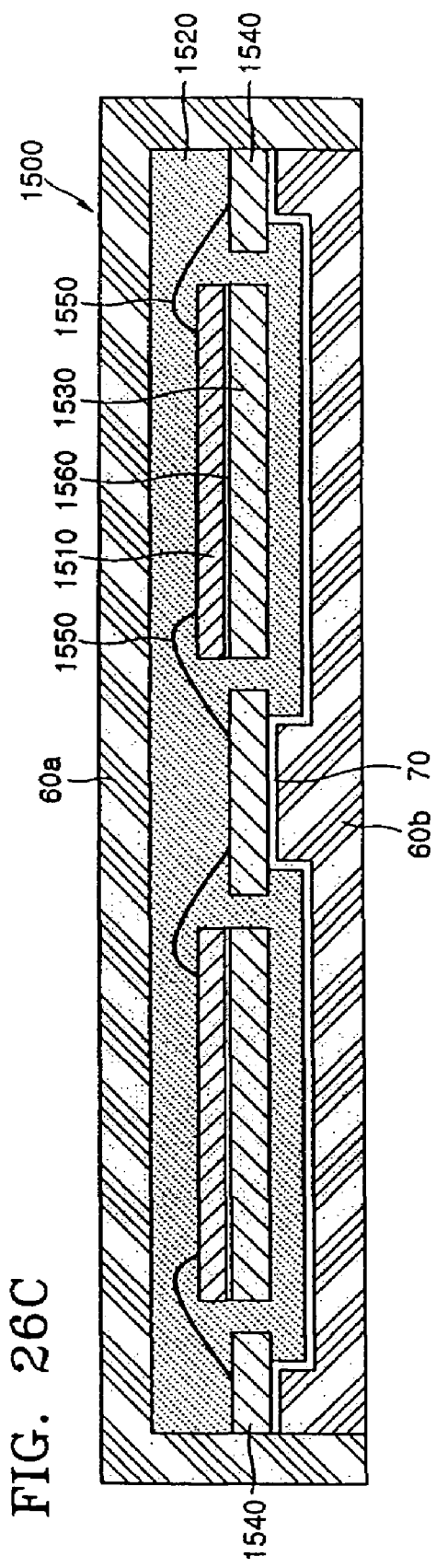

FIGS. 26A through 26C are cross-sectional views illustrating one embodiment of a method of manufacturing the sawing type MLP 1500 shown in FIGS. 22A through 22D. Referring now to FIG. 26A, the semiconductor chip 1510 is adhered to an upper surface of the die pad 1530 using a conventional semiconductor package process. Next, a process of bonding the wires 1550 is performed to electrically couple the semiconductor chip 1510 to the leads 1540. However, in the present embodiment, a process of attaching cover tape (not shown) to prevent mold flash from being generated to lower surfaces of the lead frames 1530 and 1540 is not performed before die adhering and wire bonding processes are performed.

Referring to FIG. 26B, a pair of upper and lower mold dies 60a and 60b are prepared to be used in a molding process separately from the general semiconductor package process illustrated in FIG. 26A. According to the present embodiment, the upper mold die 60a has a shape 61 substantially identical to that of a conventional mold die. However, the lower mold die 60b has a structure that is somewhat different from a conventional mold die. More particularly, dents or recesses 62 with a predetermined pattern are formed in the lower mold die 60b. The dents 62 are necessary for forming short-circuit preventing members 1525 (FIG. 22A, 22C). Thus, the predetermined pattern and/or shape of the dents 62 varies with the desired shape of short-circuit preventing members 1525. Also, according to the present embodiment, a cover tape 70 preventing mold flash from being generated is attached to an inner surface of the lower mold die 60b.

Referring to FIG. 26C, a molding process is performed using the semiconductor package shown in FIG. 26A and the upper and lower mold dies 60a and 60b shown in FIG. 26B. The dents 62 formed in the lower mold die 60b are at least coupled to the gaps between the die pad 1530 and the leads 1540. In other words, in the present embodiment, the gaps serve as a channel through which a molding material is coupled to the dents 62. Also, the dents 62 preferably overlap with substantially the entire lower surface of the die pad 1530, or at least a portion of the lower surface of the die pad 1530. Thereafter, a general sawing process is performed to complete the sawing type MLP 1500 as shown in FIGS. 22A through 22D.

FIGS. 27A and 27B are cross-sectional views illustrating another method of manufacturing the MLP 1500 of FIGS. 22A through 22D. Referring to FIG. 27A, an array of semiconductor packages which has undergone a block molding process is prepared. However, according to the present embodiment, the semiconductor packages formed of a molding material form a single body with the package body 1520 on the lower surface of the die pad 1530 and the bottoms of the leads 1540. In a case where a molding process is performed without attaching a cover tape, the semiconductor packages having such a structure may be manufactured when a mold flash 1525 is generated. In other words, the process of manufacturing the semiconductor packages according to the present embodiment is the same as the conventional process of manufacturing semiconductor packages except that the molding process is performed without attaching the cover tape. According to the present embodiment, the molding process results in generating mold flash 1525. As a result, a mold flash layer 1525 is formed of a molding material on the lower surface of the die pad 1530 and the bottoms of the leads 1540.

Referring to FIG. 27B, the mold flash layer 1525 is patterned to form short-circuit preventing members 1525a. The mold flash layer 1525 may be patterned using any one of several methods, such as, for example, using a laser system or a chemical or physical etching process using a mask. The mold flash layer 1525 is patterned so that substantially the entire portion or a lesser portion of each of the leads 1540 is exposed and such that at least a portion of the mold flash 1525 remains on the lower surface of the die pad 1530. A general sawing process is performed to complete the sawing type MLP 1500 as shown in FIGS. 22A through 22D.

According to the present invention, posts or short-circuit preventing members with convex shapes are formed on a lower surface of the die pad. Thus, although a sawing type MLP according to the present invention is mounted on a system board, a die pad of the sawing type MLP is prevented from contacting circuit lines on the system board and the likelihood of a short-circuit there between is substantially reduced.

Also, according to an aspect of the present invention, the short-circuit preventing members are of a sufficient or predetermined height to help ensure a desired or minimum height of the solder joints that electrically couple the leads of the sawing type MLP to the system board. Thus, the adhesiveness and mechanical strength of the solder joint is enhanced. As a result, the reliability of a system package on which the sawing type MLP according to the present invention is mounted is improved.

Moreover, the sawing type MLP having the above-described advantages is easily manufactured using ordinary skill in the art. Furthermore, when the sawing type MLP is mounted on the system board, the symmetrical short-circuit preventing members add mechanical support for the sawing type MLP. As a result, the sawing type MLP is prevented from collapsing or tilting when the system package is manufactured.

Figure 28:
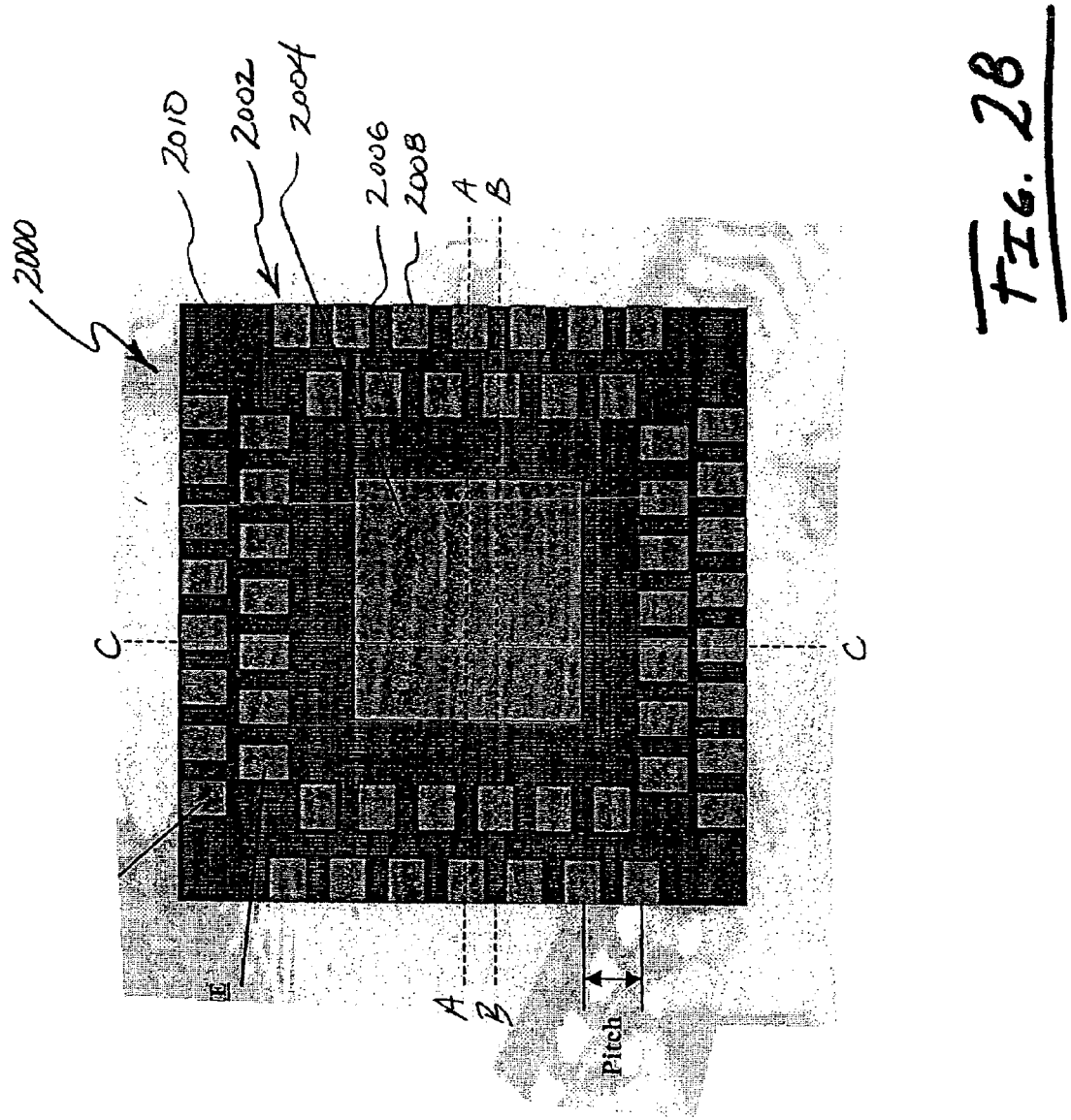
FIG. 28 is a planar, bottom view of yet one embodiment of a double convex MLP of the present invention.

Referring now to FIG. 28, one embodiment of a double convex MLP of the present invention is shown. MLP 2000 generally includes a lead frame 2002 having a die pad 2004, inner leads 2006 and outer leads 2008. MLP body 2010, formed of molding material, surrounds and encloses portions of lead frame 2002, die pad 2004 and the inner and outer leads 2006, 2008, respectively.

Figure 29:
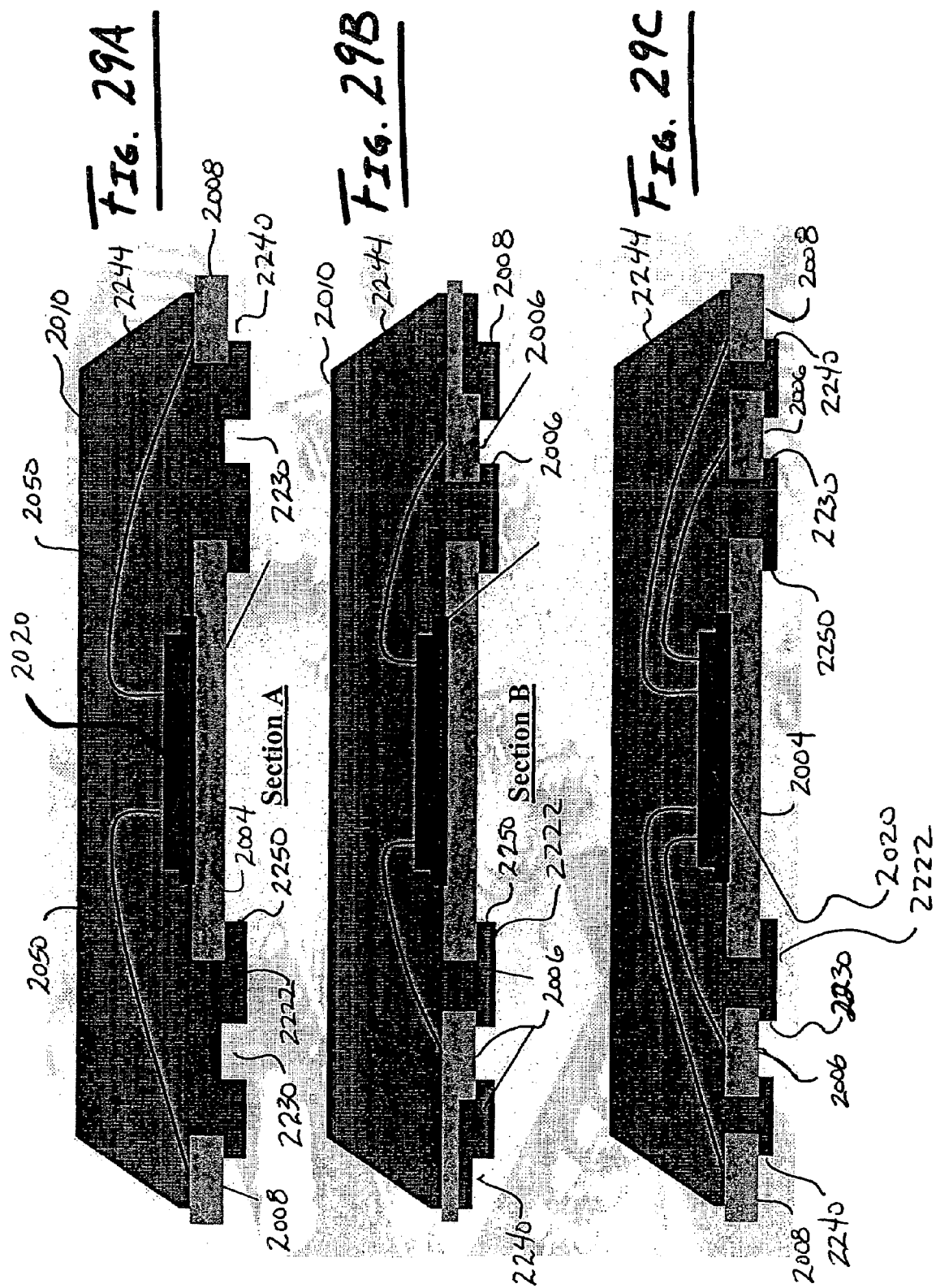
FIGS. 29A-C are sectional views of the MLP of FIG. 28.

More particularly, referring now to FIGS. 29A-C, sectional views of MLP 2000 are shown along lines A-A, B-B, and C—C respectively. An integrated circuit die or chip 2020 is affixed in a thermally and electrically-conductive manner, such as, for example, by solder, to a first or upper surface of die pad 2004. Die 2020 is surrounded and encompassed within body 2010, with the exception of the side thereof attached to die pad 2004. Bond wires 2050 electrically couple inner and outer leads 2006, 2008, respectively, to die 2020.

The bottom or lower surface 2222 of body 2010 has a double convex configuration. Specifically, lower surface 2222 includes two sets of dimples or recesses 2230 and 2240. One set of dimples/recesses 2230 corresponds to inner leads 2004 and the other set of dimples/recesses 2240 corresponds to outer leads 2008. Each of the sets of dimples/recesses 2230 and 2240 are recessed a predetermined distance or depth from the lower or bottom surface 2222 of package body 2010. A portion of the bottom surface of each of leads 2006 and 2008 is exposed to the outside environment within a corresponding one of dimples/recesses 2230 and 2240. In other words, within dimples/recesses 2230 and 2240 the bottom surfaces of leads 2006 and 2008 are not covered by the molding material from which body 2010 is formed and are thus exposed to the outside.

Dimples/recesses 2230 and 2240 ensure that the lower surfaces of leads 2006 and 2008 are spaced a predetermined distance from and/or above the circuit board (not shown) to which MLP 2000 is mounted. Thus, as best shown in FIG. 37, dimples/recesses 2230 and 2240 ensure that the solder joints that electrically couple the leads 2006 and 2008 of MLP 2000 to the circuit board have a desired or minimum height, and thereby enhance the adhesiveness and mechanical strength of those solder joints and the reliability of MLP 2000.

MLP 2000 of FIGS. 29A-C is configured as a punched-type package, with sloped or slanted sides/edges 2244. Outer leads 2208 extend a predetermined distance from sides 2244 of body 2010.

The bottom of MLP 2000 further includes a central recess 2250 that exposes a lower surface (not referenced) of die pad 2004, i.e., the surface thereof that is opposite the surface to which die 2020 is attached. Central recess 2250 ensures that the lower surface of die pad 2004 is spaced a predetermined distance from the lower or bottom surface 2222 of package body 2010 and, therefore, a predetermined distance from and/or above the circuit board (not shown) to which MLP 2000 is mounted. The likelihood of die pad 2004 contacting and/or electrically shorting with any circuit traces or conductors on the surface of the circuit board is thereby substantially reduced.

Figure 30:
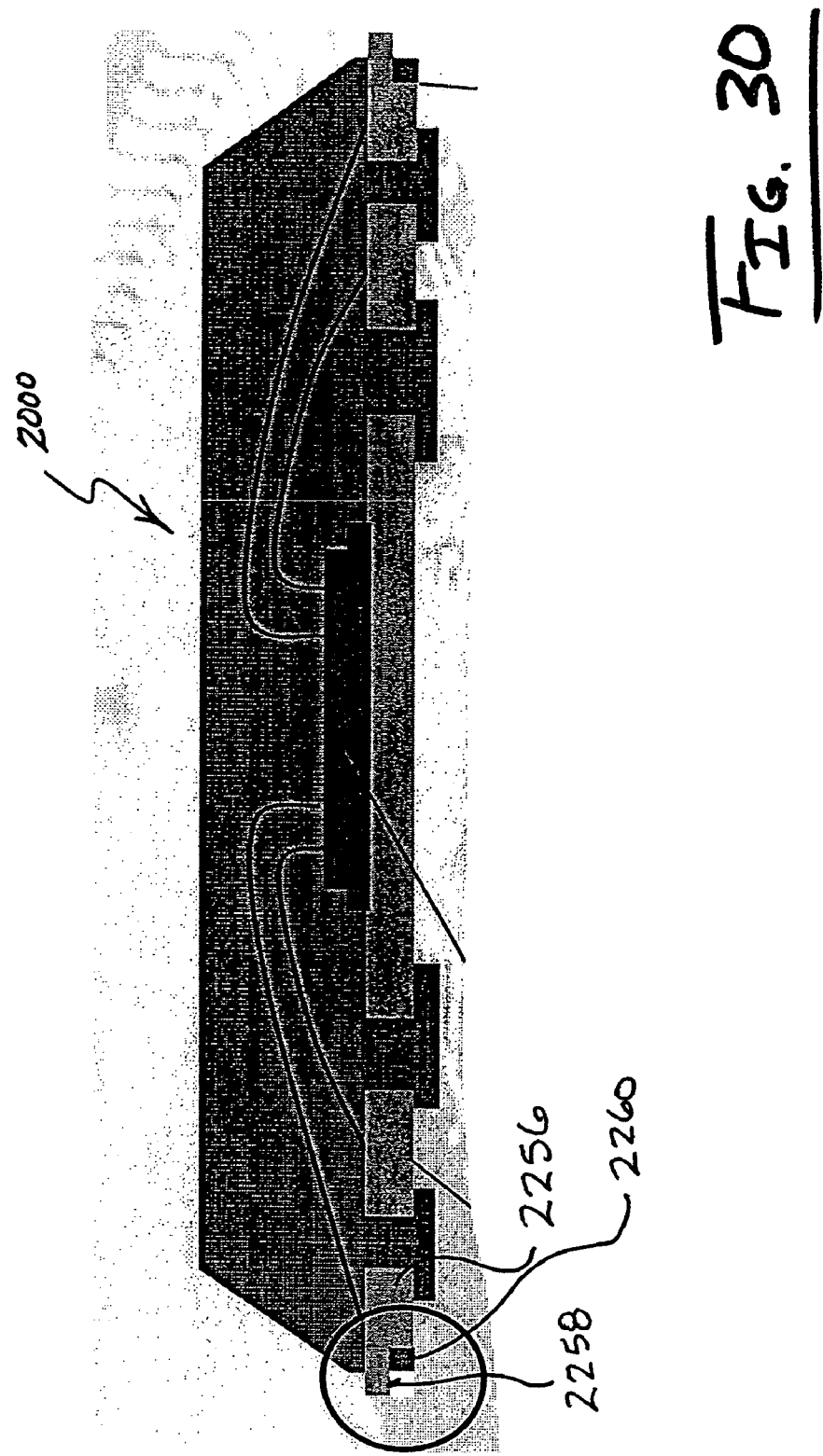
FIG. 30 is a sectional view of a second embodiment of the MLP of FIG. 29.

FIG. 30 shows a configuration of MLP 2000 having leads that are differently configured and/or shaped from the lead configuration shown in FIGS. 29A-C. More particularly, outer leads 2256 of MLP 2000 are configured with flats 2258 and, thus, package 2010 includes outer corners 2260.

Figure 31:
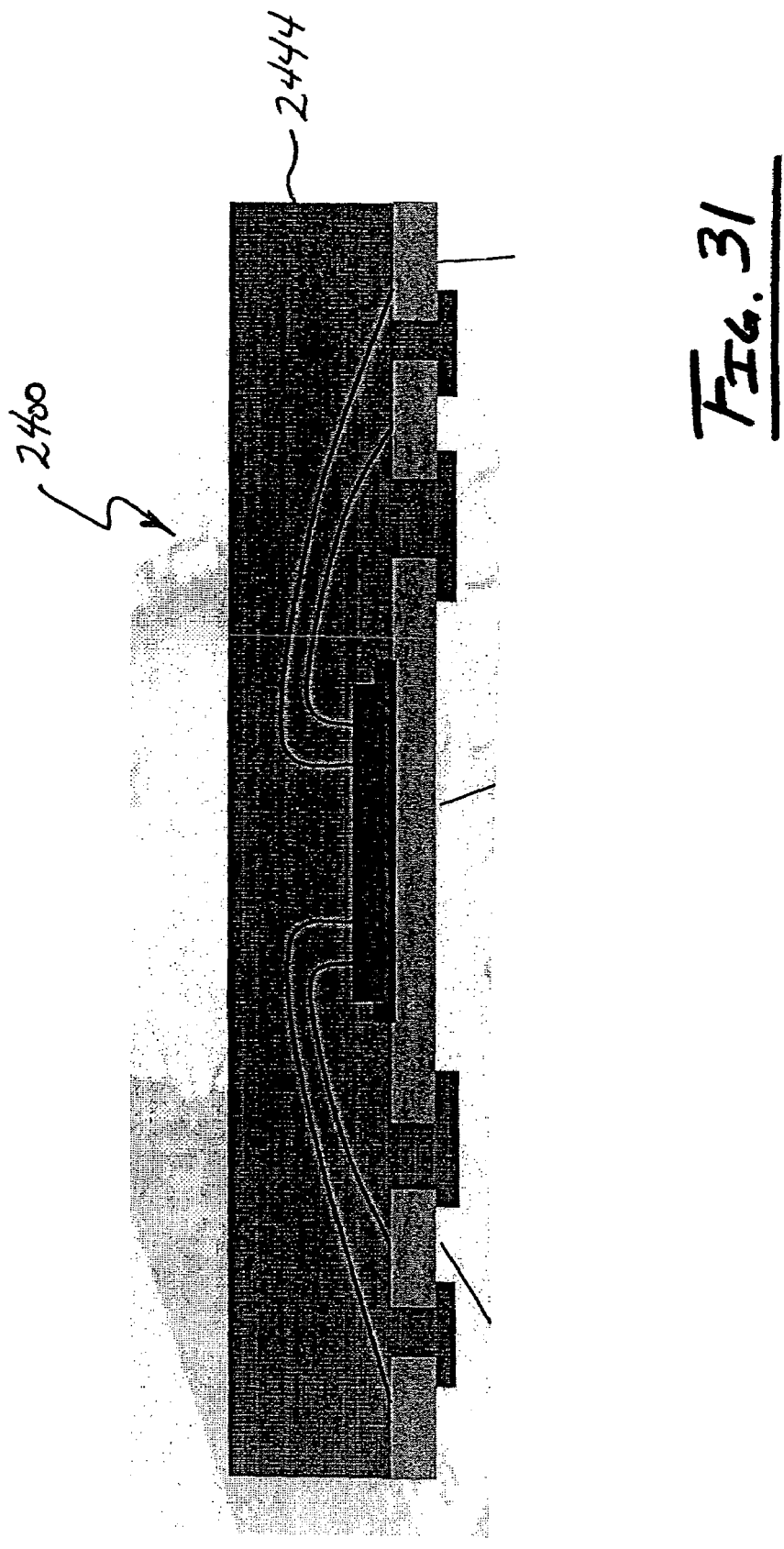
FIG. 31 is a sectional view of another embodiment of the MLP of FIG. 28.
Figure 32:
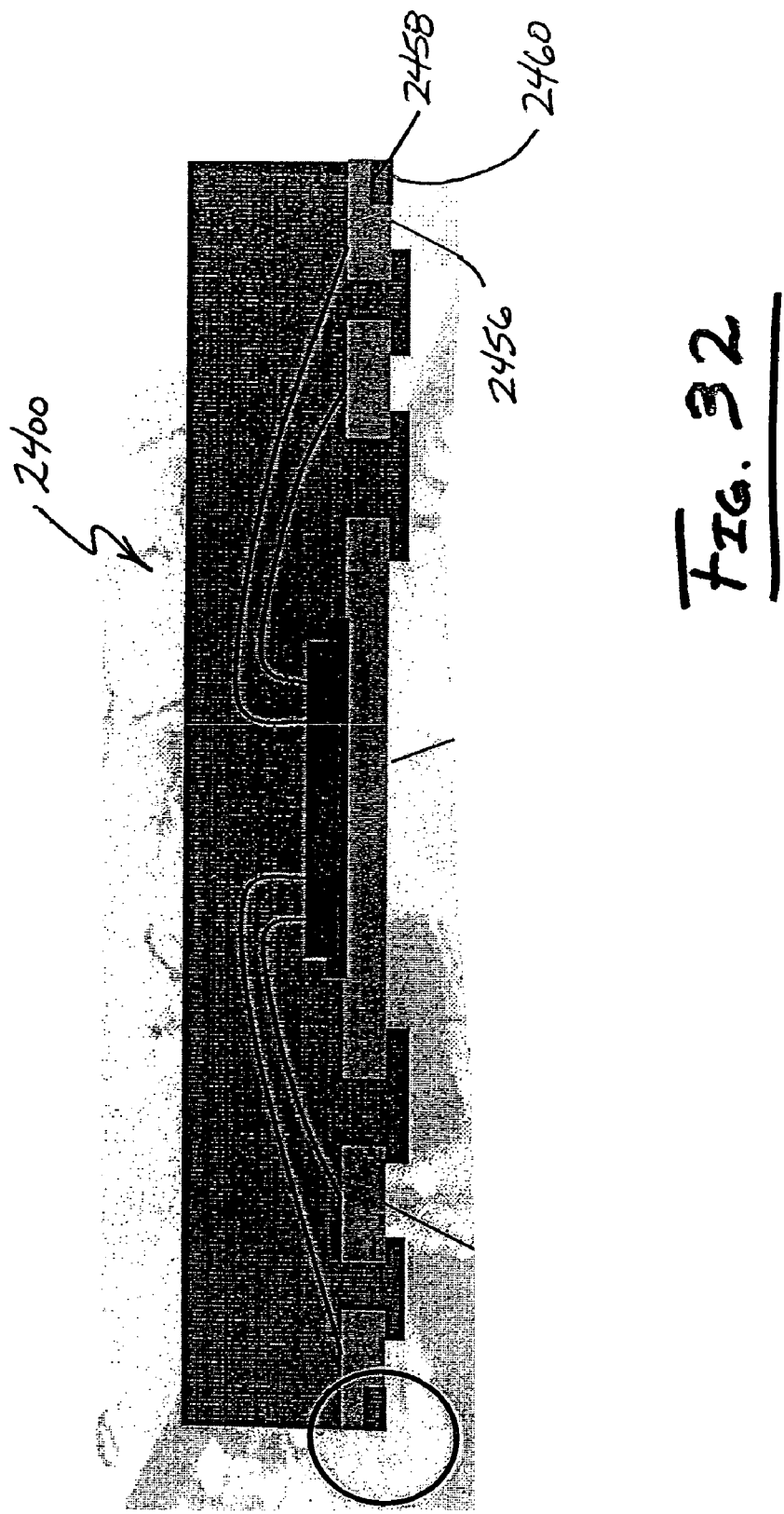
FIG. 32 is a sectional view of another embodiment of the MLP of FIG. 31.

Referring now to FIG. 31, a sectional view of another embodiment of a double convex MLP of the present invention is shown. MLP 2400 is substantially similar to MLP 2000, except that MLP 2400 is formed by sawing, rather than by a punching process, and therefore has sides 2444 that are generally if not substantially vertical. FIG. 32 shows MLP 2400 configured with leads that are differently configured and/or shaped from the lead configuration shown in FIG. 31. More particularly, outer leads 2456 of MLP 2400 are configured with flats 2458 and, thus, package 2410 includes outer corners 2460.

Figure 33A:
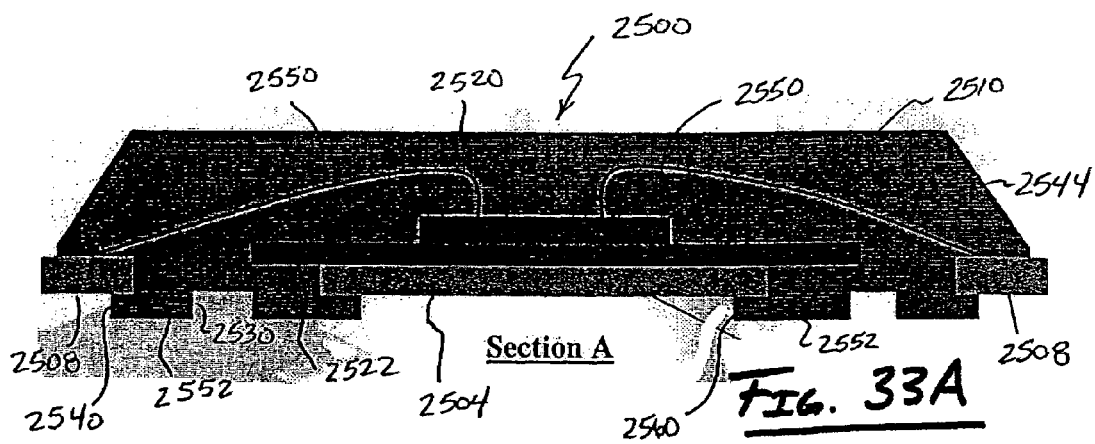
FIGS. 33A-C are sectional views of a further embodiment of a double convex MLP of the present invention.
Figure 33B:
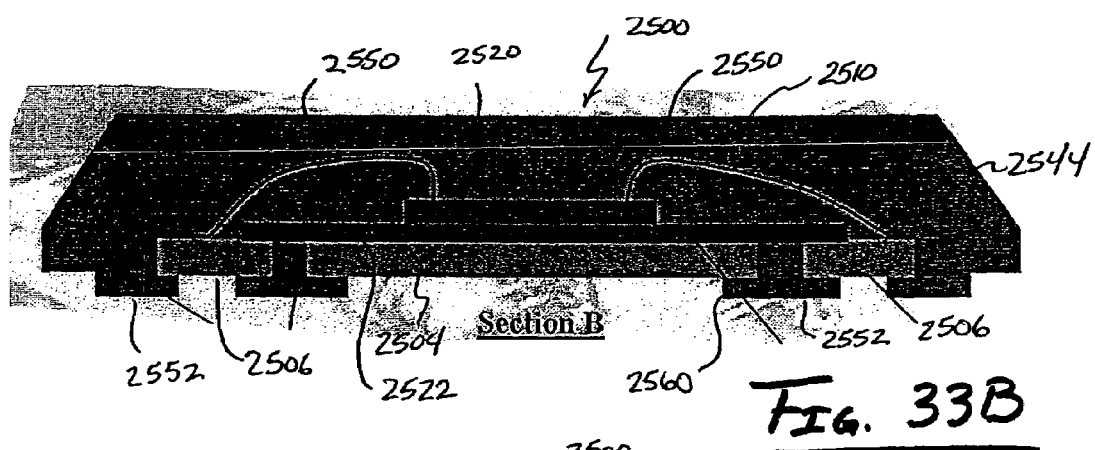
Figure 33C:
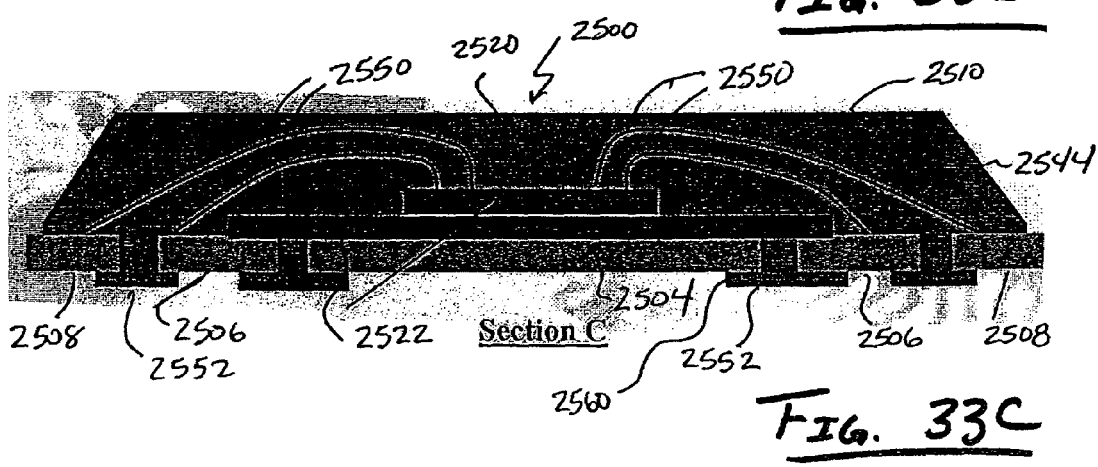

FIGS. 33A-C illustrate yet another embodiment of a double convex MLP of the present invention is shown. Double convex MLP 2500 generally includes a lead frame 2502 having a die pad 2504, inner leads 2506 and outer leads 2508. MLP body 2510, formed of molding material, surrounds and encloses portions of lead frame 2502, die pad 2504 and the inner and outer leads 2506, 2508, respectively. An integrated circuit die or chip 2520 that is affixed in a manner that is thermally-conductive, such as, for example, by adhesive tape, to a first or upper surface of die pad 2504. Adhesive tape 2522 may extend from die pad 2504 to an upper surface of inner leads 2506. Die 2520 is surrounded and encompassed within body 2510, with the exception of the side thereof that is attached to die pad 2504. Bond wires 2550 electrically couple inner and outer leads 2506, 2508, respectively, to die 2520.

MLP 2500 is similar to MLP 2000 in that the bottom or lower surface 2552 of body 2510 has a double convex configuration substantially as described above in regard to MLP 2000. Specifically, lower surface 2552 includes two sets of dimples or recesses 2530 and 2540. One set of dimples/recesses 2530 corresponds to inner leads 2504 and the other set of dimples/recesses 2540 corresponds to outer leads 2506. Each of the sets of dimples/recesses 2530 and 2540 are recessed a predetermined distance or depth from the lower or bottom surface 2522 of package body 2510. A portion of the bottom surface of each of leads 2506 and 2508 is exposed to the outside environment within a corresponding one of dimples/recesses 2530 and 2540. In other words, within dimples/recesses 2530 and 2540 the bottom surfaces of leads 2506 and 2508 are not covered by the molding material from which body 2510 is formed and are thus exposed to the outside.

Dimples/recesses 2530 and 2540 ensure that the lower surfaces of leads 2506 and 2508 are spaced a predetermined distance from and/or above the circuit board (not shown) to which MLP 2500 is mounted, and thereby ensure that the solder joints that electrically couple the leads 2506 and 2508 to the circuit board have a desired or minimum height. The adhesiveness and mechanical strength of those solder joints, and thus the reliability of MLP 2500, are thereby enhanced.

MLP 2500 of FIGS. 33A-C is configured as a punched-type package, with sloped or slanted sides/edges 2544. Outer leads 2508 extend a predetermined distance from sides 2544 of body 2510.

The bottom of MLP 2000 further includes a central recess 2560 that exposes a lower surface (not referenced) of die pad 2504, i.e., the surface thereof that is opposite the surface to which die 2520 is attached. Central recess 2560 ensures that the lower surface of die pad 2504 is spaced a predetermined distance from the lower or bottom surface 2552 of package body 2510 and, therefore, a predetermined distance from and/or above the circuit board (not shown) to which MLP 2500 is mounted. The likelihood of die pad 2504 contacting and/or electrically shorting with any circuit traces or conductors on the surface of the circuit board is thereby substantially reduced.

Figure 34:
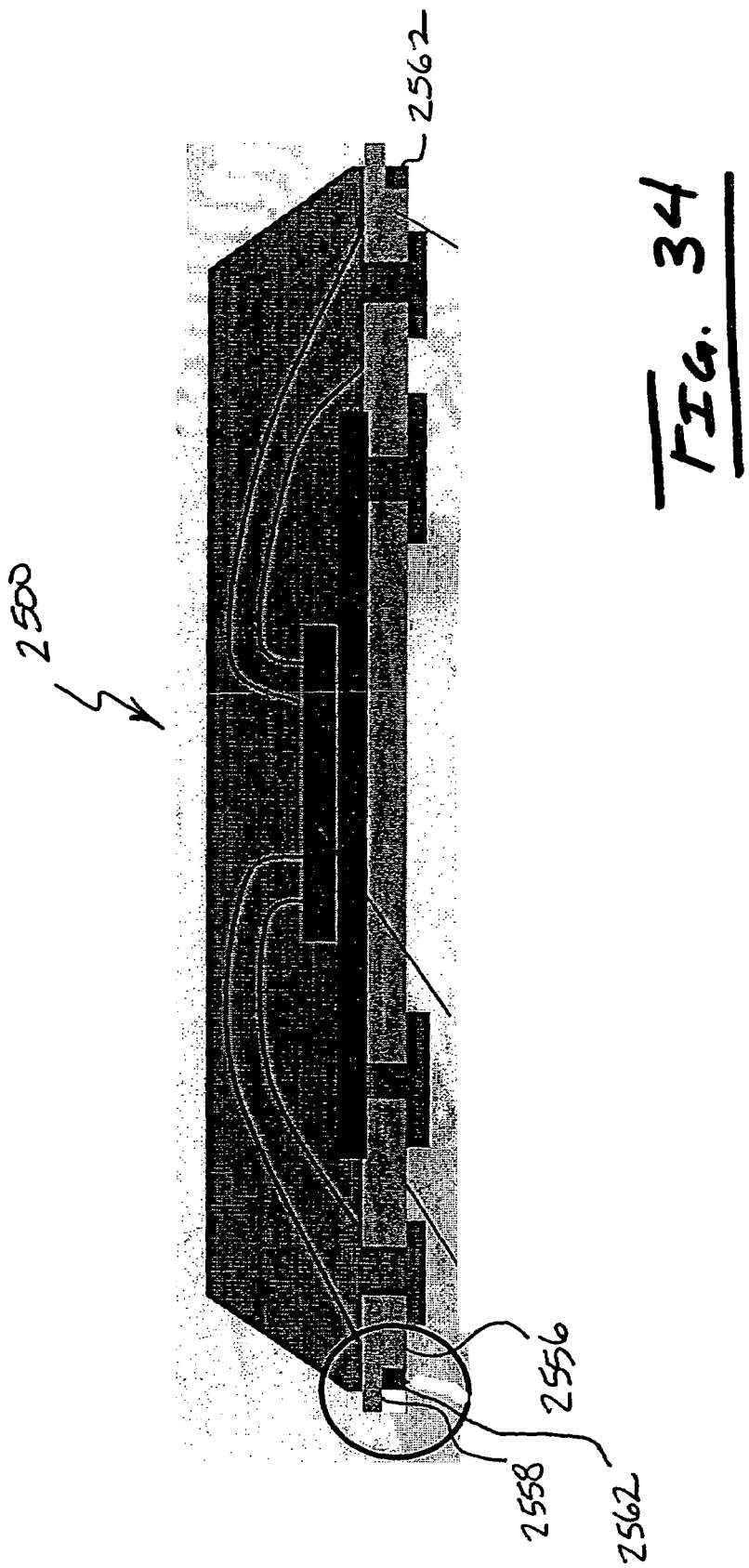
FIG. 34 is a sectional view of another embodiment of the MLP of FIG. 33.

FIG. 34 shows a configuration of MLP 2500 having leads that are differently configured and/or shaped from the lead configuration shown in FIGS. 29A-C. More particularly, outer leads 2556 of MLP 2500 are configured with flats 2558 and, thus, package 2510 includes outer corners 2562.

Figure 35:
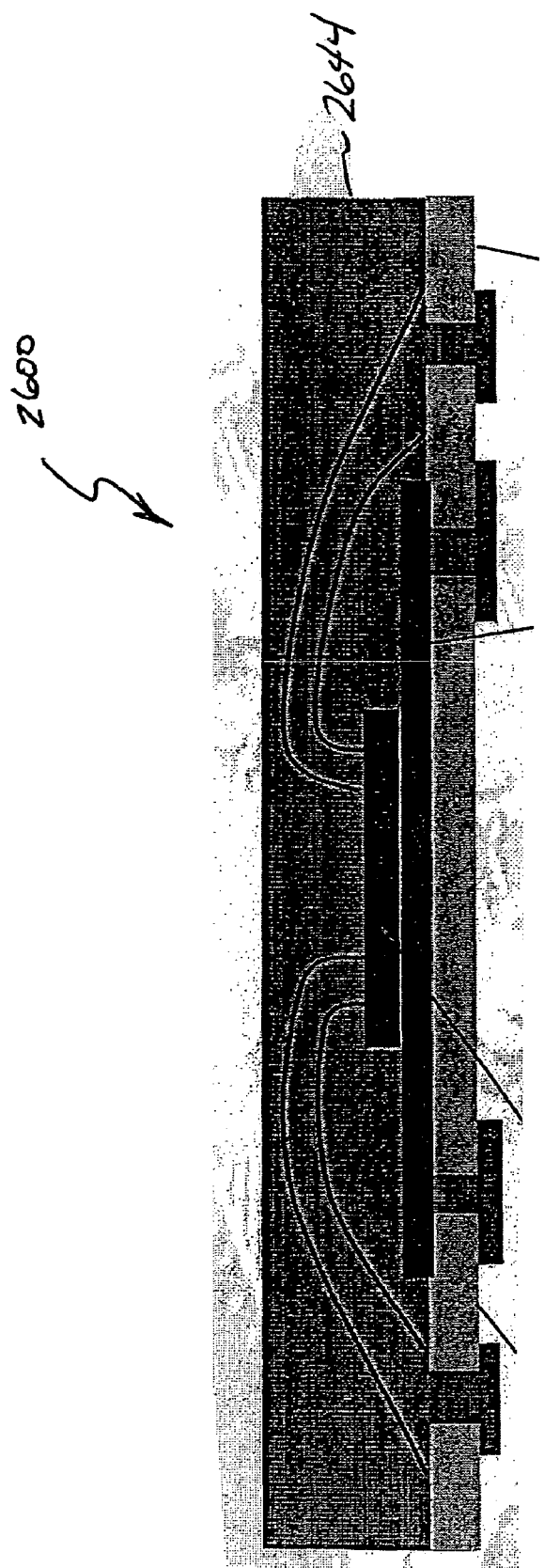
FIG. 35 is a sectional view of a still further embodiment of the MLP of FIG. 28.
Figure 36:
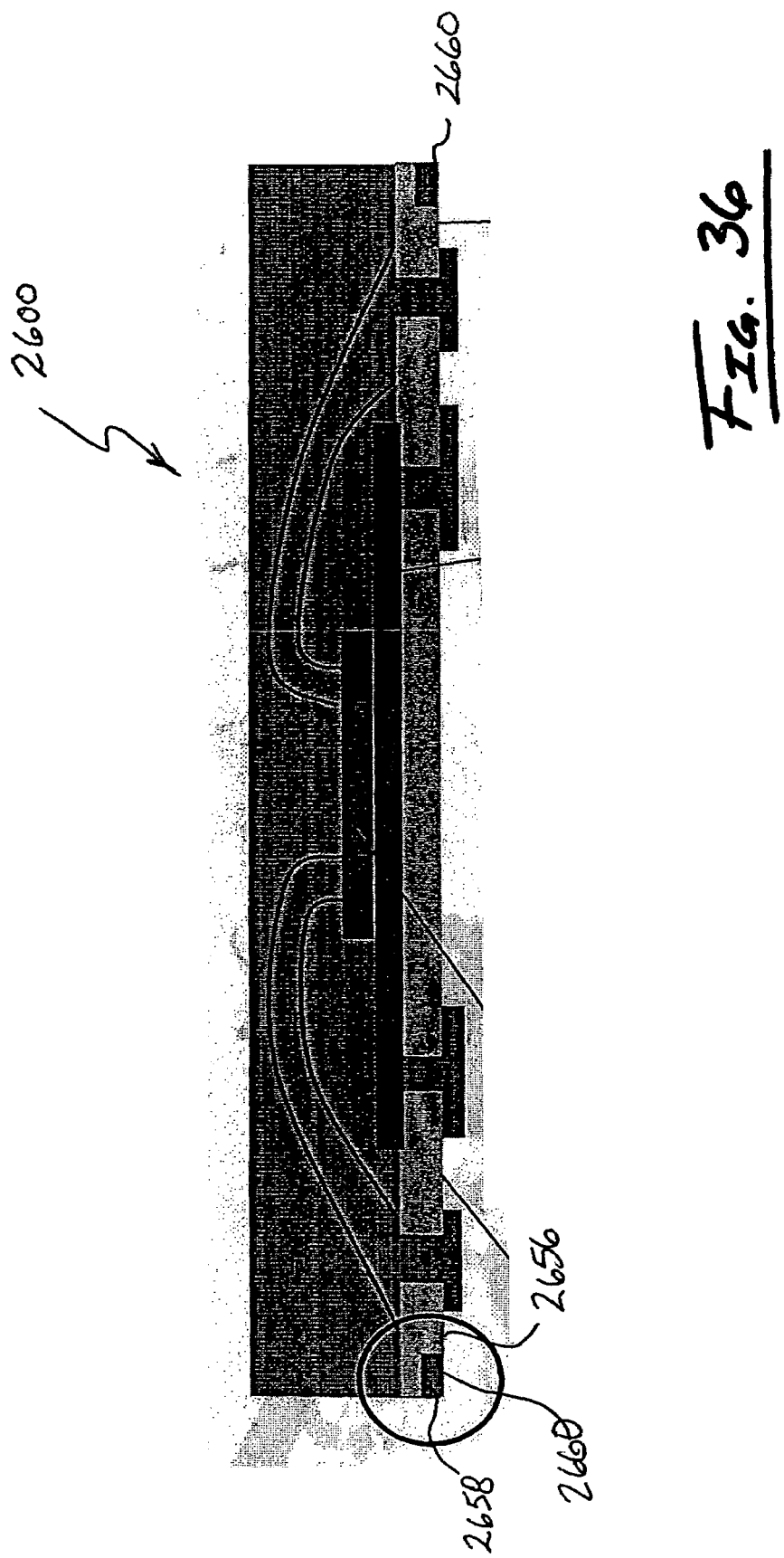
FIG. 36 is a sectional view of another embodiment of the MLP of FIG. 35.

Referring now to FIG. 35, a sectional view of another embodiment of a double convex MLP of the present invention is shown. MLP 2600 is substantially similar to MLP 2500, except that MLP 2600 is formed by sawing, rather than by a punching process, and therefore has sides 2644 that are generally if not substantially vertical. FIG. 36 shows MLP 2600 configured with leads that are differently configured and/or shaped from the lead configuration shown in FIG. 35. More particularly, outer leads 2656 of MLP 2600 are configured with flats 2658 and, thus, package 2610 includes outer corners 2660.

It should be particularly noted that each of the embodiments of the double convex MLP of the present invention enable the pin or lead count for a given package size to be increased relative to a conventional MLP package having a non-double convex configuration. For example, a conventional (non-double convex) MLP having a standard package size or dimension of 7 mm square has 48 pin/lead maximum at a 0.5 mm lead pitch, whereas a double convex MLP of the present invention has a maximum pin/lead count of 80 pins at a lead pitch of 0.5 mm and a 68 pin count at a lead pitch of 0.65 mm.

While the present invention has been particularly shown and described with reference to exemplary embodiments thereof, it will be understood by those of ordinary skill in the art that various changes in form and details may be made therein without departing from the spirit and scope of the present invention as defined by the following claims. Additionally, it will be appreciated that the elements of these embodiments can be practiced independently and/or interchangeably to form a wide variety of finished MLP packages depending on desired application.

What is claimed is:

1. A molded leadless package comprising:
   a lead frame pad having first and second surfaces that are opposite to each other;
   a semiconductor chip adhered to the first surface of the lead frame pad;
   a lead electrically coupled to the semiconductor chip;

a molding material covering the lead frame pad, the semiconductor chip, and the lead in such a way as to expose a portion of the lead and a portion of the second surface of the lead frame pad to the outside, a step difference being formed between a surface of the molding material covering the second surface of the lead frame pad and the second surface of the lead frame pad itself;

wherein the lead is exposed from the surface of the molding material covering the second surface of the lead frame pad;

wherein the molding material covering a portion of the second surface of the lead frame pad and a portion of an exposed surface of the lead comprises a protrusion protruding from the second surface of the lead frame pad and the exposed surface of the lead; and wherein the protrusion fully exposes the lower surface of the lead.

2. The molded leadless package of claim 1, wherein a side of the molding material is slanted.

3. The molded leadless package of claim 1, wherein a side of the molding material is vertical.

4. The molded leadless package of claim 1, wherein the lead is bent toward the lead frame pad.

5. The molded leadless package of claim 1, wherein the lead is flat.

6. The molded leadless package of claim 1, wherein the second surface of the lead frame pad exposed by the molding material is circular.

7. The molded leadless package of claim 1, wherein the second surface of the lead frame pad exposed by the molding material is square.

8. The molded leadless package of claim 1, wherein the lead frame pad comprises grooves formed on a portion of the second surface of the lead frame pad covered with the molding material.

9. The molded leadless package of claim 8, wherein the grooves are semicircular.

10. The molded leadless package of claim 8, wherein the grooves are V-shaped.

11. The molded leadless package of claim 1, wherein the step difference between the surface of the molding material covering the second surface of the lead frame pad and the second surface of the lead frame pad is between 0.12 mm and 0.15 mm.

12. The molded leadless package of claim 1, further comprising a heat sink lead coupled to the lead frame pad to transmit heat generated from the semiconductor chip to the outside.

13. The molded leadless package of claim 1, further comprising a wire coupling the lead to the semiconductor chip.

14. A molded leadless package comprising:
a lead frame pad having first and second surfaces that are opposite to each other;
a semiconductor chip adhered to the first surface of the lead frame pad;
a lead electrically coupled to the semiconductor chip;
a molding material covering the lead frame pad, the semiconductor chip, and the lead in such a way as to expose a portion of the lead and a portion of the second surface of the lead frame pad to the outside, a step difference being formed between a surface of the molding material covering the second surface of the lead frame pad and the second surface of the lead frame pad itself;

wherein the lead is exposed from the surface of the molding material covering the second surface of the lead frame pad;

wherein the molding material covering a portion of the second surface of the lead frame pad and a portion of an exposed surface of the lead comprises a protrusion protruding from the second surface of the lead frame pad and the exposed surface of the lead; and wherein the protrusion covers a portion of the lower surface of the lead to expose only a portion of the lower surface of the lead.

15. The molded leadless package of claim 14, wherein a side of the molding material is slanted.

16. The molded leadless package of claim 14, wherein a side of the molding material is vertical.

17. The molded leadless package of claim 14, wherein the lead is bent toward the lead frame pad.

18. The molded leadless package of claim 14, wherein the lead is flat.

19. The molded leadless package of claim 14, wherein the second surface of the lead frame pad exposed by the molding material is circular.

20. The molded leadless package of claim 14, wherein the second surface of the lead frame pad exposed by the molding material is square.

21. The molded leadless package of claim 14, wherein the lead frame pad comprises grooves formed on a portion of the second surface of the lead frame pad covered with the molding material.

22. The molded leadless package of claim 21, wherein the grooves are semicircular.

23. The molded leadless package of claim 21, wherein the grooves are V-shaped.

24. The molded leadless package of claim 14, wherein the step difference between the surface of the molding material covering the second surface of the lead frame pad and the second surface of the lead frame pad is between 0.12 mm and 0.15 mm.

25. The molded leadless package of claim 14, further comprising a heat sink lead coupled to the lead frame pad to transmit heat generated from the semiconductor chip to the outside.

26. The molded leadless package of claim 14, further comprising a wire coupling the lead to the semiconductor chip.

27. A molded leadless package, comprising:
a lead frame having a die pad, said die pad having opposite first and second surfaces, a first set of leads spaced a first predetermined distance from a periphery of said die pad, a second set of leads spaced a second predetermined distance from said die pad, said second distance being greater than said first distance;
a semiconductor chip affixed to said first surface of said die pad;
one or more lead wires connecting said semiconductor chip to one or more of said first and second leads
a package body defined by molding material covering the first surface of said die pad, said semiconductor chip, and said one or more lead wires, said molding material exposing a portion of said second surface of said die pad, said molding material defining recesses corresponding to said first and second sets of leads, said recesses exposing a lower surface thereof, said recesses being spaced a predetermined distance from a lower surface of said package body.

* * * * *